US009219077B2

(12) United States Patent
Yokoyama

(10) Patent No.: US 9,219,077 B2
(45) Date of Patent: Dec. 22, 2015

(54) SEMICONDUCTOR DEVICE AND FABRICATION METHOD THEREFOR

(75) Inventor: Takashi Yokoyama, Kumamoto (JP)

(73) Assignee: Sony Corporation, Tokyo (JP)

( * ) Notice: Subject to any disclaimer, the term of this patent is extended or adjusted under 35 U.S.C. 154(b) by 272 days.

(21) Appl. No.: 13/430,212

(22) Filed: Mar. 26, 2012

(65) Prior Publication Data

US 2012/0248544 A1    Oct. 4, 2012

(30) Foreign Application Priority Data

Mar. 31, 2011  (JP) .................................. 2011-079383
Feb. 8, 2012  (JP) .................................. 2012-025310

(51) Int. Cl.
| | | |
|---|---|---|
| H01L 29/78 | (2006.01) | |
| H01L 27/12 | (2006.01) | |
| H01L 21/84 | (2006.01) | |
| H01L 21/762 | (2006.01) | |
| H01L 21/8238 | (2006.01) | |

(52) U.S. Cl.
CPC ............ *H01L 27/1203* (2013.01); *H01L 21/84* (2013.01); *H01L 21/76251* (2013.01); *H01L 21/823807* (2013.01); *H01L 21/823878* (2013.01); *H01L 2924/0002* (2013.01)

(58) Field of Classification Search
CPC ............ H01L 21/823807; H01L 2224/48247; H01L 29/785; H01L 29/045; H01L 21/8221; H01L 2224/05599; H01L 2924/13091; H01L 29/1054; H01L 27/105; H01L 29/41791; H01L 29/4908
USPC .......... 257/262, 368–401, E21.409–E21.449, 257/E29.255–E29.313, E29.315–E29.316, 257/204, 274, E21.63–E21.644, 257/E27.062–E27.067, E27.108, 288, 901; 438/135, 151, 197, 199, 201, 207, 216
See application file for complete search history.

(56) References Cited

U.S. PATENT DOCUMENTS

| | | | | |
|---|---|---|---|---|
| 5,714,394 | A * | 2/1998 | Kadosh et al. ................ | 438/199 |
| 5,834,354 | A * | 11/1998 | Kadosh et al. ................ | 438/305 |
| 6,365,932 | B1 * | 4/2002 | Kouno et al. ................. | 257/341 |
| 7,250,680 | B2 * | 7/2007 | Gonzalez ...................... | 257/755 |
| 2004/0038464 | A1 * | 2/2004 | Fried et al. .................... | 438/151 |
| 2007/0001173 | A1 * | 1/2007 | Brask et al. .................... | 257/67 |
| 2007/0040193 | A1 * | 2/2007 | Ajiki ............................. | 257/288 |
| 2007/0045736 | A1 * | 3/2007 | Yagishita ...................... | 257/347 |
| 2009/0072276 | A1 * | 3/2009 | Inaba ............................ | 257/255 |
| 2009/0181511 | A1 * | 7/2009 | Jeong et al. ................... | 438/303 |
| 2009/0224321 | A1 * | 9/2009 | Tsuchiya ...................... | 257/351 |

(Continued)

FOREIGN PATENT DOCUMENTS

| | | |
|---|---|---|
| JP | 2005-285809 | 10/2005 |
| JP | 2006-203091 | 8/2006 |

(Continued)

*Primary Examiner* — Colleen A Matthews
*Assistant Examiner* — Junaiden Mirsalahuddin
(74) *Attorney, Agent, or Firm* — Michael Best & Friedrich LLP

(57) ABSTRACT

A semiconductor device includes: a first substrate on which a first field effect transistor is provided; and a second substrate on which a second field effect transistor of a second conductive type is provided; the first and second substrates being bonded to each other at the substrate faces thereof on which the first and second field transistors are provided, respectively; the first field effect transistor and the second field effect transistor being electrically connected to each other.

26 Claims, 72 Drawing Sheets

(56) References Cited

U.S. PATENT DOCUMENTS

| | | | |
|---|---|---|---|
| 2009/0280605 A1* | 11/2009 | Kim et al. | 438/151 |
| 2010/0055881 A1* | 3/2010 | Shimizu | 438/478 |
| 2010/0112800 A1* | 5/2010 | Chen et al. | 438/592 |
| 2010/0207215 A1* | 8/2010 | Narita | 438/199 |
| 2010/0311231 A1* | 12/2010 | Thei et al. | 438/587 |
| 2011/0089473 A1* | 4/2011 | Owens | 257/255 |
| 2011/0233702 A1* | 9/2011 | Takahashi et al. | 257/432 |
| 2011/0241145 A1* | 10/2011 | Lenchenkov | 257/432 |

FOREIGN PATENT DOCUMENTS

| | | |
|---|---|---|
| JP | 2007-194337 | 8/2007 |
| JP | 2010-205951 | 9/2010 |

* cited by examiner

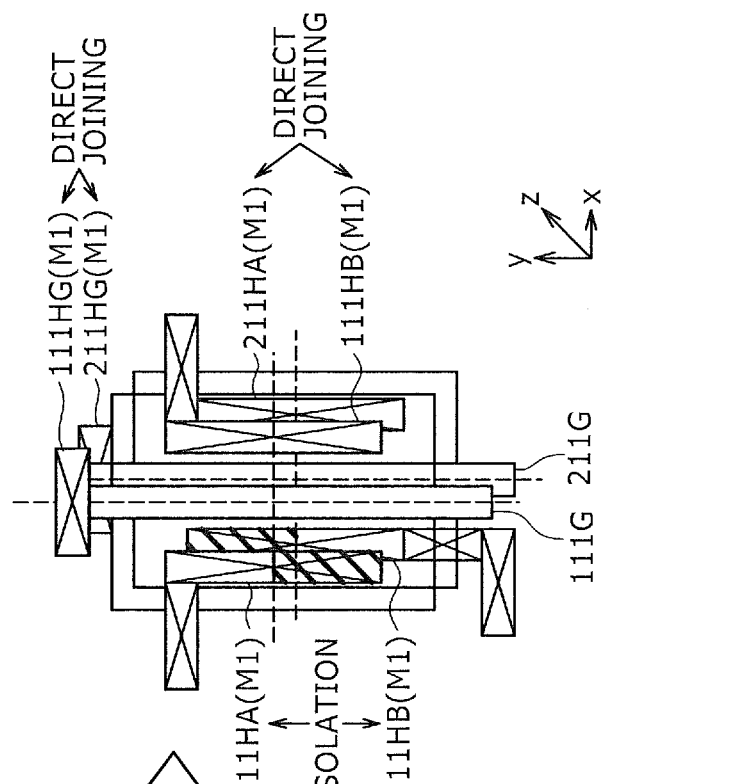
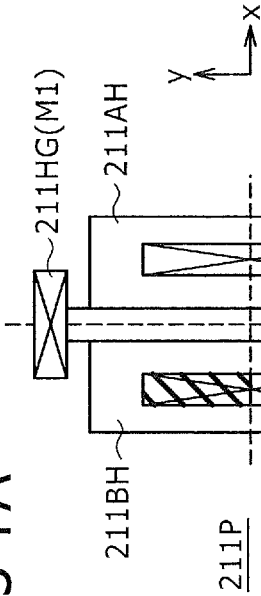
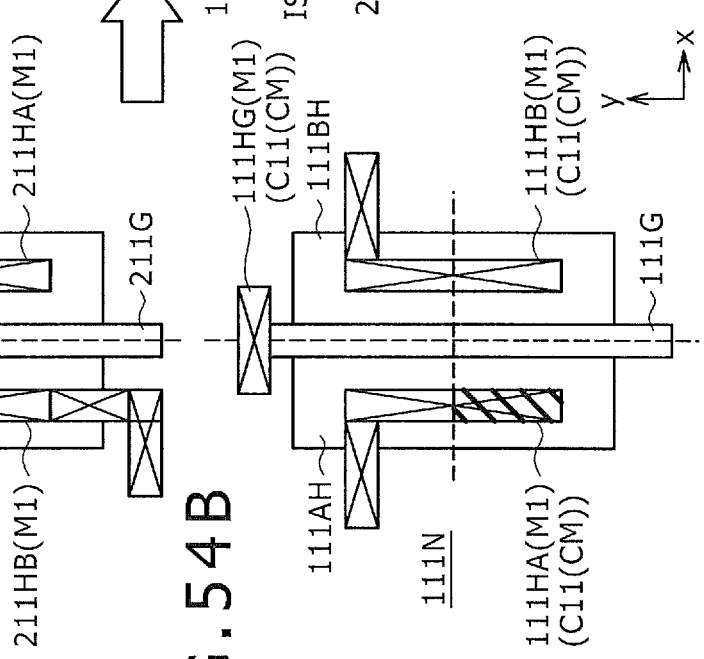

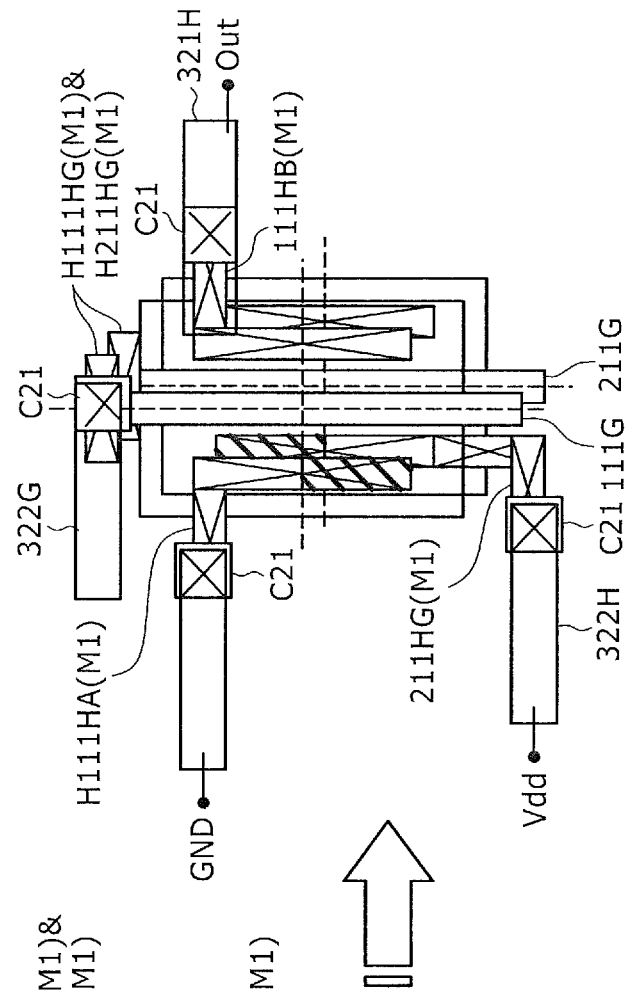
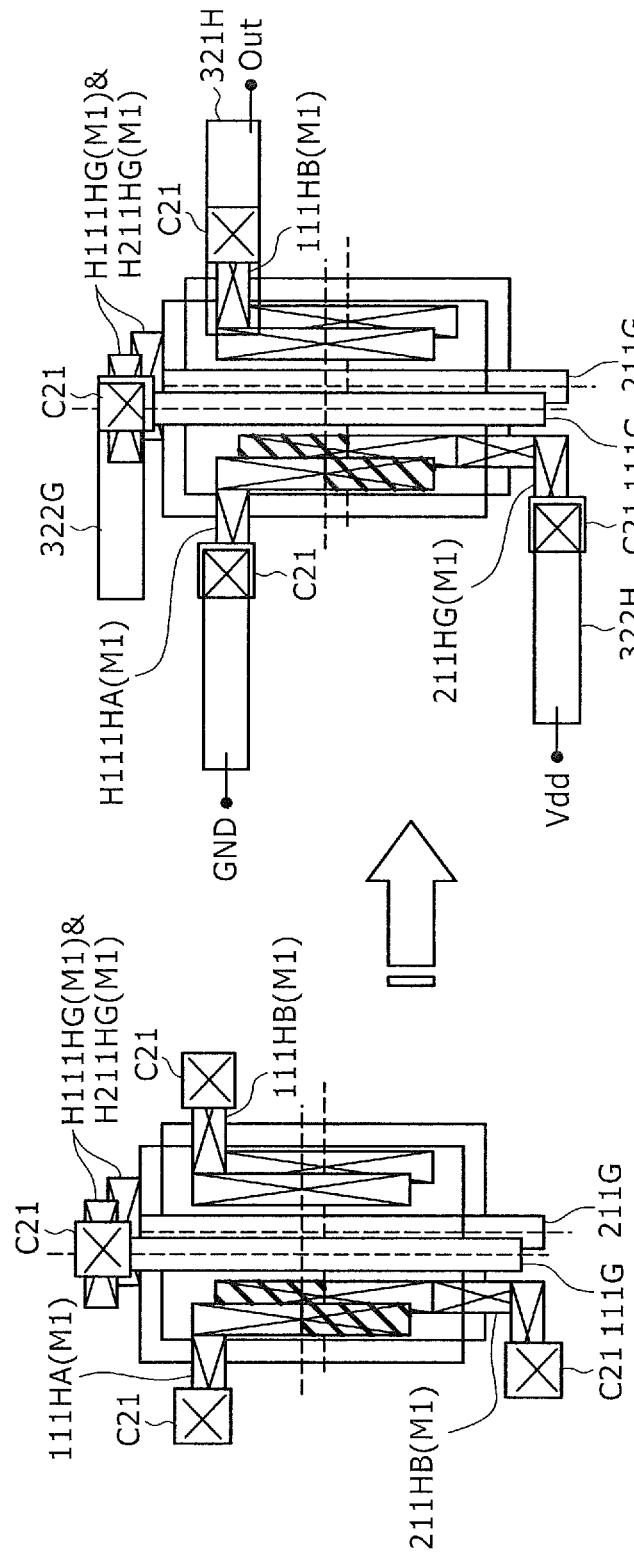
FIG. 55A
FIG. 55B

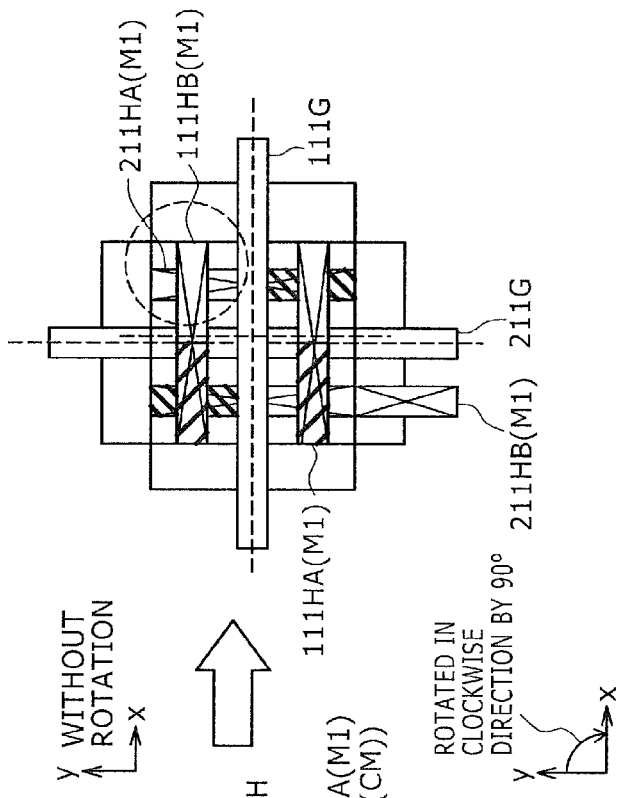
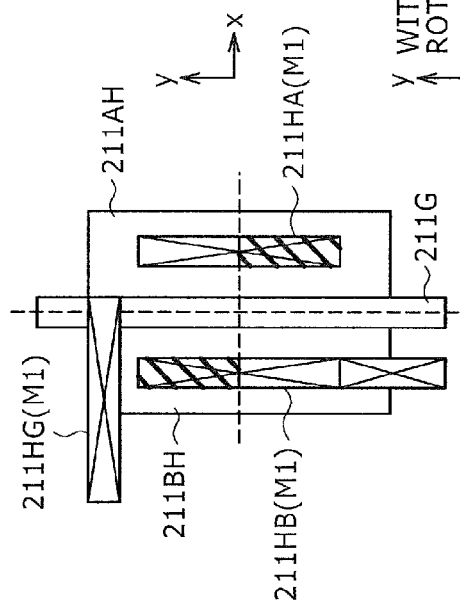
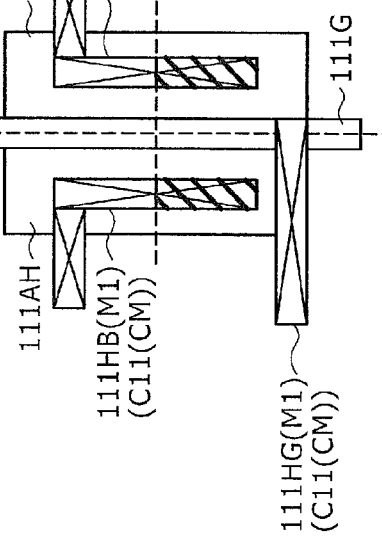

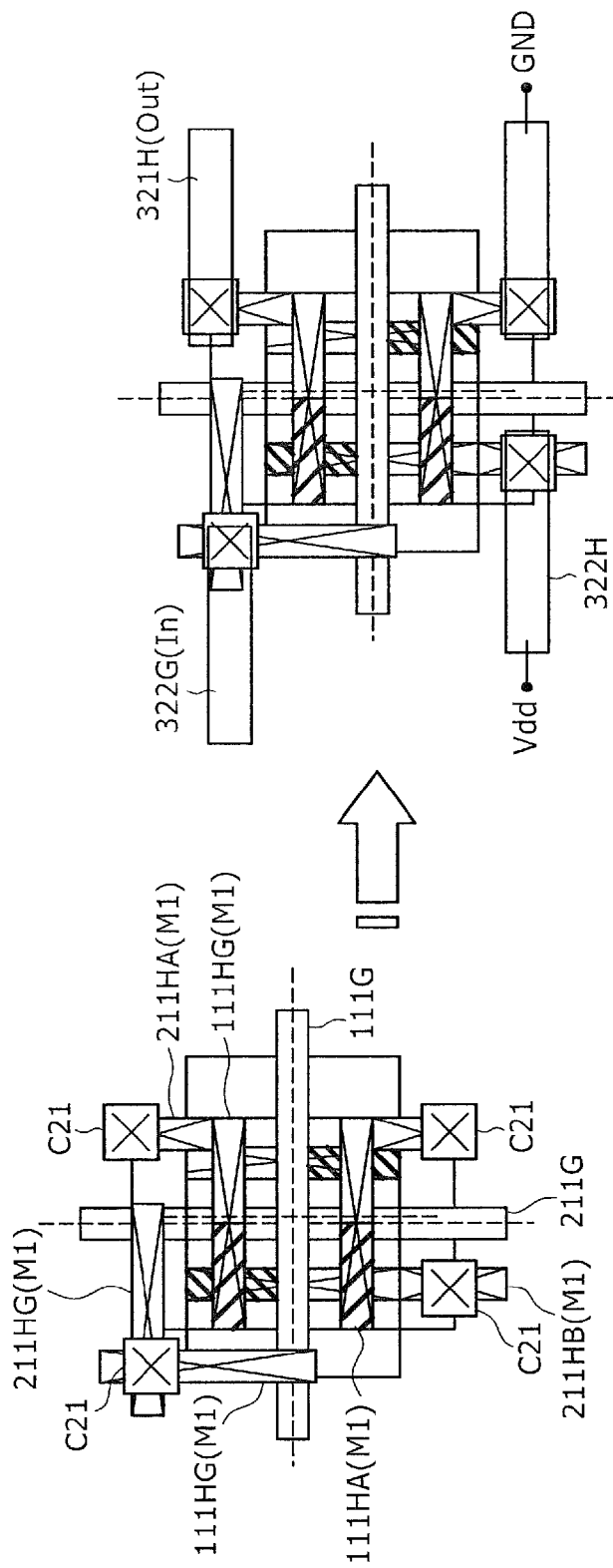

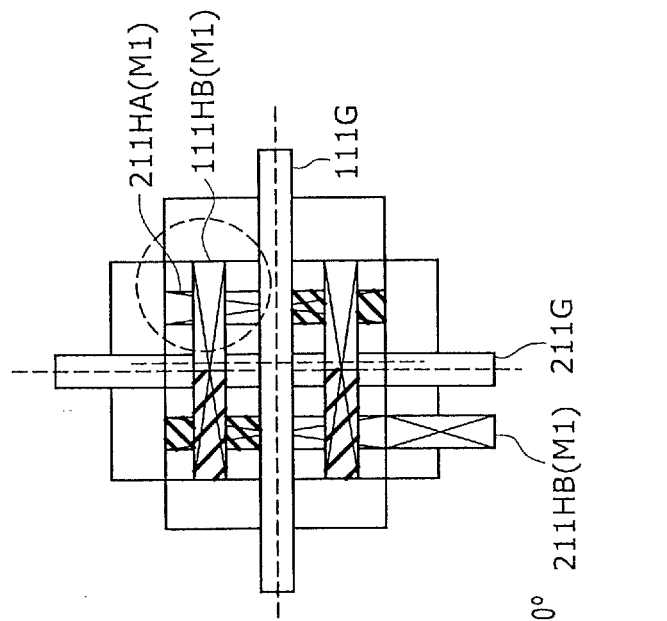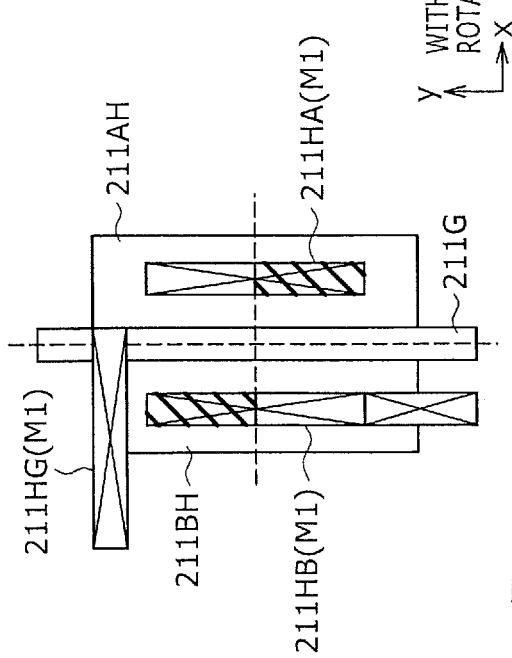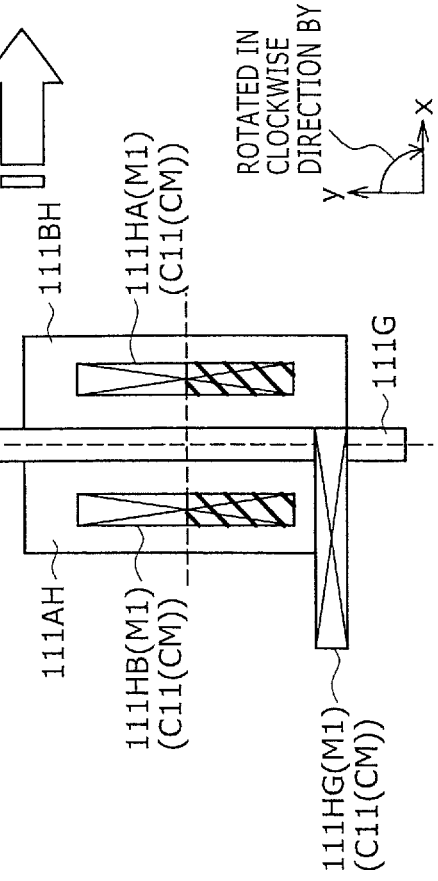

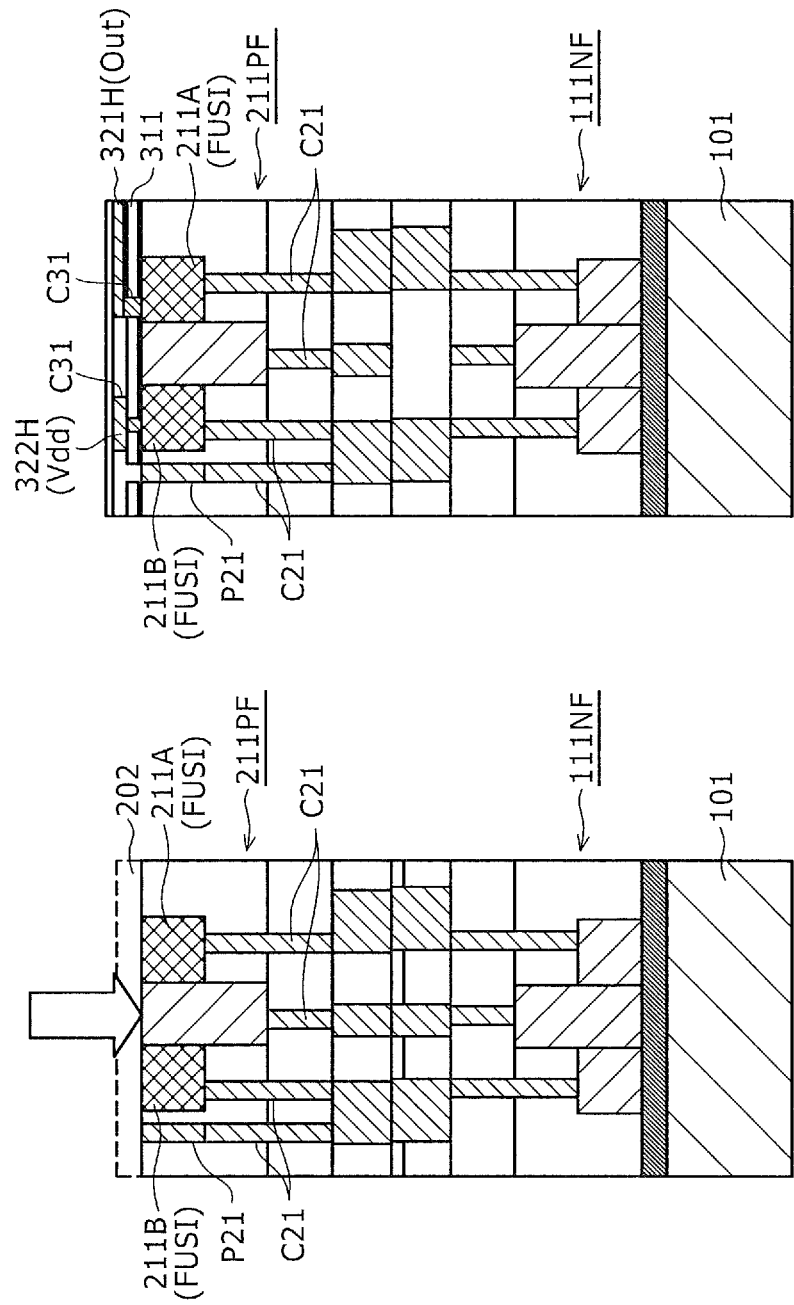

REPEAT LAMINATION PROCESS

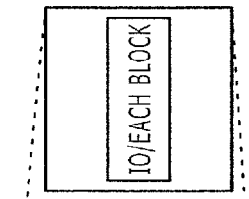
FIG. 66A
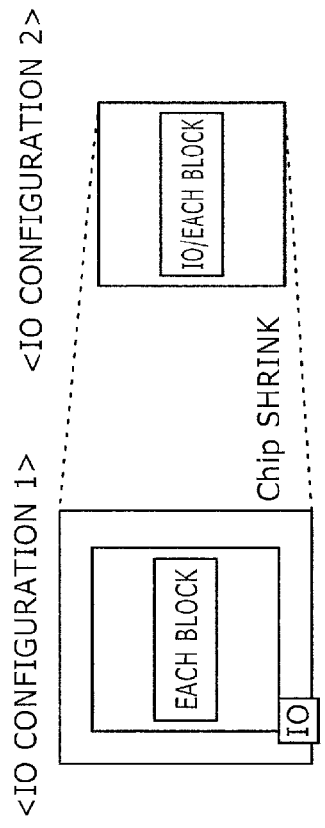
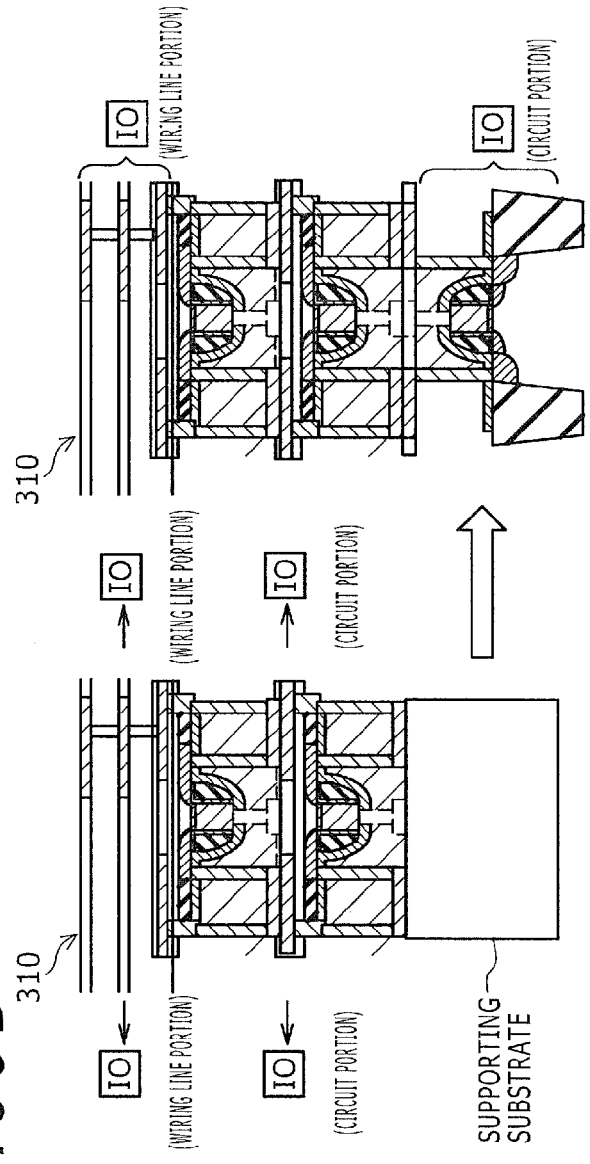
FIG. 66B

<IO CONFIGURATION 1>   <IO CONFIGURATION 3>

EACH BLOCK      IO/EACH BLOCK

Chip SHRINK

IO

LAYERING OF IO SECTION

PULLING UP FOR EXTRACTION IS REQUIRED

IO SECTION

SEMICONDUCTOR DEVICE AND FABRICATION METHOD THEREFOR

BACKGROUND

This technology relates a semiconductor device and a fabrication method therefor, and more particularly to a semiconductor device which includes a plurality of field effect transistors (FETs) formed on different substrates and are electrically connected to each other and a fabrication method for the semiconductor device.

In a semiconductor device, the size of a semiconductor element such as a FET is reduced in accordance with the scaling law of Moore to improve characteristics such as a processing speed and power consumption. However, in a semiconductor device, as further reduction in size and further improvement in performance proceed, how to connect semiconductor elements to each other efficiently has become important.

Particularly with regard to a semiconductor device of a three-dimensional structure wherein a plurality of substrates are layered in order to stack a plurality of substrates to improve the degree of integration, various element connection methods have been investigated. Further, the demand for layering substrates is increasing for a case in which transistors which cannot be formed on the same substrate by the same process are integrated in order to improve the performance or for a like case.

One of backgrounds of increase of such cases as described above may be that the difficulty in improvement in performance is increasing, for example, from such a factor as a short channel effect.

In order to overcome the difficulty described, for example, it has been proposed to apply stress to the channel region to produce a strain thereby to improve the carrier mobility to increase the on-state current.

In particular, it is known to cover a FET with a stress liner layer to produce a strain in the channel region. Here, a stress liner layer which applies tensile stress to the channel region of an n-type MOS (Metal Oxide Semiconductor) FET is used to improve the electron mobility. Meanwhile, for a p-type MOSFET, a stress liner layer which applies a compressive stress to improve the hole mobility (refer to H. S. Yang et al., "Dual Stress Liner for High Performance Sub-45 nm Gate Length SOI CMOS Manufacturing," IEDM Tech. Dig., p. 1075, 2004 (hereinafter referred to as Non-Patent Document 1) or Japanese Patent Laid-Open No. 2010-205951, paragraphs [0030], [0031] and so forth (hereinafter referred to as Patent Document 1)).

Further, it has been proposed to use an epitaxial layer of a grating constant different from that of a semiconductor substrate to form a pair of source-drain regions to apply a strain to the channel region. For example, in an n-type MOSFET, a material which applies a tensile stress such as SIC is used to form a pair of source-drain regions. On the other hand, in a p-type MOSFET, a material which applies a compressive stress such as SiGe is used to form a pair of source-drain regions (refer to, for example, Japanese Patent Laid-Open No. 2006-203091, paragraph [0076], FIG. 7 and so forth (hereinafter referred to as Patent Document 2)).

Further, it is known to form a FET such that a channel region is provided on a crystal orientation plane of a semiconductor having high carrier mobility. For example, an n-type MOSFET is formed such that the "(100)" plane is used as the channel region to improve the electron mobility. On the other hand, a p-type MOSFET is formed such that, for example, the (110) plane is used as the channel region to improve the hole mobility (refer to, for example, M. Yang et al., "High Performance CMOS Fabricated on Hybrid Substrate with Different Crystal Orientation," IEDM, pp. 453-456, 2003 (hereinafter referred to as Non-Patent Document 2) and Japanese Patent Laid-Open No. 2007-194337, paragraph [0003] and so forth (hereinafter referred to as Patent Document 3)).

Further, as reduction of the thickness of the gate insulating film proceeds, gate leak current is sometimes created to cause such a failure that the power consumption increases or the like.

It has been proposed to a high dielectric constant material, that is, a high-k material, having a dielectric constant higher than that of silicon oxide to form a gate insulating film in order to prevent such a failure as described above. For example, the gate insulation film is formed using HfSiON and so on as a high-k material. In the case where a high-k material is used to form a gate insulating film, in order to cause the feature to be exhibited, the gate electrode is formed not from polycrystalline silicon but from a metal material. Here, for the control of a threshold voltage Vth of a FET, an n-type MOSFET and a p-type MOSFET are formed from metal materials different from each other such that appropriate work functions are obtained for gate voltages of the n-type MOSFET and the p-type MOSFET. More particularly, in the n-type MOSFET, the gate electrode is formed using a metal with which the work function of the gate electrode is positioned at an end of the conduction band. Meanwhile, in the p-type MOSFET, the gate electrode is formed using a metal with which the work function of the gate electrode is positioned at an end of the valence band (refer to, for example, L. Witters et al., "8 Å Tinv Gate-First Dual Channel Technology Achieving Low-Vt High Performance," IEEE, 2010 (hereinafter referred to as Non-Patent Document 3) and Japanese Patent Laid-Open No. 2005-285809, paragraphs [0002], [0134], [0139] and so forth (hereinafter referred to as Patent Document 4)).

SUMMARY

As described above, the n-type MOSFET and the p-type MOSFET are formed using materials different from each other in order to assure a high characteristic.

Therefore, when the n-type MOSFET and the p-type MOSFET are formed on the same substrate in fabrication of CMOS (Complementary Metal Oxide Semiconductor) devices, they need to be formed separately from each other in order to assure a characteristic of the MOSFETs. For example, after formation of a MOSFET of one of conductivity types on a semiconductor substrate, another MOSFET of the other conductivity type is formed on the same semiconductor substrate. Consequently, the number of steps is great and the fabrication efficiency is low, and the fabrication cost sometimes increases.

For example, in the case where different crystal orientation planes are provided on the same substrate in order to enhance the carrier mobility in the n-type MOSFET and the p-type MOSFET, a process of bonding layers of the different crystal orientation planes to the substrate needs to be used. Further, when the n-type MOSFET and the p-type MOSFET are produced individually on the same substrate, a high crystal growth technique needs to be used in some cases (refer to Non-Patent Document 2).

Further, if one FET provided preceding in time is subjected to a high temperature condition as in the case where a gate insulating film is formed on the other FET or an annealing process is carried out after ion implantation, then degradation of a characteristic of the one FET sometimes occurs, resulting in degradation of the reliability of the device in which the FETs are incorporated. Particularly with FETs in the generations after the 45 nm node generation, appearance of such a failure comes to the surface (refer to Non-Patent Document 3).

Accordingly, it is desirable to provide a semiconductor device and a fabrication method therefor which can achieve enhancement of the fabrication efficiency, reduction in cost and enhancement of the reliability.

According to an embodiment of the disclosed technology, there is provided a semiconductor device including a first substrate on which a first field effect transistor is provided, and a second substrate on which a second field effect transistor of a second conductive type is provided, the first and second substrates being bonded to each other at the substrate faces thereof on which the first and second field transistors are provided, respectively, the first field effect transistor and the second field effect transistor being electrically connected to each other.

According to another embodiment of the disclosed technology, there is provided a fabrication method for a semiconductor device, including providing a first field effect transistor on a first substrate, providing a second field effect transistor on a second substrate, forming a connection structure for the first field effect transistor and the second field effect transistor on each of the first substrate and the second substrate, and bonding the first substrate and the second substrate to each other at the substrate faces on which the first and second field effect transistors are provided, respectively, to electrically connect the first and second field effect transistors to each other through the connection structures by the bonding of the substrates.

In the semiconductor device and the fabrication method, for example, a first field effect transistor of a first conductive type is provided on a first substrate. Then, a second field effect transistor of a second conductive type different from the first conductive type is provided on a second substrate. Then, the first substrate and the second substrate are opposed to each other and bonded to each other. At this time, the substrates are bonded at the substrate faces thereof on which the first and second field effect transistors are formed, respectively.

Particularly with the fabrication method according to the embodiment of the present technology, upon bonding of the substrates, the first field effect transistor and the second field effect transistor are electrically connected to each other through connection structures formed on the substrates in advance.

According to the present technology, a semiconductor device which can achieve enhancement of the fabrication efficiency, reduction of the cost and enhancement of the reliability and a fabrication method for the semiconductor device can be provided.

The above and other features and advantages of the present technology will become apparent from the following description and the appended claims, taken in conjunction with the accompanying drawings in which like parts or elements denoted by like reference symbols.

BRIEF DESCRIPTION OF THE DRAWINGS

FIGS. 43A and 43B to 47 are schematic cross sectional views taken along plane X41-X42 of FIG. 39 illustrating different steps of the fabrication method of the semiconductor device of FIG. 39;

FIGS. 49A and 49B to 52 are schematic cross sectional views taken along plane X41-X42 of FIG. 39 but illustrating different steps of the fabrication method of the semiconductor device of FIG. 39;

FIGS. 54A to 54C, 55A and 55B are schematic views showing essential part of a semiconductor device according to a device configuration 1 of the embodiment 12 and illustrating a fabrication method of the semiconductor device;

FIGS. 56A to 56C, 57A and 57B are schematic views showing essential part of a semiconductor device according to a device configuration 2 of the embodiment 12 and illustrating a fabrication method of the semiconductor device;

FIGS. 58A to 58C, 59A and 59B are schematic views showing essential part of the semiconductor device according to a device configuration 3 of the embodiment 12 and illustrating a fabrication method of the semiconductor device;

FIGS. 62A to 62B, 63A and 63B are schematic views showing essential part of the semiconductor device according to the embodiment 13 and illustrating a fabrication method of the semiconductor device;

FIGS. 66A and 66B, 67A and 67B, and 68A and 68B are schematic views and schematic sectional views, respectively, showing different variations of the embodiment 14;

DETAILED DESCRIPTION OF THE PREFERRED EMBODIMENTS

In the following, preferred embodiments of the technology disclosed herein are described with reference to the accompanying drawings.

The description is given in the following order.

1. Embodiment 1 (an n-type FET and a p-type FET are provided on different substrates which are bonded to each other)
2. Embodiment 2 (vias are formed at once)
3. Embodiment 3 (an interlayer insulating film at a joining portion is made of a low-k material)
4. Embodiment 4 (a device isolation section of a lower substrate is not a STI)
5. Embodiment 5 (a share via is used)
6. Embodiment 6 (longitudinal directions of gates of an n-type FET and a p-type FET cross orthogonally with each other)
7. Embodiment 7 (longitudinal directions of gates of an n-type FET and a p-type FET cross at 45° with each other)
8. Embodiment 8 (a NAND circuit is formed)
9. Embodiment 9 (a NOR circuit is formed)
10. Embodiment 10 (wiring line layers are coupled directly to each other)
11. Embodiment 11 (fully silicided source-drain regions are provided)
12. Embodiment 12 (channel directions are parallel or orthogonal to each other where wiring line layers are coupled directly to each other)
13. Embodiment 13 (a FinFET is formed)
14. Embodiment 14 (three or more multilayer substrates are layered)
15. Modifications (a compound semiconductor is used, etc.)

<1. Embodiment 1>

A. Device Configuration

FIGS. 1 to 5 individually show essential part of a semiconductor device according to an embodiment 1.

Figure 1:
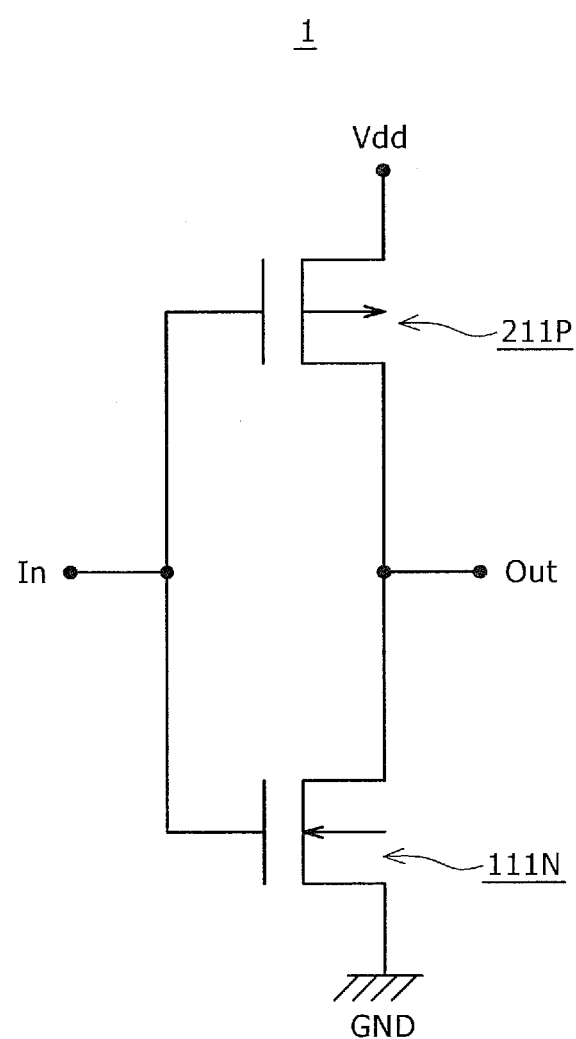
FIG. 1 is a circuit diagram showing a circuit configuration of a semiconductor device according to an embodiment 1.

In particular, FIG. 1 is a circuit diagram showing a circuit configuration of the semiconductor device.

Figure 2:
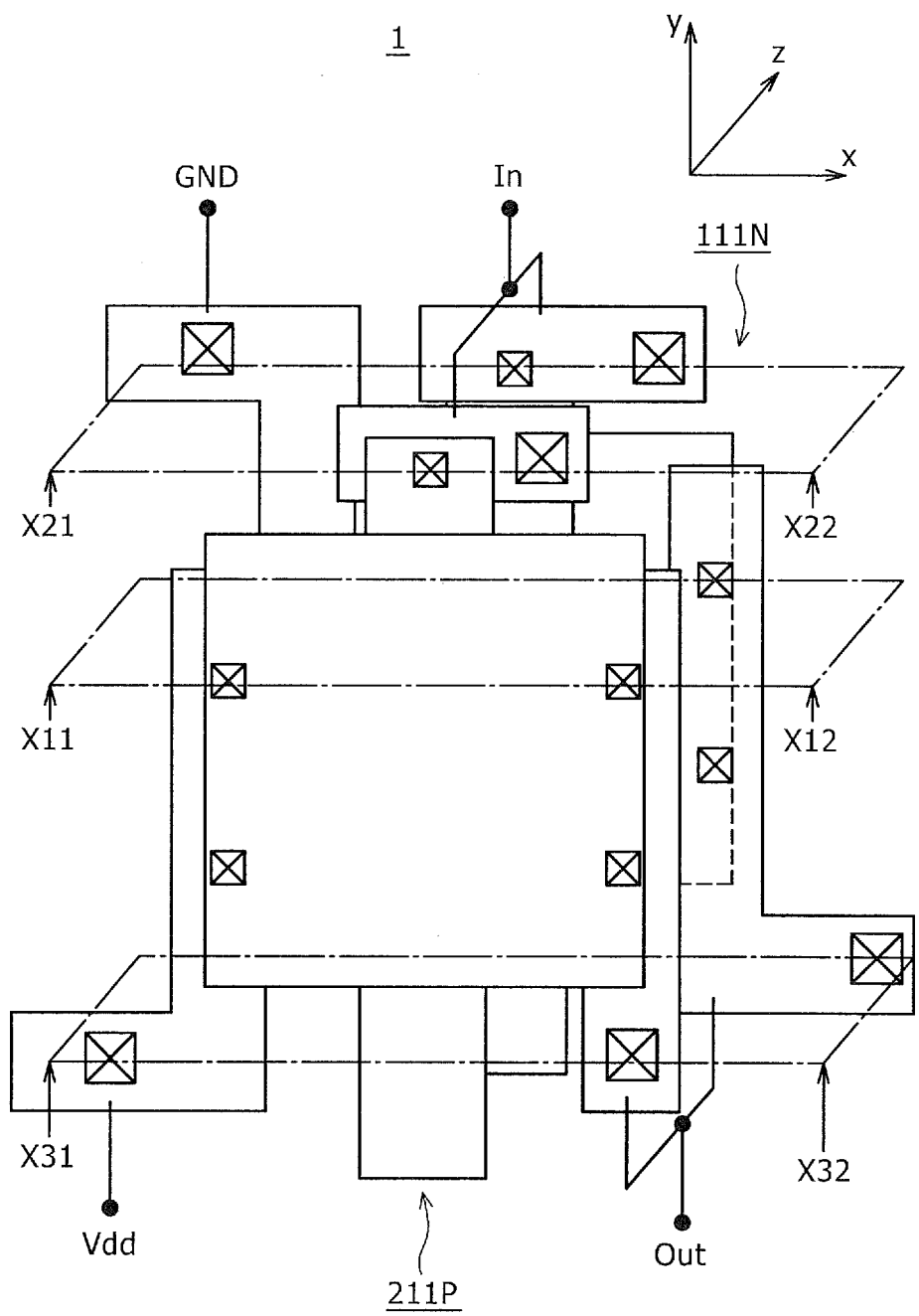
FIG. 2 is a perspective view showing essential part of the semiconductor device of FIG. 1.

FIG. 2 is a perspective view showing essential part of the semiconductor device. It is to be noted that FIG. 2 is a schematic plan view wherein two substrates are placed one on the other and shows patterns formed on the two substrates in a displaced relationship by a small distance from each other in a leftward and rightward direction, that is, in an x direction, and in an upward and downward direction, that is, in a y direction in order to assure high visibility.

Figure 3:
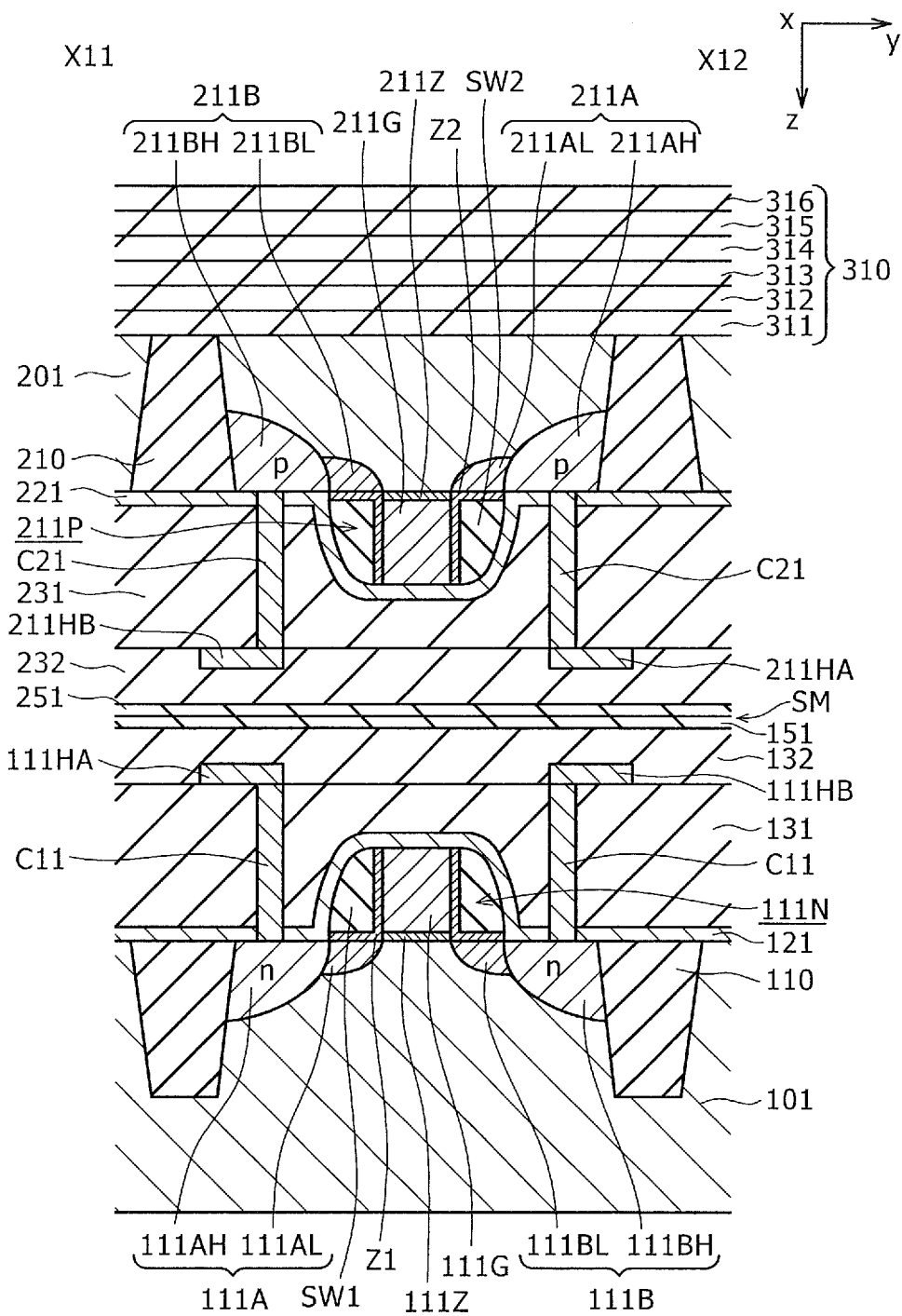
FIG. 3 is a schematic cross sectional view taken along plane X11-X12 of FIG. 2.
Figure 4:
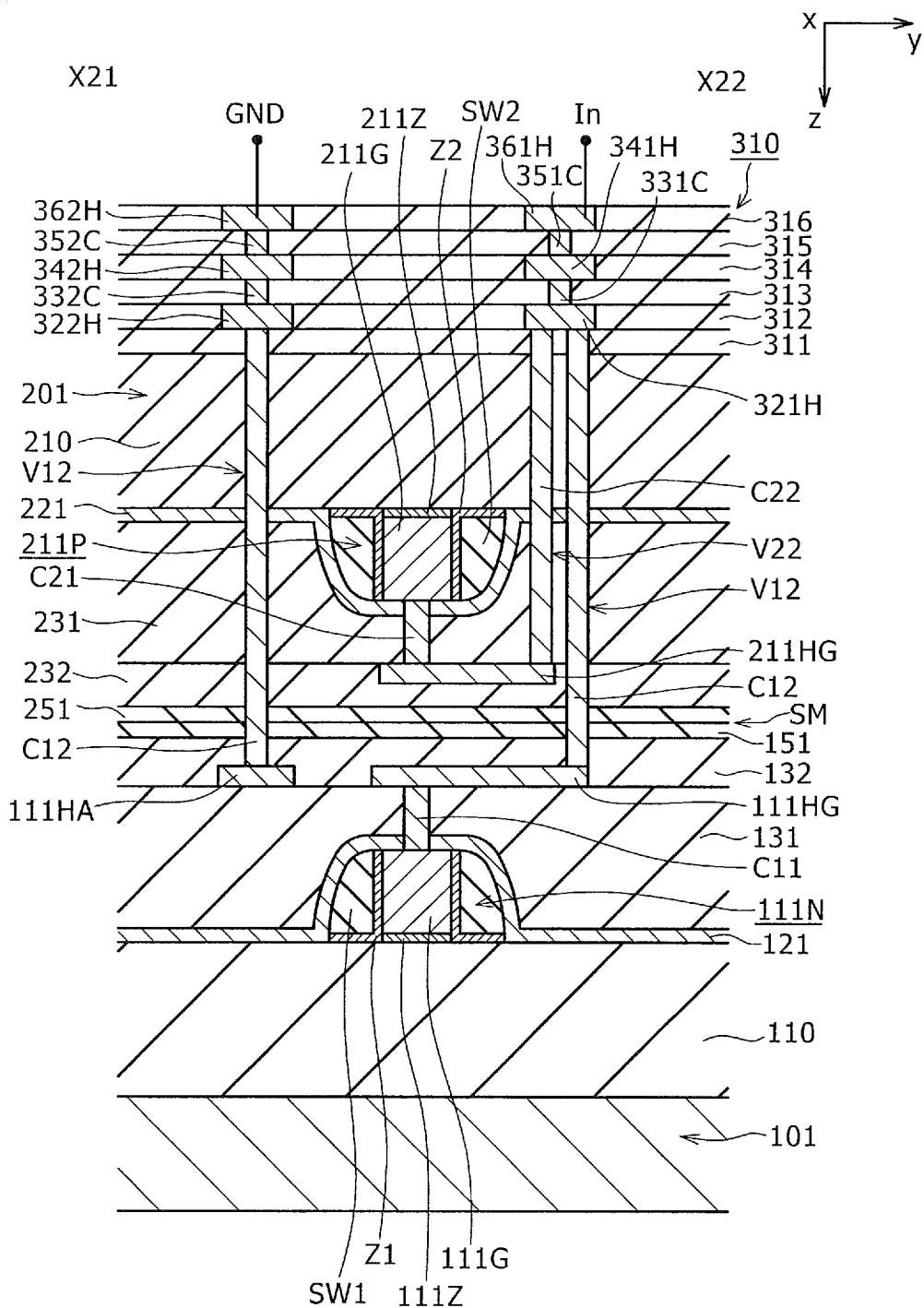
FIG. 4 is a schematic cross sectional view taken along plane X21-X22 of FIG. 2.
Figure 5:
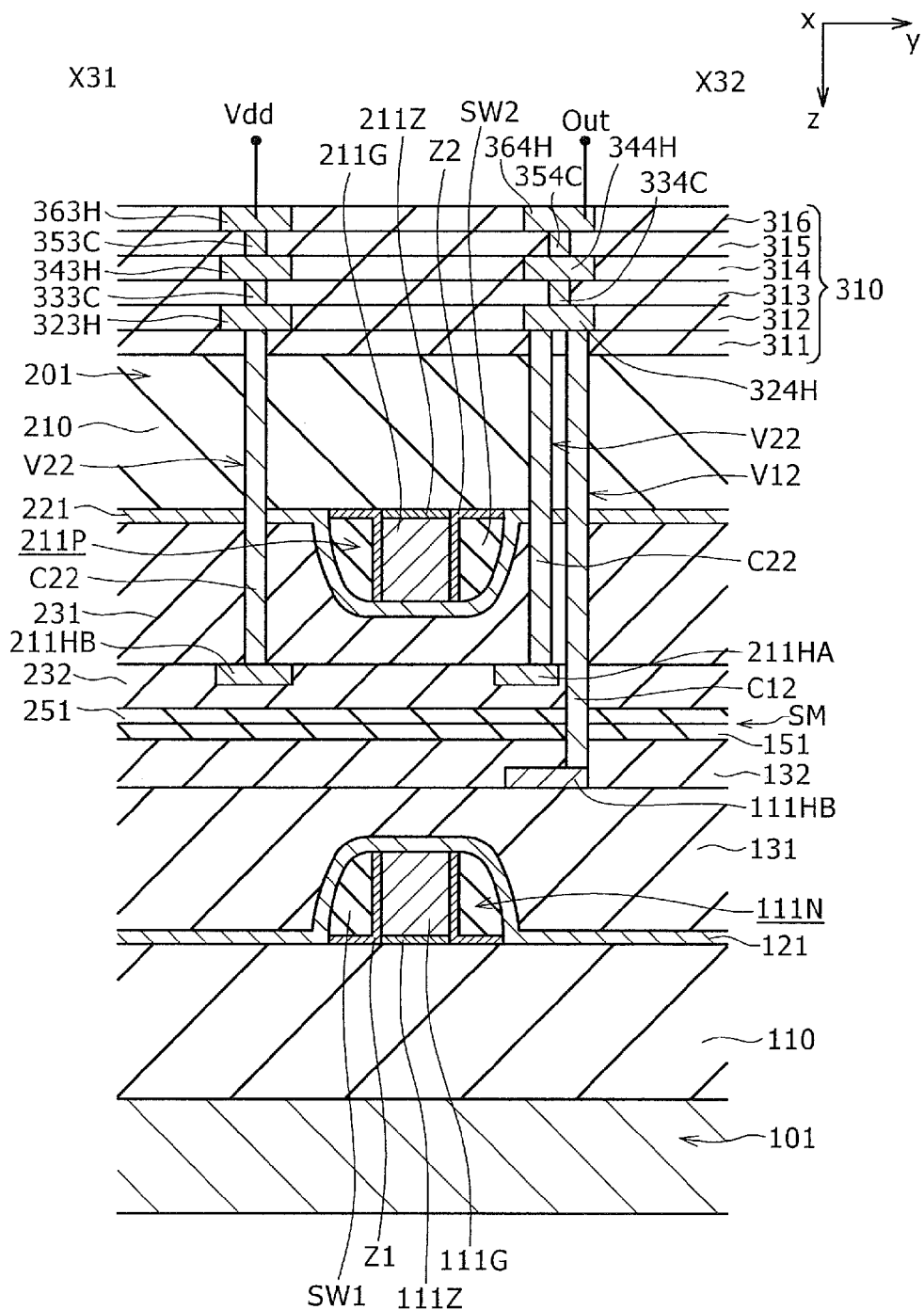
FIG. 5 is a schematic cross sectional view taken along plane X31-X32 of FIG. 2.

FIGS. 3 to 5 are sectional views showing essential part of the semiconductor device. More particularly, FIG. 3 shows a cross section taken along plane X11-X12 of FIG. 2; FIG. 4 shows a cross section taken along plane X21-X22; and FIG. 5 show a cross section taken along plane X31-X32. It is to be noted that the figures are shown in different scales so that the layout of shown elements can be recognized readily.

Referring to FIGS. 1 to 5, the semiconductor device 1 includes a CMOS circuit including an n-type MOSFET 111N and a p-type MOSFET 211P. It is to be noted that, in FIG. 2, the p-type MOSFET 211P is indicated by dots while no dot is applied to the n-type MOSFET 111N.

Referring to FIG. 1, the n-type MOSFET 111N and the p-type MOSFET 211P are electrically connected to each other so as to configure, for example, a CMOS inverter circuit or NOT circuit. In other words, the n-type MOSFET 111N and the p-type MOSFET 211P in the semiconductor device 1 are electrically connected such that, when an input signal of the high level is inputted to the semiconductor device 1, the semiconductor device 1 outputs an output signal of the low level, but when an input signal of the low level is inputted to the semiconductor device 1, the semiconductor device 1 outputs an output signal of the high level.

In particular, the gates of the n-type MOSFET 111N and the p-type MOSFET 211P are electrically connected to each other and electrically connected also to an input terminal In of the semiconductor device 1 as seen in FIG. 1.

The drain of the n-type MOSFET 111N and the drain of the p-type MOSFET 211P are electrically connected to each other and electrically connected also to an output terminal Out of the semiconductor device 1.

The source of the n-type MOSFET 111N is electrically connected to the ground GND. Meanwhile, the source of the p-type MOSFET 211P is electrically connected to a terminal Vdd of a power supply voltage.

The n-type MOSFET 111N and the p-type MOSFET 211P of the semiconductor device 1 are disposed in an opposing relationship to each other as seen in FIG. 2. Here, that "MOSFETS are disposed in an opposing relationship to each other" signifies that the faces opposite side to the channel side of the gate electrodes face each other.

Referring now to FIGS. 3 to 5, the semiconductor device 1 includes a first substrate 101 and a second substrate 201. The first substrate 101 and the second substrate 201 are disposed in an opposing relationship to each other. The n-type MOSFET 111N is provided on a face of the first substrate 101 which is opposed to the second substrate 201, that is, an upper face of the first substrate 101. Meanwhile, the p-type MOSFET 211P is provided on a face of the second substrate 201 which is opposed to the first substrate 101, that is, on a lower face of the second substrate 201.

A multilayer wiring line layer 310 is provided on a face of the second substrate 201 on the opposite side to the lower face opposing to the first substrate 101, that is, on an upper face of the second substrate 201. Although details are hereinafter described, the n-type MOSFET 111N and the p-type MOSFET 211P are electrically connected to each other through a plurality of wiring lines such as a wiring line layer 321H provided in the multilayer wiring line layer 310.

Figure 6:
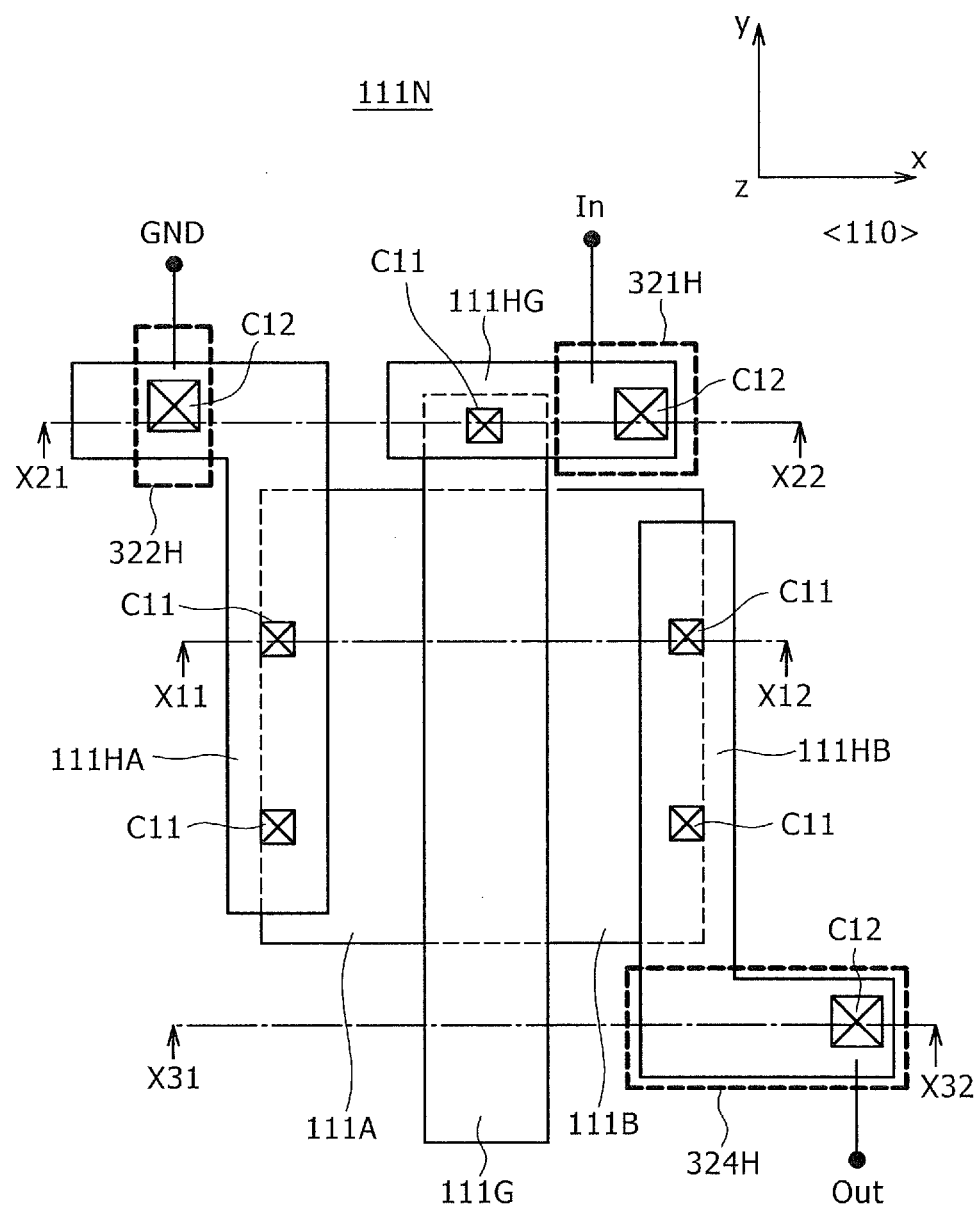
FIG. 6 is a schematic view showing essential part of an n-type MOSFET which configures part of the semiconductor device of FIG. 1.
Figure 7:
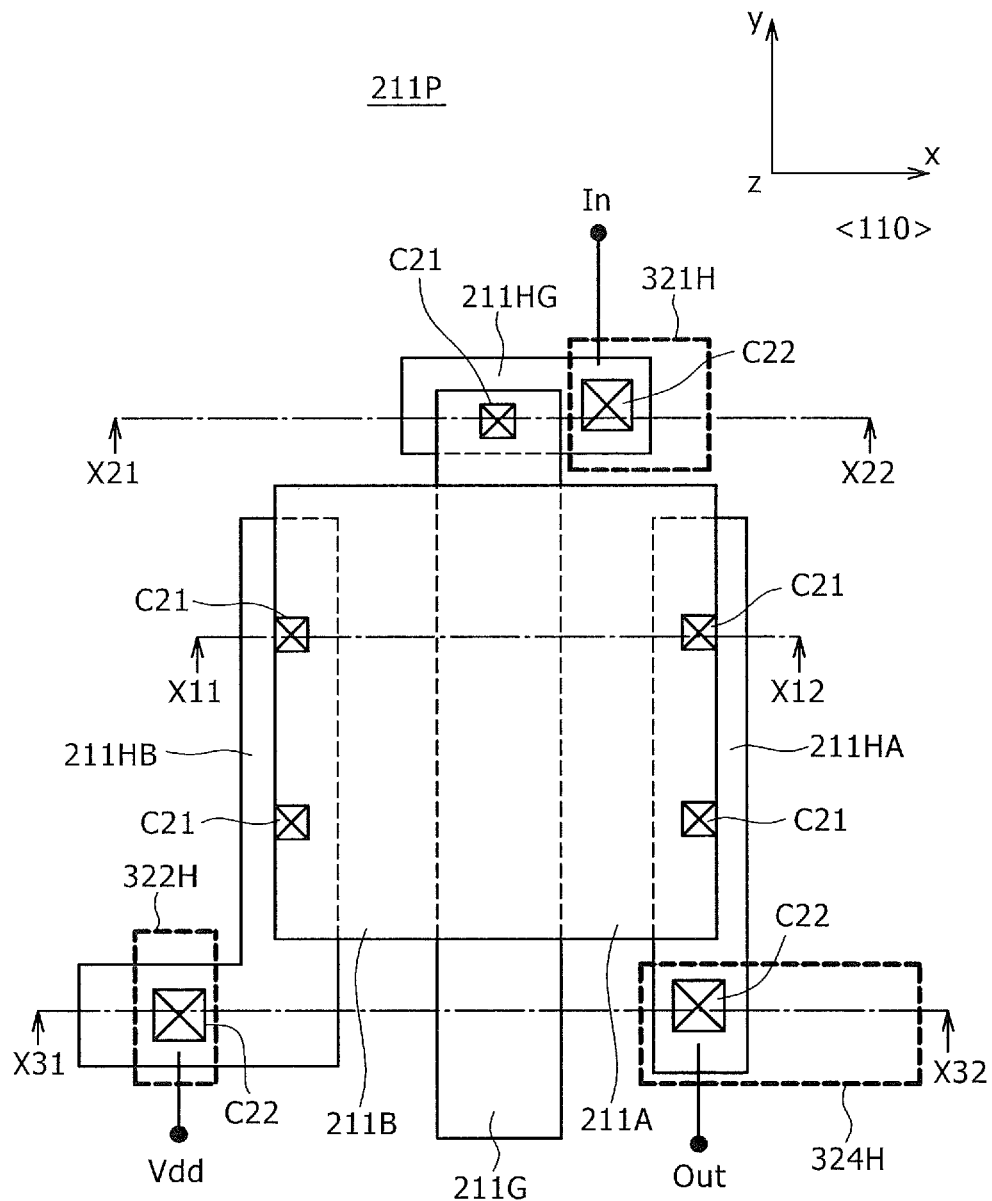
FIG. 7 is a schematic view showing essential part of a p-type MOSFET which configures part of the semiconductor device of FIG. 1.

FIG. 6 shows essential part of the n-type MOSFET which configures part of the semiconductor device, and FIG. 7 shows essential part of the p-type MOSFET which configures part of the semiconductor device.

In FIGS. 6 and 7, the upper faces are shown, and profiles of portions of members in lower layers covered with upper layers are indicated by thin broken lines. Further, some of a plurality of wiring lines which configure the multilayer wiring line layer 310, that is, those wiring lines at the lowermost portion, above the n-type MOSFET 111N and the p-type MOSFET 211P are indicated by thick broken lines.

Referring to FIG. 6, the n-type MOSFET 111N includes a gate electrode 111G and a pair of source-drain regions 111A and 111B.

As seen in FIG. 7, the p-type MOSFET 211P includes a gate electrode 211G and a pair of source-drain regions 211A and 211B.

Details of the components mentioned are successively described below.

A-1. First Substrate 101

The first substrate 101 is a (100) substrate made of, for example, a single crystal silicon semiconductor.

The n-type MOSFET 111N is provided on a face of the first substrate 101 which opposes to the second substrate 201, that is, an upper face of the first substrate as seen in FIGS. 3 to 5.

As shown in FIG. 3 and so forth, the n-type MOSFET 111N has a LDD (Lightly Doped Drain) structure. The n-type MOSFET 111N is provided such that, for example, the channel direction is directed to the <110> orientation on the (100) plane of the first substrate 101 so that the electron mobility may be high. It is to be noted that the "channel direction" in the present disclosed technology signifies a direction in which channel current flows or a direction in which the sound-drain regions are spaced from each other.

As shown in FIG. 3 and so forth, the n-type MOSFET 111N is provided in a region of the first substrate 101 partitioned by an element isolation layer 110.

The element isolation layer 110 is provided so as to provide, for example, a STI (Shallow Trench Isolation) structure. In particular, the element isolation layer 110 forms a trench not shown on a plane, that is, an xy plane, of the first substrate 101 such that it partitions a region in which the n-type MOSFET 111N is to be formed on the face. Thereafter, the element isolation layer 110 is formed by embedding an insulator such as, for example, silicon oxide into the trench not shown.

The gate electrode 111G of the n-type MOSFET 111N is provided on the plane, that is, in the xy plane, of the first substrate 101 such that it projects in a convex form with a gate insulating film 111Z interposed therebetween as seen in FIG. 3. The gate electrode 111G is provided such that it has a rectangular cross section on a plane, that is, a yz plane, perpendicular to the plane of the first substrate 101, that is, to the xy plane.

Further, the gate electrode 111G extends such that the longitudinal direction thereof corresponds to the y direction on the plane of the first substrate 101, that is, on the xy plane, as seen in FIG. 6.

The gate insulating film 111Z is formed using a high dielectric constant or high-k material having a dielectric constant higher than that of silicon dioxide. Meanwhile, the gate electrode 111G is formed using such a metal material that the work function thereof is positioned at an end of the conduction band.

A side wall SW1 is provided on the opposite sides of the gate electrode 111G with an insulating film Z1 interposed therebetween. The side walls SW1 are formed using an insulating material such as, for example, SiN. The insulating film Z1 is provided so as to cover side faces of the gate electrode 111G and portions of an upper face of the first substrate 101 which contact with the opposite side portions of the gate electrode 111G. The insulating film Z1 is formed using an insulating material such as, for example, $SiO_2$.

Of the n-type MOSFET 111N, the paired source-drain regions 111A and 111B are provided so as to sandwich a portion of a channel region in which the gate electrode 111G is provided on the first substrate 101.

The source-drain regions 111A and 111B have a low concentration impurity region 111AL or 111BL and a high concentration impurity region 111AH or 111BH as seen in FIG. 3 and so forth. The low concentration impurity regions 111AL and 111BL and the high concentration impurity regions 111AH and 111BH are doped with an n-type impurity.

As seen in FIG. 3 and so forth, the low concentration impurity regions 111AL and 111BL are provided under a portion of the first substrate 101 at which the insulating film Z1 and the side walls SW1 are provided on the upper face side of the first substrate 101. The low concentration impurity regions 111AL and 111BL are extension regions and are provided so as to sandwich the channel region therebetween.

As seen in FIG. 3 and so forth, the high concentration impurity regions 111AH and 111BH are provided on the opposite sides of the portion of the first substrate 101 at which the insulating film Z1 and the side walls SW1 are provided on the upper face side of the first substrate 101. The high concentration impurity regions 111AH and 111BH are provided so as to sandwich the channel region therebetween with the low concentration impurity regions 111AL and 111BL interposed therebetween. The high concentration impurity regions 111AH and 111BH are higher in impurity concentration than the low concentration impurity regions 111AL and 111BL and are formed to a deeper position.

The high concentration impurity regions 111AH and 111BH are formed, for example, by epitaxial growth of crystal from a concave portion after the concave portion is formed on the first substrate 101. For example, the high concentration impurity regions 111AH and 111BH are formed from a material having a grating constant different from that of the first substrate 101 and are provided so as to apply tensile force to the channel region to enhance the electron mobility.

The first substrate 101 has a stress liner layer 121 provided thereon as seen in FIGS. 3 to 5.

The stress liner layer 121 is provided so as to cover the upper face of the first substrate 101 on which the n-type MOSFET 111N is provided as seen in FIG. 3 and so forth. Here, in order to enhance the electron mobility of the n-type MOSFET 111N, the stress liner layer 121 is formed using a material which applies tensile stress to the channel region. Further, the stress liner layer 121 is configured so as to function as an etching stopper layer. In other words, the stress liner layer 121 is a CESL (Contact Etch Stop Liner) layer.

A flattening film 131 is provided on the first substrate 101 as in FIGS. 3 to 5. The flattening film 131 is provided such that it covers an upper face of the stress liner layer 121 on the first substrate 101 to provide a flattened face as seen in FIG. 3 and so forth.

A plurality of wiring line layers 111HA, 111HB and 111HG are provided on the first substrate 101 as seen in FIGS. 3 to 5. The wiring line layers 111HA, 111HB and 111HG are provided on an upper face of the flattening film 131 as seen in FIGS. 3 to 5.

It is to be noted that, in the present disclosed technology, the "wiring line layer" and the "wiring line" are not designations which specify a line shape but signify a layer formed by working the same conductive layer in a multilayer wiring line layer. Accordingly, the shape in plan of the wiring line layer or the wiring line is not limited to a line shape but may be any other shape such as a square shape or a rectangular shape.

The wiring line layer 111HA is provided such that it is electrically connected to one source-drain region 111A through a contact C11 which extends through the flattening film 131 as seen in FIG. 3. In particular, the wiring line layer 111HA is connected to the high concentration impurity region 111AH of the source-drain region 111A. Further, the wiring line layer 111HA is formed so as to include a portion extending along the y direction above the source-drain region 111A as seen in FIG. 6. In other words, the wiring line layer 111HA is formed such that the longitudinal direction thereof corresponds to the y direction. Further, the wiring line layer 111HA is formed so as to include a portion extending to the outer side in the x direction from an upper end of the portion thereof which extends in the y direction.

The wiring line layer 111HB is provided such that it is electrically connected to the other source-drain region 111B through another contact C11 which extends through the flattening film 131 as seen in FIG. 3. In particular, the wiring line layer 111HB is connected to the high concentration impurity region 111BH of the source-drain region 111B. Further, the wiring line layer 111HB is formed so as to include a portion extending along the y direction above the source-drain region 111B. In other words, the wiring line layer 111HB is formed such that the longitudinal direction thereof corresponds to the y direction. Further, the wiring line layer 111HB is formed so as to include a portion extending to the outer side in the x direction from a lower end of the portion thereof which extends in the y direction.

The wiring line layer 111HG is provided so as to be electrically connected to the gate electrode 111G through a further contact C11 extending through the flattening film 131 as seen in FIG. 4. Further, the wiring line layer 111HG is formed so as to include a portion extending in the x direction from an upper end of the gate electrode 111G above the gate electrode 111G as seen in FIG. 6. In other words, the wiring line layer 111HG is formed such that the longitudinal direction thereof coincides with the x direction.

The wiring line layers 111HA, 111HB and 111HG are coated with a plurality of interlayer insulating films 132 and 151 as seen in FIGS. 3 to 5.

The flattening film 131 and the interlayer insulating films 132 and 151 are formed using an insulating material such as, for example, silicon oxide or silicon nitride. The wiring line layers 111HA, 111HB and 111HG and the contacts C11 are formed using a metal material such as, for example, Al or Cu.

A-2. Second Substrate 201

The second substrate 201 is a (110) substrate formed, for example, from a single crystal silicon semiconductor.

The p-type MOSFET 211P is provided on a face of the second substrate 201 opposing to the first substrate 101, that is, on the lower face of the second substrate 201, as seen in FIGS. 3 to 5.

The p-type MOSFET 211P has a LDD structure as seen in FIG. 3 and so forth. Here, the p-type MOSFET 211P is provided such that, for example, the channel direction thereof is directed to the <110> direction on the (110) plane of the second substrate 201 so that the high hole mobility may be obtained.

As seen in FIG. 3 and so forth, the p-type MOSFET 211P is provided in a region partitioned by an element isolation layer 210 on the second substrate 201.

Here, the element isolation layer 210 is provided so as to provide, for example, a STI structure. In particular, the element isolation layer 210 forms a trench not shown on a plane of the second substrate 201, that is, in an xy plane, so as to partition a region in which the p-type MOSFET 211P is to be provided on the second substrate 201. After the trench is formed, an insulator such as, for example silicon oxide is embedded into the trench to form the element isolation layer 210.

The gate electrode 211G of the p-type MOSFET 211P is provided so as to protrude in a convex state through a gate insulating film 211Z on the plane of the second substrate 201, that is, on the xy plane, as seen in FIG. 3 and so forth. The gate electrode 211G is provided such that it has a rectangular section in a plane perpendicular to the plane of the second substrate 201 on the xy plane, that is, in the yz plane.

Further, the gate electrode 211G extends such that the longitudinal direction thereof corresponds to the y direction on the plane of the second substrate 201, that is, on the xy plane as seen in FIG. 7.

The gate insulating film 211Z is formed using a high dielectric constant or high-k material. The gate electrode 211G is formed using such a metal material that the work function thereof is positioned at an end of the valence band.

A side wall SW2 is provided on the opposite sides of the gate electrode 211G with an insulating film Z2 interposed therebetween. The side walls SW2 are formed using an insulating material such as, for example, SiN. The insulating film Z2 is provided so as to cover side faces of the gate electrode 211G and portions of the face of the second substrate 201 positioned adjacent the opposite sides of the gate electrode 211G. The insulating film Z2 is formed using an insulating material such as, for example, $SiO_2$.

The paired source-drain regions 211A and 211B of the p-type MOSFET 211P are provided in such a manner as to sandwich a portion of the channel region in which the gate electrode 211G is provided on the second substrate 201 as seen in FIG. 3 and so forth.

The source-drain regions 211A and 211B have a low concentration impurity region 211AL or 211BL and a high concentration impurity region 211AH or 211BH as seen in FIG. 3 and so forth. The low concentration impurity regions 211AL and 211BL and the high concentration impurity regions 211AH and 211BH are doped with a p-type impurity.

The low concentration impurity regions 211AL and 211BL are provided above a portion of the second substrate 201 on which the insulating film Z2 and the side walls SW2 are provided on the lower face side of the second substrate 201 as seen in FIG. 3 and so forth. The low concentration impurity regions 211AL and 211BL are extension regions and are provided so as to sandwich the channel region therebetween.

As seen in FIG. 3 and so forth, the high concentration impurity regions 211AH and 211BH are provided on the opposite sides of the portion of the second substrate 201 at which the insulating film Z2 and the side walls SW2 are provided on the lower face side of the second substrate 201. The high concentration impurity regions 211AH and 211BH are provided so as to sandwich the channel region therebetween with the low concentration impurity regions 211AL and 211BL interposed therebetween. The high concentration impurity regions 211AH and 211BH are higher in impurity concentration than the low concentration impurity regions 211AL and 211BL and are formed to a deeper position.

The high concentration impurity regions 211AH and 211BH are formed, for example, by epitaxial growth of crystal from a concave portion after the concave portion is formed on the second substrate 201. For example, the high concentration impurity regions 211AH and 211BH are formed from a material having a grating constant different from that of the second substrate 201 and are provided so as to apply compressive force to the channel region to enhance the electron mobility.

The second substrate 201 has a stress liner layer 221 provided thereon as seen in FIGS. 3 to 5.

The stress liner layer 221 is provided so as to cover the face of the second substrate 201 on which the p-type MOSFET 211P is provided as seen in FIG. 3 and so forth. Here, in order to enhance the electron mobility of the p-type MOSFET 211P, the stress liner layer 221 is formed using a material which applies compressive stress to the channel region. Further, the stress liner layer 221 is configured so as to function as an etching stopper layer. In other words, the stress liner layer 221 is a CESL layer.

A flattening film 231 is provided on the second substrate 201 as in FIGS. 3 to 5. The flattening film 231 is provided such that it covers the stress liner layer 221 on the second substrate 201 to provide a flattened face as seen in FIG. 3 and so forth.

A plurality of wiring line layers 211HA, 211HB and 211HG are provided on the second substrate 201 as seen in FIGS. 3 to 5. The wiring line layers 211HA, 211HB and 211HG are provided on a face of the flattening film 231 which opposes to the first substrate 101 as seen in FIGS. 3 to 5.

The wiring line layer 211HA is provided such that it is electrically connected to one source-drain region 211A through a contact C21 which extends through the flattening film 231 as seen in FIG. 3. In particular, the wiring line layer 211HA is connected to the high concentration impurity region 211AH of the source-drain region 211A. Further, the wiring line layer 211HA is formed so as to include a portion extending along the y direction below the source-drain region 211A as seen in FIG. 7. In other words, the wiring line layer 211HA is formed such that the longitudinal direction thereof corresponds to the y direction.

The wiring line layer 211HB is provided such that it is electrically connected to the other source-drain region 211B through another contact C21 which extends through the flattening film 231 as seen in FIG. 3. In particular, the wiring line layer 211HB is connected to the high concentration impurity region 211BH of the source-drain region 211B. Further, the wiring line layer 211HB is formed so as to include a portion extending along the y direction below the source-drain region 211B. In other words, the wiring line layer 211HB is formed such that the longitudinal direction thereof corresponds to the y direction. Further, the wiring line layer 211HB is formed so as to include a portion extending to the outer side in the x direction from a lower end of the portion thereof which extends in the y direction.

The wiring line layer 211HG is provided so as to be electrically connected to the gate electrode 211G through a further contact C21 extending through the flattening film 231 as seen in FIG. 4. Further, the wiring line layer 211HG is formed so as to include a portion extending in the x direction from an upper end of the gate electrode 211G below the gate electrode 211G as seen in FIG. 7. In other words, the wiring line layer 211HG is formed such that the longitudinal direction thereof coincides with the x direction.

The wiring line layers 211HA, 211HB and 211HG are coated with a plurality of interlayer insulating films 232 and 251 as seen in FIGS. 3 to 5.

The flattening film 231 and the interlayer insulating films 232 and 251 are formed using an insulating material such as, for example, silicon oxide or silicon nitride. The wiring line layers 211HA, 211HB and 211HG and the contacts C21 are formed using a metal material such as, for example, Al or Cu.

As seen in FIGS. 3 to 5, the second substrate 201 is opposed to the first substrate 101. Here, the face of the second substrate 201 on which the p-type MOSFET 211P is provided is opposed to the face of the first substrate 101 on which the n-type MOSFET 111N is provided. In other words, the second substrate 201 is disposed such that the interlayer insulating film 251 provided thereon is opposed to the interlayer insulating film 151 provided on the first substrate 101.

The second substrate 201 is bonded to the first substrate 101. Here, the interlayer insulating film 251 provided on the second substrate 201 is joined to the interlayer insulating film 151 provided on the first substrate 101.

In the present embodiment, the components are disposed such that the n-type MOSFET 111N and the p-type MOSFET 211P are positioned symmetrically with respect to the joining plane SM along which the first substrate 101 and the second substrate 201 are joined together.

A-3. Multilayer Wiring Line Layer 310

The multilayer wiring line layer 310 is provided on the upper face of the second substrate 201 opposite to the lower face which opposes to the first substrate 101 as seen in FIGS. 3 to 5.

The multilayer wiring line layer 310 includes a plurality of insulating layers 311 to 316 and a plurality wiring lines such as the wiring line layer 321H and so forth. For example, the six insulating layers 311 to 316 are layered successively. The wiring lines including the wiring line layer 321H mentioned are layered in the inside of the multilayer wiring line layer 310 and electrically connected to each other suitably by contacts such as a contact 331C.

The multilayer wiring line layer 310 is configured so as to electrically connect the n-type MOSFET 111N and the p-type MOSFET 211P as seen in FIGS. 4 and 5.

In particular, in the multilayer wiring line layer 310, the wiring line layer 321H provided on an upper face of the insulating layer 311 of the first layer is electrically connected to the wiring line layer 111HG provided on the first substrate 101 through a contact C12. Further, the wiring line layer 321H is electrically connected to the wiring line layer 211HG provided in the second substrate 201 through a contact C22. The wiring line layer 321H is formed such that it has a rectangular shape in plan as seen in FIGS. 6 and 7. Further, as seen in FIG. 4, the wiring line layer 321H is connected to the wiring line layer 341H provided on an upper face of the insulating layer 313 of the third layer through the contact 331C. The wiring line layer 341H is connected to the wiring line layer 361H provided on an upper face of the insulating layer 315 of the fifth layer through a contact 351C. The wiring line layer 361H is electrically connected to the input terminal In. In this manner, the multilayer wiring line layer 310 electrically connects the gate electrode 111G of the n-type MOSFET 111N and the gate electrode 211G of the p-type MOSFET 211P to each other and further electrically connects them to the input terminal In (refer to FIG. 1).

Further, as shown in FIG. 4, in the multilayer wiring line layer 310, a wiring line layer 322H provided on an upper face of the insulating layer 311 of the first layer is electrically connected to the wiring line layer 111HA provided on the first substrate 101 through the contact C12. The wiring line layer 322H is formed such that it has a rectangular shape in plan as seen in FIG. 6. Further, as seen in FIG. 4, the wiring line layer 322H is connected to a wiring line layer 342H provided on an upper face of the insulating layer 313 of the third layer through a contact 332C. The wiring line layer 342H is connected to a wiring line layer 362H provided on an upper face of the insulating layer 315 of the fifth layer through a contact 352C. The wiring line layer 362H is electrically connected to the ground GND. In this manner, the multilayer wiring line layer 310 electrically connects the source-drain region 111A of the n-type MOSFET 111N to the ground GND (refer to FIG. 1).

Further, as seen in FIG. 5, in the multilayer wiring line layer 310, a wiring line layer 323H provided on the upper face of the insulating layer 311 of the first layer is electrically connected to the wiring line layer 211HB provided on the second substrate 201 through the contact C22. The wiring line layer 323H is formed such that it has a rectangular shape in plan as seen in FIG. 7. Further, as seen in FIG. 5, the wiring line layer 323H is connected to a wiring line layer 343H provided on an upper face of the insulating layer 313 of the third layer through the contact 333C. The wiring line layer 343H is connected to a wiring line layer 363H provided on an upper face of the insulating layer 315 of the fifth layer through the contact 353C. The wiring line layer 363H is electrically connected to the terminal Vdd of the power supply voltage. In this manner, the multilayer wiring line layer 310 electrically connects the source-drain region 211B of the p-type MOSFET 211P to the terminal Vdd of the power supply (refer to FIG. 1).

Further, as seen in FIG. 5, in the multilayer wiring line layer 310, the wiring line layer 324H provided on the upper face of the insulating layer 311 of the first layer is electrically connected to the wiring line layer 111HB provided on the first substrate 101 through the contact C12. Further, the wiring line layer 321H is electrically connected to the wiring line layer 211HA provided on the second substrate 201 through the contact C22. The wiring line layer 324H is formed such that it has a rectangular shape in plan as seen in FIGS. 6 and 7. Further, as seen in FIG. 5, the wiring line layer 324H is connected to a wiring line layer 344H provided on the upper face of the insulating layer 313 of the third layer through a contact 334C. The wiring line layer 344H is connected to the wiring line layer 364H provided on the upper face of the insulating layer 315 of the fifth layer through a contact 354C. Further, the wiring line layer 364H is electrically connected to the output terminal Out. In this manner, the multilayer wiring line layer 310 electrically connects the source-drain region 111B of the n-type MOSFET 111N and the source-drain region 211A of the p-type MOSFET 211P to each other (refer to FIG. 1). Furthermore, the multilayer wiring line layer 310 electrically connects the source-drain region 111B of the n-type MOSFET 111N and the source-drain region 211A of the p-type MOSFET 211P to the output terminal Out (refer to FIG. 1).

B. Fabrication Method

A fabrication method for fabricating the semiconductor device 1 described above is described below.

FIGS. 8 to 18 individually illustrate essential part of the fabrication method of the semiconductor device in the embodiment 1.

Figure 8:
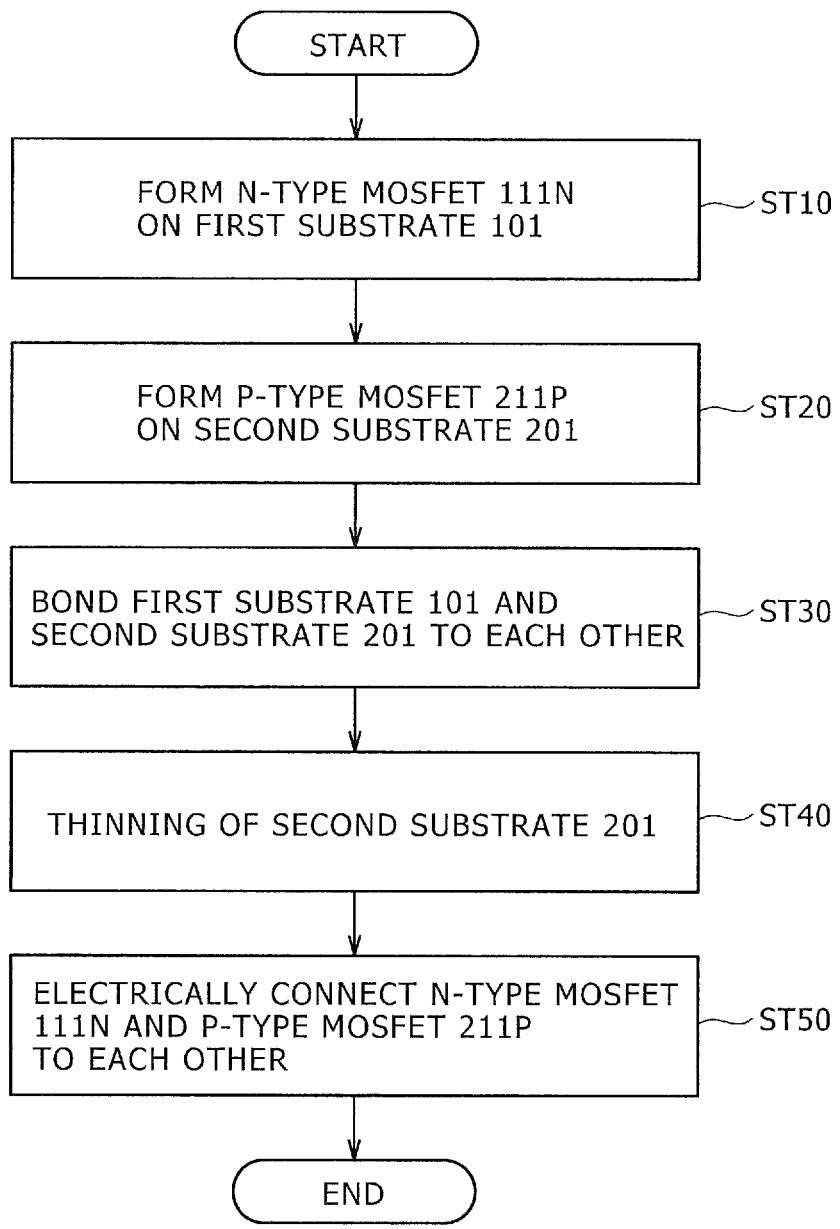
FIG. 8 is a flow chart schematically illustrating a fabrication method of the semiconductor device of FIG. 1.

FIG. 8 is a fabrication flow chart.

FIGS. 9 to 18 are sectional views similarly to FIGS. 3 to 5 and show cross sections formed at steps illustrated in FIG. 8. FIGS. 9 to 13 particularly show cross sections taken along plane X11-X12 similarly to FIG. 3. Meanwhile, FIGS. 14 to 18 show cross sections taken along plane X21-X22 of FIG. 2.

B-1. Formation of an n-Type MOSFET 111N on a First Substrate 101

First at step ST10, an n-type MOSFET 111N is formed on a first substrate 101 as shown in FIG. 8.

Figure 9:
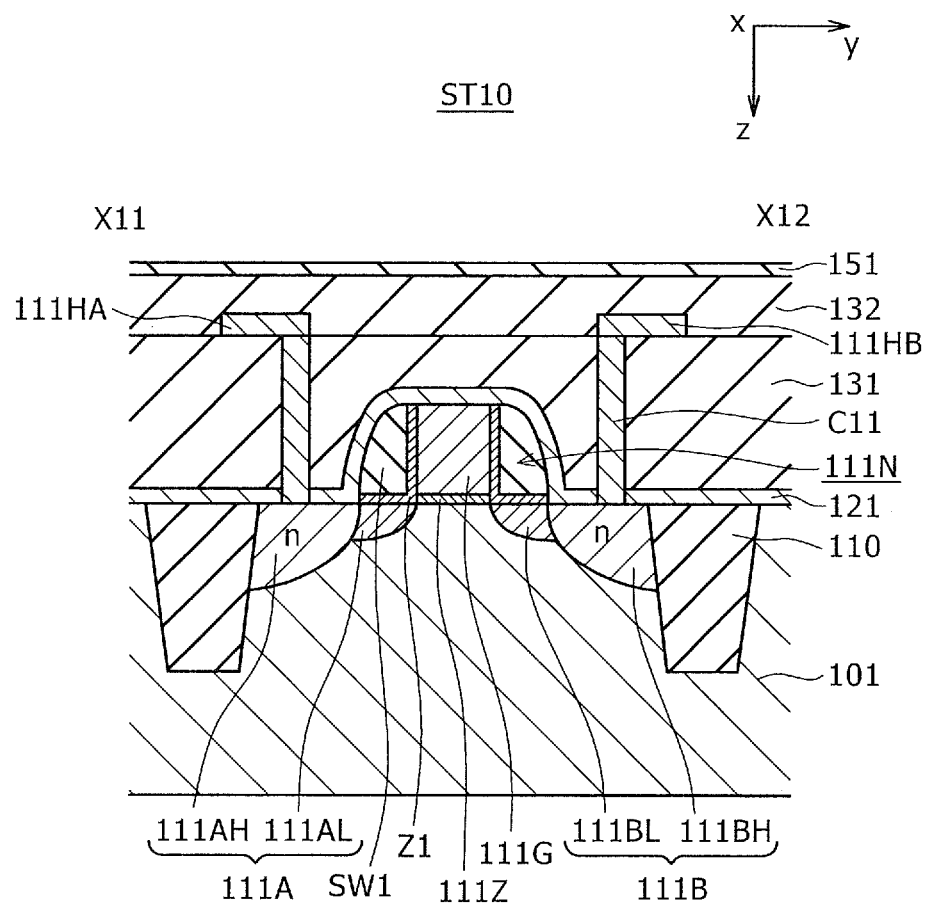
FIGS. 9 to 13 are schematic cross sectional views taken along plane X11-X12 of FIG. 2 illustrating different steps of the fabrication method illustrated in FIG. 8.

Here, the n-type MOSFET 111N is formed in such a manner as described above in a region partitioned by the element isolation layer 110 on the upper face of the first substrate 101 as seen in FIG. 9.

In the present embodiment, the n-type MOSFET 111N is provided such that, for example, the channel direction thereof is directed to the <110> orientation on the (100) plane of the first substrate 101.

In particular, an element isolation layer 110 is first formed on the upper face of the first substrate 101. For example, a trench is formed on the upper face of the first substrate 101 such that it has a depth of 150 to 200 nm and is filled with silicon oxide to form the element isolation layer 110.

Then, a gate insulating film 111Z is formed and then a gate electrode 111G is formed.

In the present embodiment, the gate insulating film 111Z is formed using a high dielectric or high-k material. Then, the gate electrode 111G is formed using such a metal material having a work function positioned at an end of the conduction band.

For example, the gate insulating film 111Z and the gate electrode 111G are formed suitably in accordance with such conditions as given below.

Formation Conditions of the Gate Insulating Film 111Z
  Material: $HfO_2$
  Thickness: 0.5 to 2 nm
  Film formation method: CVD or sputtering Formation Conditions of the Gate Electrode 111G
  Lower layer: TiN containing Al (content ratio of Al: 0.5 to 5 atom %), thickness 1 to 2 nm Upper layer: Al or W, thickness 20 to 40 nm
Film formation method: CVD or sputtering It is to be noted that, not only HfO$_2$ listed above but also various high-k materials such as HfSiON or Ta$_2$O$_3$ may be used to form the gate insulating film 111Z.

Then, low concentration impurity regions 111AL and 111BL are formed.

Preferably, the low concentration impurity regions 111AL and 111BL are formed, for example, in such conditions as given below.

Formation Conditions of the Low Concentration Impurity Regions 111AL and 111BL
    Depth: 0.5 to 20 nm
    Width: 10 to 40 nm
    Impurity concentration: around $1\times10^{13}$ cm$^{-2}$ After the insulating film Z1 is formed, side walls SW1 are formed. Then, portions of the upper face of the first substrate 101 on which the high concentration impurity regions 111AH and 111BH are to be formed are selectively removed by such a process as etching to form concave portions on the upper face of the first substrate 101. Then, crystal is epitaxially grown from the concave portions, and then ions of an impurity are implanted to form high concentration impurity regions 111AH and 111BH.

In the present embodiment, a material which has a grading constant different from that of the first substrate 101 and applies tensile force to the channel region is used to form the high concentration impurity regions 111AH and 111BH.

Preferably, the high concentration impurity regions 111AH and 111BH are formed, for example, in the following conditions.

Formation Conditions of the High Concentration Impurity Regions 111AH and 111BH
    Material: SiC (the C concentration is lower than 3 atom %)
    Depth: 50 to 100 nm
    Film formation method: CVD
    Impurity concentration: around $1\times10^{15}$ cm$^{-2}$ Then, such a process as an activating annealing process is carried out to form an n-type MOSFET 111N. After the formation of the n-type MOSFET 111N, a stress liner layer 121 is provided in such a manner as to cover an upper face of the first substrate 101 on which the n-type MOSFET 111N is provided. Here, the stress liner layer 121 is provided in such a manner as to cover the overall n-type MOSFET 111N after a silicide layer not shown is formed on an upper face of the high concentration impurity regions 111AH and 111BH.

In the present embodiment, a material which applies tensile stress to the channel region of the n-type MOSFET 111N is used to form the stress liner layer 121.

For example, it is preferable to form the stress liner layer 121 in such conditions as described below.

Formation Condition of the Stress Liner Layer 121
    Material: SiN
    Thickness: 20 to 200 nm
    Film formation method: CVD Then, a flattening film 131 is provided so as to cover an upper face of the stress liner layer 121 on the first substrate 101. The flattening film 131 is formed using an insulating material.

Then, wiring line layers 111HA and 111HB are formed on an upper face of the flattening film 131. Though not shown in FIG. 9, also the wiring line layer 111HG is provided in a similar manner as illustrated in FIG. 4.

Here, the wiring line layers 111HA and 111HB (111HG, FIG. 4) are provided after formation of a contact C11 such that it extends through the flattening film 131. For example, after a contact hole of a depth of 80 to 130 nm is formed, a conductive material is filled into the contact hole to form the contact C11. Then, a plurality of wiring line layers 111HA and 111HB (111HG, FIG. 4) are formed such that the thickness may be 75 to 100 nm. It is to be noted that, upon formation of the contact holes, the stress liner layer 121 functions as an etching stopper layer.

Thereafter, a plurality of interlayer insulating films 132 and 151 are successively provided in such a manner as to cover the plural wiring line layers 111HA and 111HB (111HG, FIG. 4). For example, the interlayer insulating films 132 and 151 are provided after an etching stopper layer not shown having a thickness of approximately 10 to 20 nm is provided. The interlayer insulating film 151 is formed such that it has a thickness of, for example, approximately 20 to 50 nm.

B-2. Formation of the P-Type MOSFET 211P on the Second Substrate 201

Thereafter, a p-type MOSFET 211P is formed on the second substrate 201 as seen in FIG. 8 (step ST20).

Here, the p-type MOSFET 211P is formed in such a manner as described above in a region of the upper face of the second substrate 201 partitioned by the element isolation layer 210.

In the present embodiment, the p-type MOSFET 211P is provided such that the channel direction is directed, for example, to the <110> orientation on the (110) plane of the second substrate 201.

In particular, an element isolation layer 210 is formed on the upper face of the second substrate 201 first. For example, the element isolation layer 210 is formed by forming a trench on the upper face of the second substrate 201 so as to have a depth of 150 to 200 nm and then embedding silicon oxide into the trench.

Then, a gate electrode 211G is formed after a gate insulating film 211Z is formed.

In the present embodiment, the gate insulating film 211Z is formed using a high dielectric constant or high-k material. Meanwhile, the gate electrode 211G is formed using such a metal material that the work function is positioned at an end of the valence band.

Preferably, the gate insulating film 211Z and the gate electrode 211G are formed, for example, in such conditions as given below.

Formation Condition of the Gate Insulating Film 211Z
    Material: HfO$_2$
    Thickness: 0.5 to 2 nm
    Film formation method: CVD or sputtering
Formation Condition of the Gate Electrode 211G
    Lower layer: TiN without Al, thickness 1 to 2 nm
    Upper layer: Al or W, thickness 20 to 40 nm
    Film formation method: CVD or sputtering It is to be noted that, in addition to HfO$_2$ listed above, various high-k materials such as HfSiON or Ta$_2$O$_3$ may be used to form the gate insulating film 111Z.

Then, low concentration impurity regions 211AL and 211BL are formed.

Preferably, the low concentration impurity regions 211AL and 211BL are formed, for example, in such conditions as given below.

Formation Condition of the Low Concentration Impurity Regions 211AL and 211BL
    Depth: 0.5 to 20 nm
    Width: 10 to 40 nm
    Impurity concentration: around $1\times10^{13}$ cm$^{-2}$ Then, side walls SW2 are formed after an insulating film Z2 is formed. Then, portions at which the high concentration impurity regions 211AH and 211BH are to be formed on the upper face of the second substrate 201 are selectively removed by such a process as etching to form concave portions on the upper face of the second substrate 201. Then, crystal is epitaxially grown from the concave portions and ions of an impurity are implanted to form high concentration impurity regions 211AH and 211BH.

In the present embodiment, a material which has a grating constant different from that of the second substrate 201 and applies tensile stress to the channel region is used to form the high concentration impurity regions 211AH and 211BH.

Preferably, the high concentration impurity regions 211AH and 211BH are formed, for example, in such conditions as given below.

Formation Conditions of the High Concentration Impurity Regions 211AH and 211BH
  Material: SiGe (Ge concentration: 10 to 45 atom %)
  Depth: 50 to 100 nm
  Film formation method: CVD
  Impurity concentration: around $1 \times 10^{15}$ cm$^{-2}$ Then, such a process as an activating annealing process is carried out to form a p-type MOSFET 211P. After the formation of the p-type MOSFET 211P, a stress liner layer 221 is provided in such a manner as to cover an upper face of the second substrate 201 on which the p-type MOSFET 211P is provided. Here, the stress liner layer 121 is provided in such a manner as to cover the overall p-type MOSFET 211P after a silicide layer not shown is formed on an upper face of the high concentration impurity regions 211AH and 211BH.

In the present embodiment, a material which applies compressive stress to the channel region of the p-type MOSFET 211P is used to form the stress liner layer 221.

Preferably, the stress liner layer 221 is formed in such conditions as given below.

Formation Condition of the Stress Liner Layer 221
  Material: SiN
  Thickness: 20 to 200 nm
  Film formation method: CVD Then, a flattening film 231 is provided in such a manner as to cover an upper face of the stress liner layer 221 on the second substrate 201. The flattening film 231 is formed using an insulating material.

Then, wiring line layers 211HA and 211HB are provided on an upper face of the flattening film 231. Though not shown in FIG. 10, also the wiring line layer 211HG is provided similarly as seen in FIG. 4. Here, a plurality of wiring line layers 211HA and 211HB (211HG, FIG. 4) are provided after formation of a contact C21 such that they extend through the flattening film 231. For example, the contact C21 is formed by forming a contact hole of a depth of 80 to 130 nm and then embedding a conductive material into the contact hole. Then, a plurality of wiring line layers 211HA and 211HB (211HG, FIG. 4) are formed such that the thickness becomes 75 to 100 nm. It is to be noted that, upon formation of the contact holes, the stress liner layer 221 functions as an etching stopper layer.

Thereafter, a plurality of interlayer insulating films 232 and 251 are provided successively in such a manner as to cover the plural wiring line layers 211HA and 211HB (211HG, FIG. 4). For example, the interlayer insulating films 232 and 251 are provided after an etching stopper layer not shown having a thickness of approximately 10 to 20 nm. The interlayer insulating film 251 is formed such that it has a thickness of, for example, approximately 20 to 50 nm.

In the present embodiment, a material similar to that of the interlayer insulating film 151 provided on the first substrate 101 is used to form the interlayer insulating film 251. It is to be noted that the interlayer insulating film 251 may be formed using a material different from that of the interlayer insulating film 151 provided on the first substrate 101.

B-3. Bonding of the First Substrate 101 and the Second Substrate 201

Then, the first substrate 101 and the second substrate 201 are bonded to each other at step ST30 as seen in FIG. 8.

Figure 11:
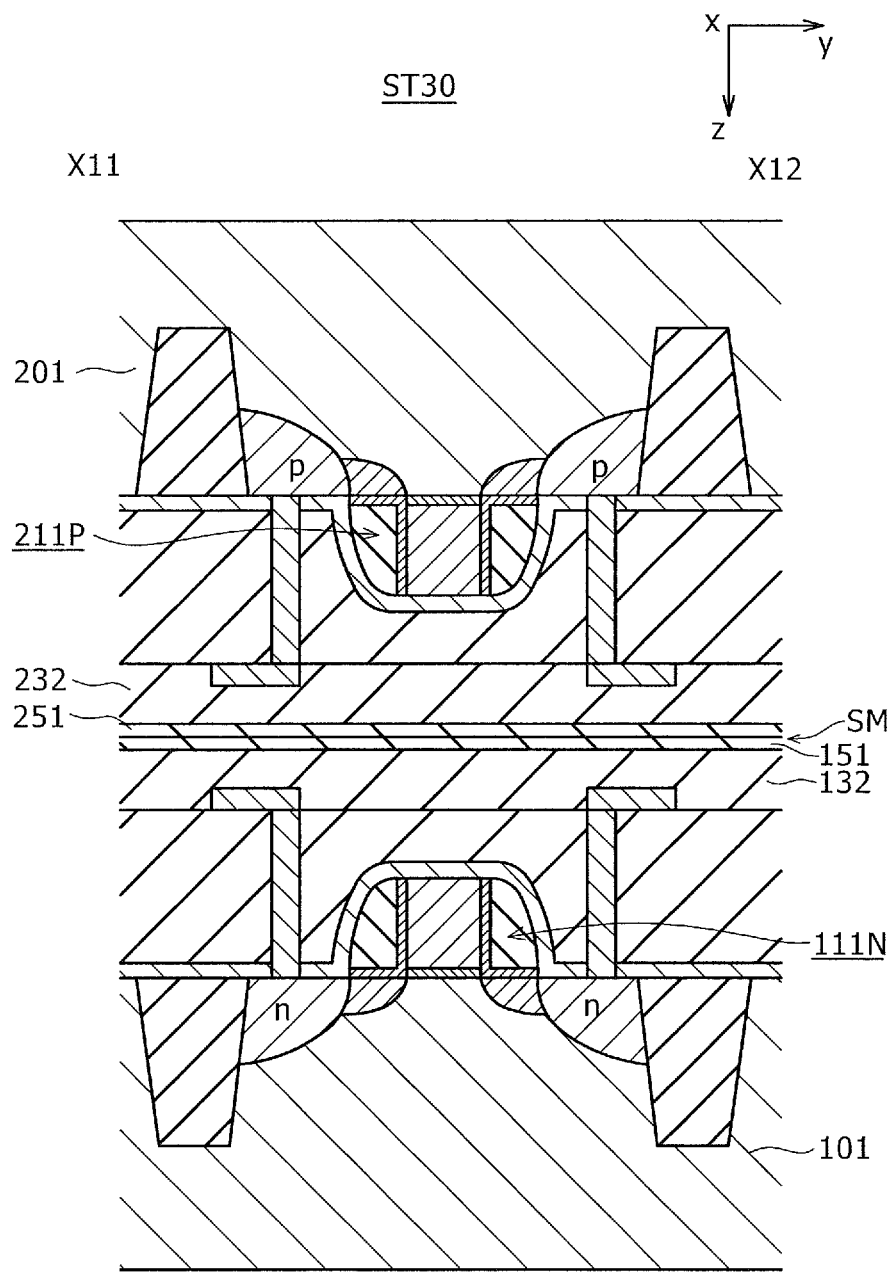
Figure 12:
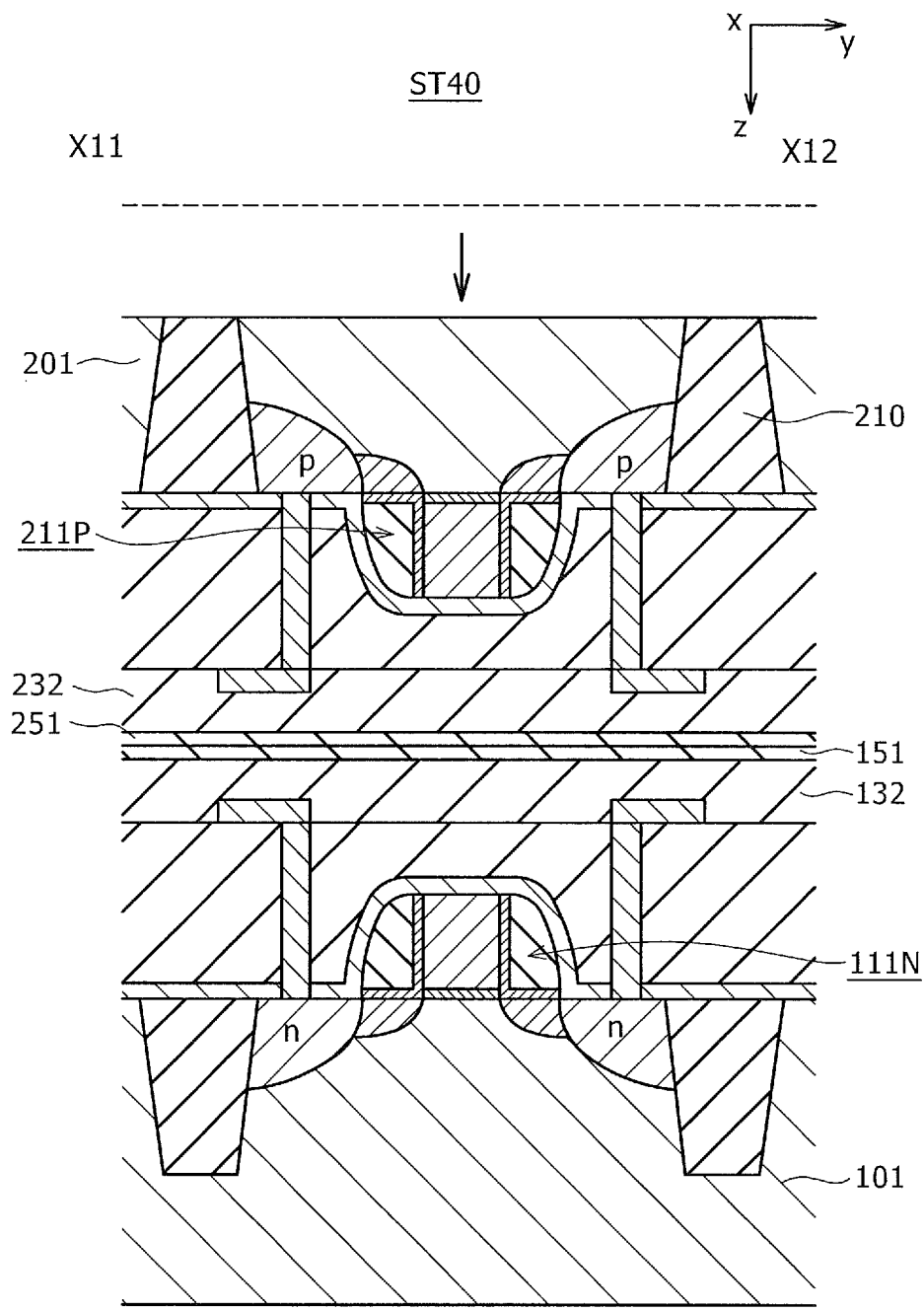

Here, the first substrate 101 and the second substrate 201 are placed in an opposing relationship to each other and then bonded to each other as seen in FIG. 11.

In particular, the face of the first substrate 101 on which the n-type MOSFET 111N is provided and the face of the element isolation layer 210 on which the p-type MOSFET 211P is provided are placed into an opposing relationship to each other. In other words, the second substrate 201 is inverted so as to be opposed to the first substrate 101.

Then, the interlayer insulating film 151 provided on the first substrate 101 and the interlayer insulating film 251 provided on the second substrate 201 are placed into contact with each other and then joined together.

The interlayer insulating film 151 provided on the first substrate 101 and the interlayer insulating film 251 provided on the second substrate 201 are joined together and bonded to each other by plasma joining. In other words, the faces processed by plasma are joined together using a dehydration condensation reaction. Since the plasma bonding is carried out in a low temperature environment, for example, at a temperature lower than 400° C., the reliability of the apparatus is not deteriorated, which is preferable from the point of view of prevention of occurrence of re-distribution of impurity, a heat resisting property of metal wiring lines and so forth.

It is to be noted that, though not shown, the first substrate 101 and the second substrate 201 are bonded to each other after positioning of them is carried out with a high degree of accuracy using alignment marks not shown provided on them.

B-4. Thinning of the Second Substrate 201

Then, the element isolation layer 210 is formed into a thin film at step ST40 as seen in FIG. 8.

Here, the upper face of the second substrate 201 on the opposite side to the lower face which opposes to the first substrate 101 is polished to form the second substrate 201 into a thin film.

For example, a CMP (Chemical Mechanical Polishing) process is carried out to polish the upper face of the second substrate 201 to a portion of the second substrate 201 at which the element isolation layer 210 of the STI structure is provided.

B-5. Electric Connection of the n-Type MOSFET 111N and the p-Type MOSFET 211P

Thereafter, the n-type MOSFET 111N and the p-type MOSFET 211P are electrically connected to each other at step ST50 as seen in FIG. 8.

Here, as seen in FIGS. 3 to 5, a multilayer wiring line layer 310 is provided on the upper face of the second substrate 201 on the opposite side to the lower face which is opposed to the first substrate 101 to electrically connect the n-type MOSFET 111N and the p-type MOSFET 211P to each other.

In particular, a multilayer wiring line layer 310 including a plurality of insulating layers 311 to 316 and a plurality of wiring lines such as the wiring line layer 321H and contacts such as the contact 331C is provided.

Figure 13:
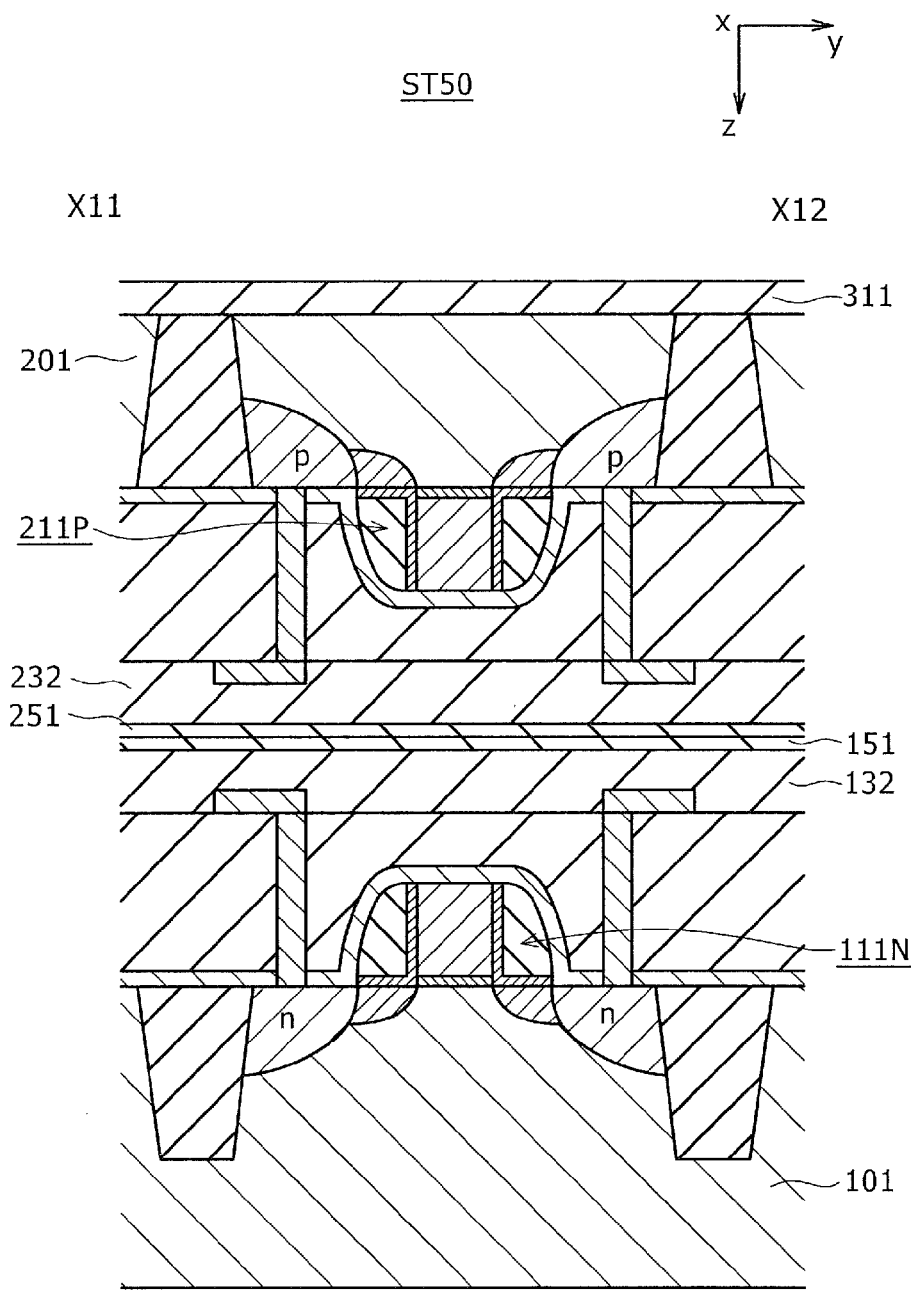
Figure 14:
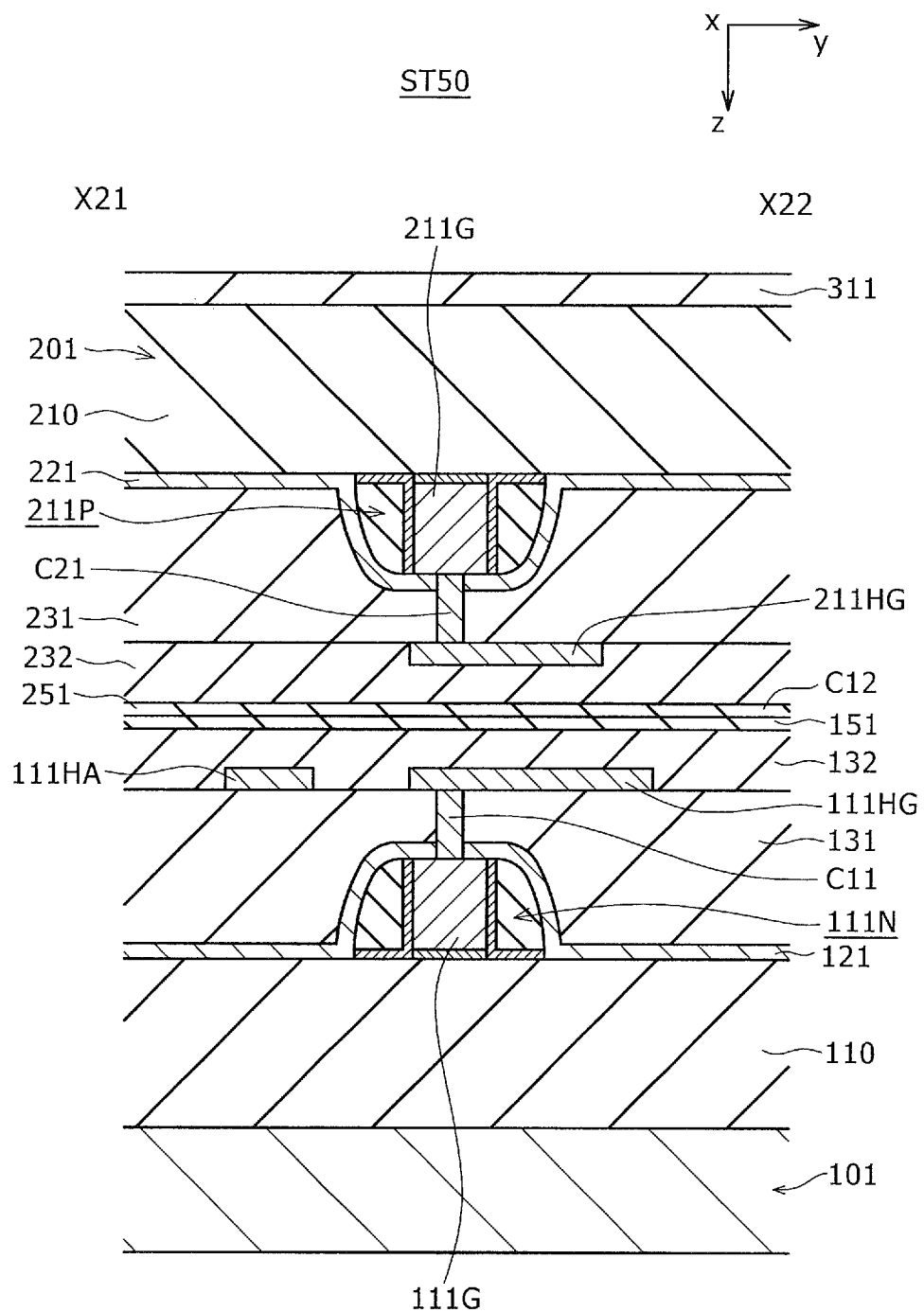
FIGS. 14 to 18 are schematic cross sectional views taken along plane X21-X22 of FIG. 2 and illustrating different stages of an electric connection step of the fabrication method of FIG. 8.

In particular, an insulating layer 311 of the first layer is formed on the upper face of the second substrate 201 on the opposite side to the lower face which is opposed to the first substrate 101 as seen in FIG. 13. At the present step, the insulating layer 311 of the first layer is formed also in a cross section shown in FIG. 4 as seen in FIG. 14. Though not shown, also in the cross section shown in FIG. 5, the insulating layer 311 of the first layer is formed. For example, a silicon oxide film of 10 to 50 nm thick is formed as the insulating layer 311 of the first layer.

Then, holes V12 are formed such that the faces of the conductor layers 111HA and 111HG provided on the first substrate 101 are exposed. Further, at the present state, also in the section shown in FIG. 5, a hole V12 is formed such that the face of the wiring line layer 111HB is exposed. Here, the holes V12 are formed by removing portions at which the holes V12 are to be formed from the laminated body of the first substrate 101 and the second substrate 201. For example, the holes V12 having a bottom side diameter of 30 to 50 nm are formed. Further, the holes V12 are formed such that the aspect ratio thereof may be, for example, 7.5 to 20.

Figure 16:
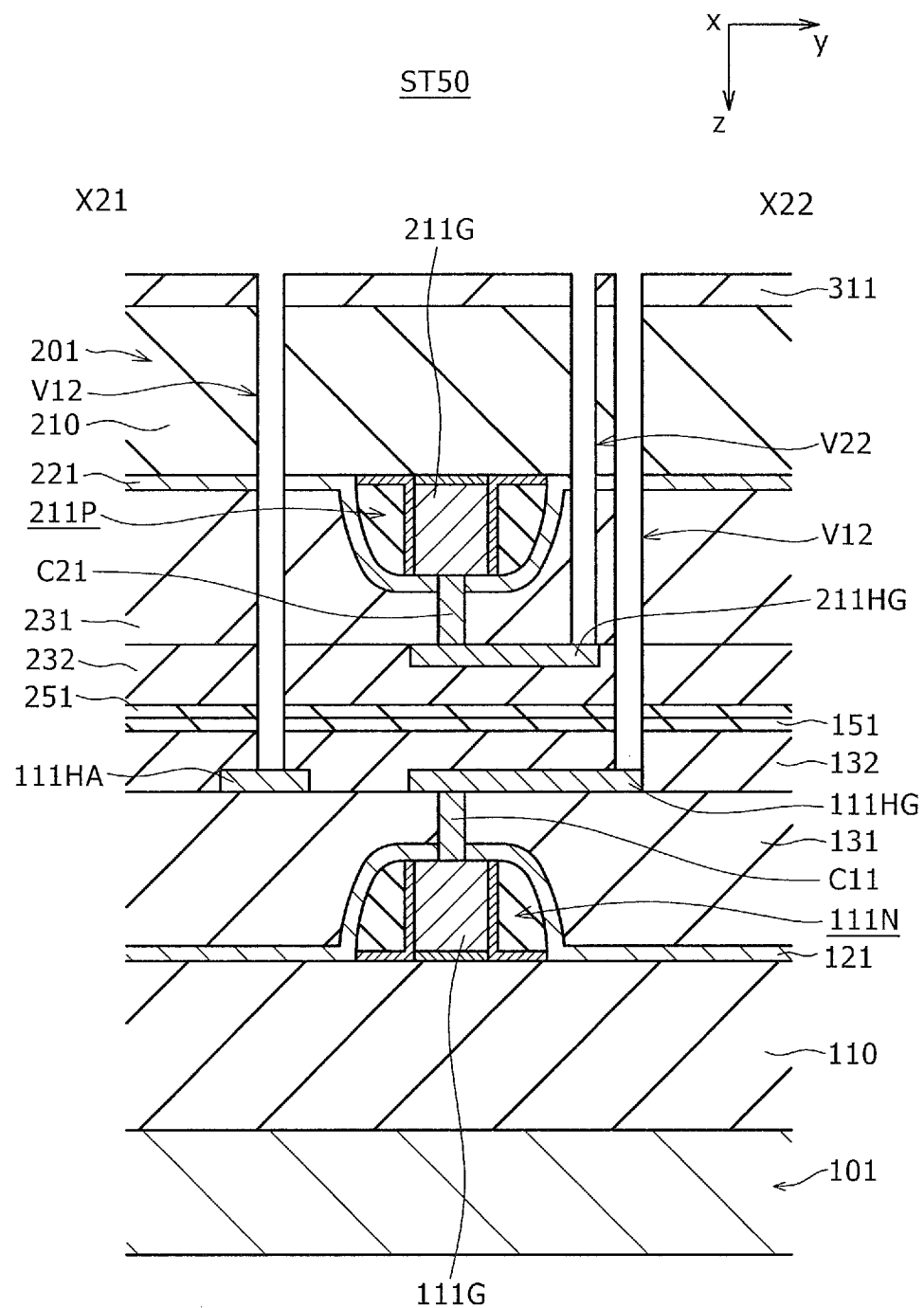

Then, another hole V22 is formed such that an upper face of the wiring line layer 211HG provided on the second substrate 201 is exposed as seen in FIG. 16. At the present step, though not shown in FIG. 16, further holes V22 are formed such that the faces of the wiring line layers 211HA and 211HB may be exposed also in the cross section shown in FIG. 5. Here, the holes V22 are formed by removing portions of the laminated body of the first substrate 101 and the second substrate 201 at which the holes V22 are to be formed using lithography and etching. For example, the holes V22 of a bottom side diameter of 30 to 50 nm are formed. Further, the holes V22 are formed such that the aspect ratio may be, for example, 5 to 13. Preferably, the holes V12 and V22 are formed such that the distances therebetween may be greater than the diameters of the holes V12 and V22.

Figure 17:
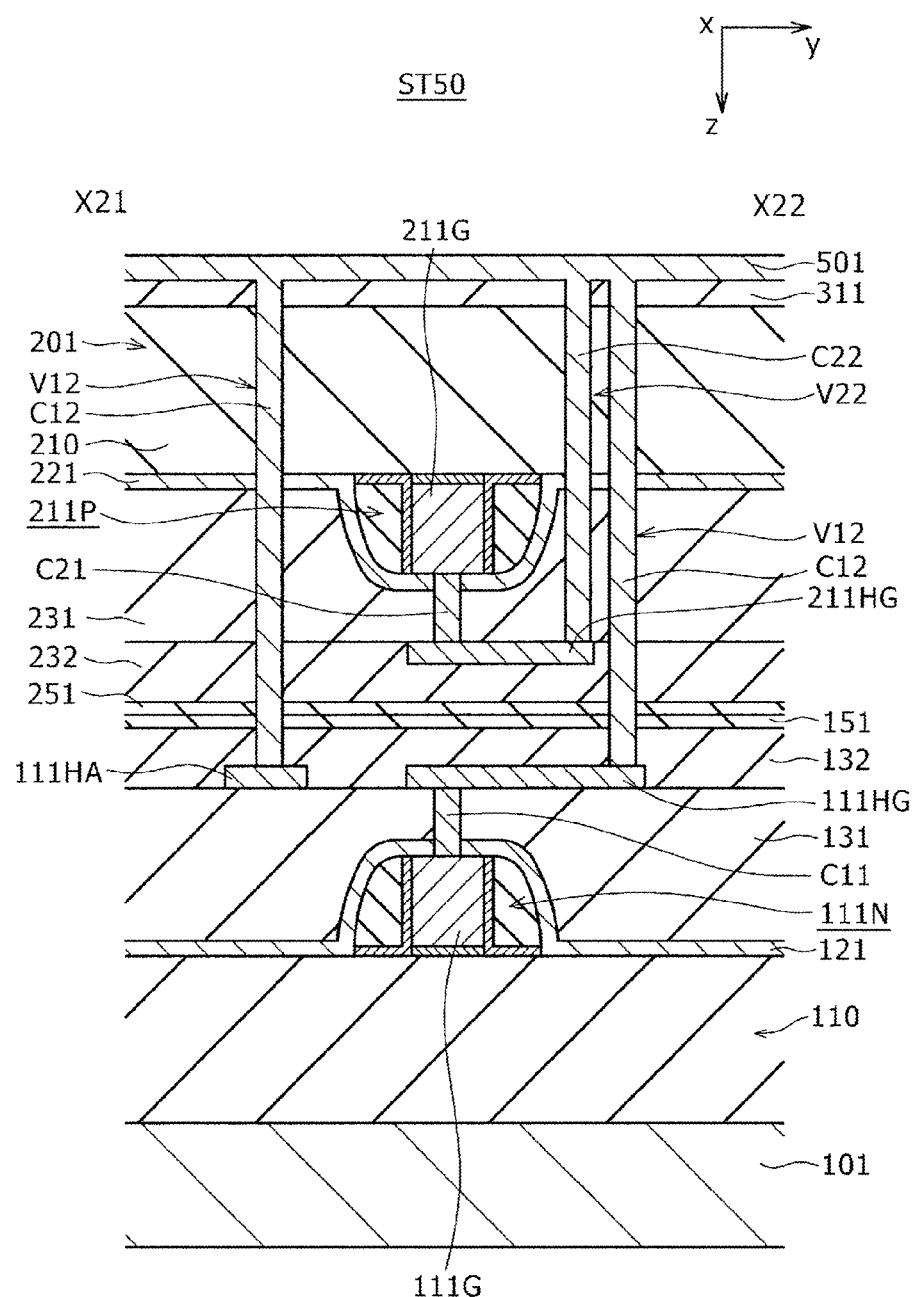

Then, conductive material is filled up into the inside of the holes V12 and V22 to form a metal film 501 on the upper face side of the second substrate 201 as seen in FIG. 17. At the present step, though not shown, the conductive material is filled into the inside of the holes V12 and V22 also on the cross section shown in FIG. 5 to form the metal film 501 on the upper face side of the second substrate 201. The metal film 501 is formed, for example, by providing a barrier metal layer not shown of Ti or TiN and then forming a film of a metal material such as W by CVD.

Contacts are formed by filling the conductive material into the holes V21 and V22 in this manner. It is to be noted that, in the present disclosed technology, from among the contacts, particularly any contact which extends through a substrate is sometimes referred to as "connection via" and any contact which is provided in an interlayer insulating film is sometimes referred to simply as "contact." Also where it is not distinguished whether an object in which a hole is formed is a substrate or an interlayer insulating film, the contact in the hole is referred to as "contact."

Figure 18:
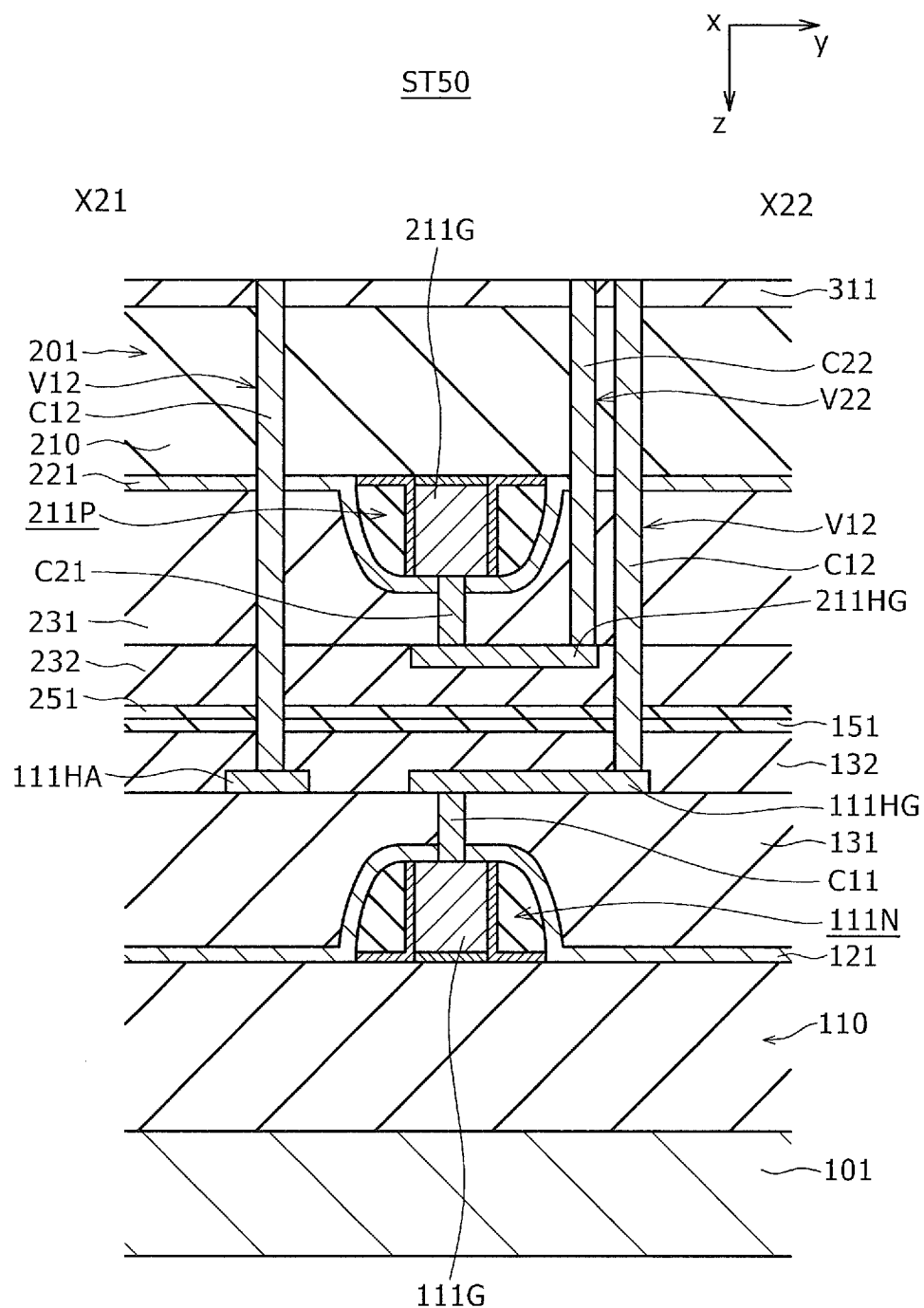

Then, the metal film 501 is removed from the upper face of the insulating layer 311 of the first layer to form contacts C12 and C22 as seen in FIG. 18. At the present step, though not shown, the metal film 501 is removed from the upper face of the insulating layer 311 of the first layer also in the cross section shown in FIG. 5 to form the contacts C12 and C22. For example, CMP is carried out to remove the metal film 501 from the upper face of the insulating layer 311 of the first layer.

Thereafter, the other insulating layers 312 to 316, plural wiring lines such as the wiring line layer 321H and contacts such as the contact 331C which configure the multilayer wiring line layer 310 are formed as seen in FIGS. 3 to 5. The wiring lines such as the wiring line layer 321H are formed from Cu by a damascene technology.

The semiconductor device 1 is completed in this manner.

C. Conclusion

As described above, in the present embodiment, the semiconductor device 1 includes the first substrate 101 on which the n-type MOSFET 111N is provided and the second substrate 201 on which the p-type MOSFET 211P is provided. The first substrate 101 and the second substrate 201 are opposed and bonded to each other. Further, the n-type MOSFET 111N and the p-type MOSFET 211P are electrically connected to each other.

Here, the n-type MOSFET 111N is provided on the face of the first substrate 101 opposed to the second substrate 201. Meanwhile, the p-type MOSFET 211P is provided on the face of the second substrate 201 opposed to the first substrate 101. The n-type MOSFET 111N and the p-type MOSFET 211P are provided in an opposing relationship to each other.

The wiring line layer 321H and so forth are provided on the face of the second substrate 201 on the opposite side to the face opposing to the first substrate 101. The n-type MOSFET 111N and the p-type MOSFET 211P are electrically connected to each other through the wiring line layer 321H and so forth. Further, the semiconductor device 1 includes the contacts C12 and C22 which extend through the second substrate 201 and are electrically connected to the n-type MOSFET 111N. The n-type MOSFET 111N and the p-type MOSFET 211P are electrically connected to each other through the contacts C12 and C22.

In this manner, in the present embodiment, the n-type MOSFET 111N is provided on the first substrate 101, and the p-type MOSFET 211P is provided on the second substrate 201.

Therefore, in the present embodiment, for example, as indicated by a table given below, different MOSFETs can be used for the n-type MOSFET 111N and the p-type MOSFET 211P to improve a characteristic.

TABLE 1

| ITEM | NMOSFET | PMOSFET |
| --- | --- | --- |
| Order | $1^{st}$_Wafer | $2^{nd}$_wafer |
| Substrate | (100) | (110) |
| Crystal direction | <110> | <110> |
| Metal Gate/High-K Structure | Wφ for NFET | φ for PFET |
| S/D Structure | SiC (tensile) | SiGe (compressive) |
| Electrode (for HfON) | TiN (containing Al) | TiN |

In particular, in the present embodiment, substrates having principal surfaces of different plane orientations can be used for the first substrate 101 and the second substrate 201 so that the carrier mobility may be high in both of the n-type MOSFET 111N and the p-type MOSFET 211P. More particularly, the n-type MOSFET 111N can be provided on the (100) plane which is higher in electron mobility than the (110) plane. Meanwhile, the p-type MOSFET 211P can be provided on the (110) plane which is higher in hole mobility than the (100) plane.

Further, in the first substrate 101, the stress liner layer 121 can be formed readily so as to apply tensile stress in order to raise the electron mobility of the n-type MOSFET 111N. Further, in the second substrate 201, the stress liner layer 221 different from the stress liner layer 121 can be formed readily so as to apply compressive force in order to raise the hole mobility of the p-type MOSFET 211P. In other words, the stress liner layers 121 and 221 which are different in stress can be formed readily without using a complicated process.

Further, in order to raise the electron mobility of the n-type MOSFET 111N, it is possible to easily form the paired source-drain regions 111A and 111B using a material which applies tensile force such as SiC. Further, in order to raise the hole mobility of the p-type MOSFET 211P, it is possible to easily form the paired source-drain regions 211A and 211B using a material which applies compressive stress such as SiGe. In other words, the paired source-drain regions 111A and 111B of the n-type MOSFET 111N and the paired source-drain regions 211A and 211B of the p-type MOSFET 211P, which are different in direction of stress, can be formed readily without using a complicated process.

Further, the gate electrode 111G of the n-type MOSFET 111N and the gate electrode 211G of the p-type MOSFET 211P can be formed readily using metal materials which are different in work function from each other. For example, to form the gate electrode 111G of the n-type MOSFET 111N using TiN which contains Al and to form the gate electrode 211G of the p-type MOSFET 211P using TiN which does not contain Al can be carried out readily without using a complicated process.

In this manner, according to the present embodiment, it can be implemented readily to form the n-type MOSFET 111N and the p-type MOSFET 211P such that they individually have preferable characteristics.

Particularly in the present embodiment, the activating annealing process which has an influence on a characteristic of a transistor is carried out separately for the first substrate 101 and the second substrate 201, but is not carried out after they are bonded to each other. Therefore, re-distribution of impurity does not occur, and degradation of a short channel characteristic can be prevented with regard to both of the n-type MOSFET 111N and the p-type MOSFET 211P.

Accordingly, with the present embodiment, enhancement of the fabrication efficiency, reduction of the cost and enhancement of the reliability of the apparatus can be implemented readily.

<2. Embodiment 2>
A. Fabrication Method

Figure 19:
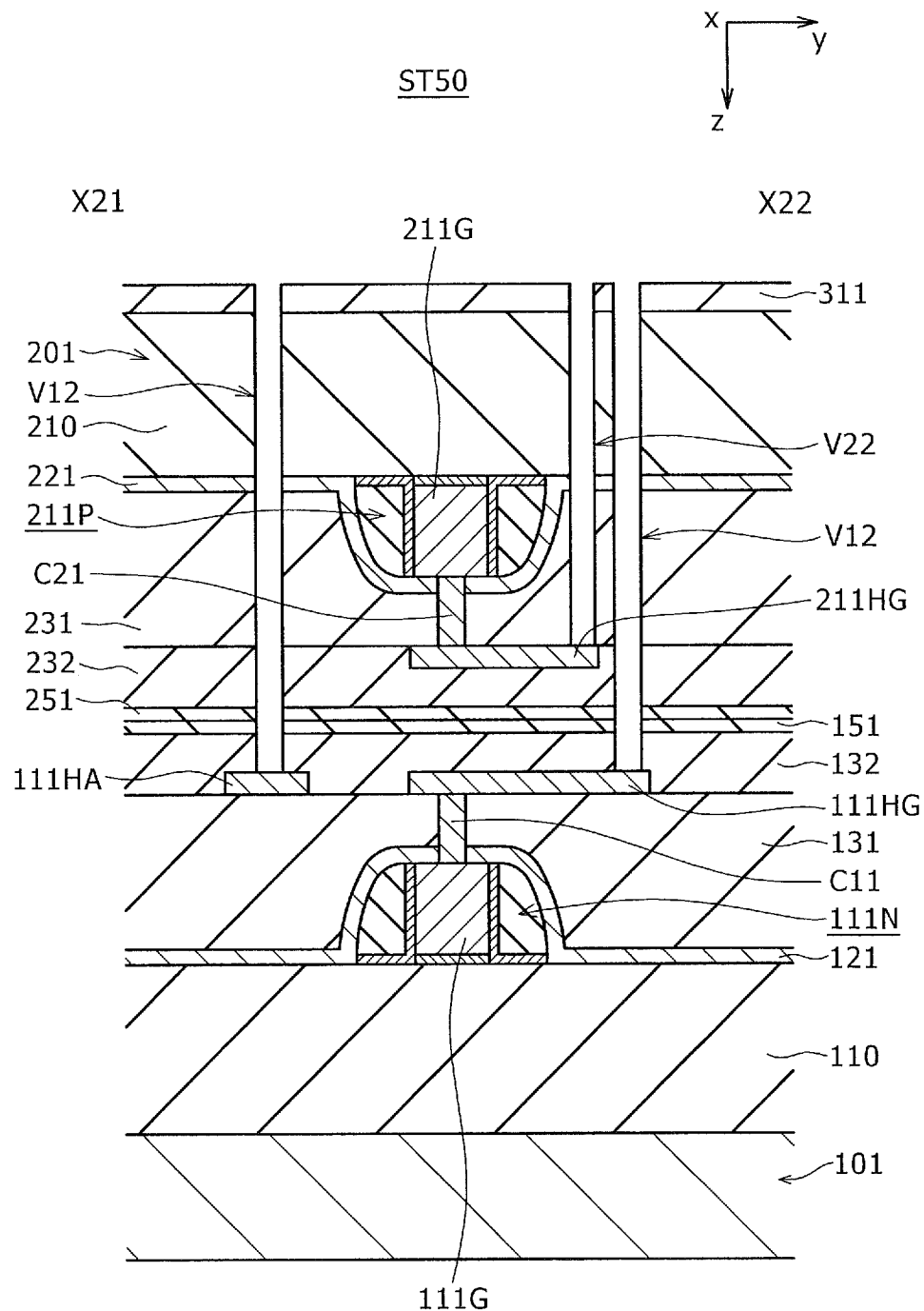
FIG. 19 is a schematic cross sectional view illustrating essential part of a fabrication method of a semiconductor device according to an embodiment 2.

FIG. 19 illustrates essential part of a fabrication method of a semiconductor device according to an embodiment 2.

FIG. 19 shows a cross section taken along plane X21-X22 of FIG. 2 similarly to FIG. 4. FIG. 19 illustrates steps after the step illustrated in FIG. 14 in regard to the embodiment 1.

Figure 15:
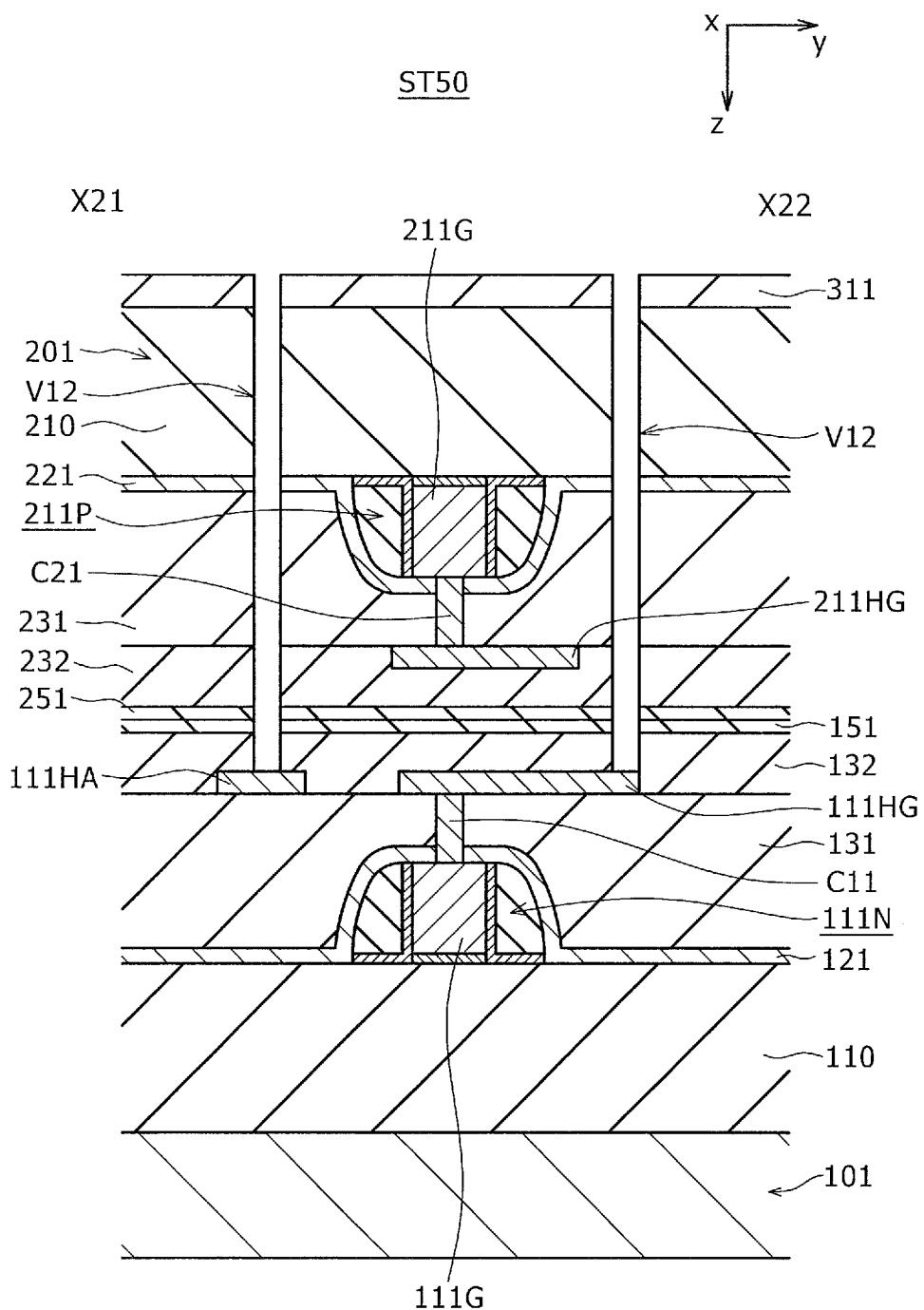

After the steps illustrated in FIG. 14 in the embodiment 1, processes illustrated in FIG. 19 are carried out without carrying out the step illustrated in FIG. 15. The present embodiment is similar to the embodiment 1 except the matter just described and associated matters. Therefore, in the description of the present embodiment, description of overlapping matters with the matters in the embodiment 1 is suitably omitted herein to avoid redundancy.

Also in the present embodiment, similarly as in the embodiment 1, an insulating layer 311 of the first layer is formed as seen in FIG. 14.

Thereafter, holes V12 are formed such that the faces of the wiring line layers 111HA and 111HG provided on a first substrate 101 may be exposed as seen in FIG. 19. Simultaneously, a hole V22 is formed such that the upper face of a wiring line layer 211HG provided on a second substrate 201 may be exposed. At the present step, though not shown, a hole V12 is formed such that the face of a wiring line layer 111HB may be exposed also in the cross section shown in FIG. 5. Simultaneously, holes V22 are formed such that the faces of wiring line layers 211HA and 211HB may be exposed.

In this manner, in the present embodiment, the holes V12 and V22 of different aspect ratios are not formed by different steps but formed collectively by the same step.

Here, a lithography technique and an etching technique are used to remove portions of the layered body of the first substrate 101 and the second substrate 201 at which the holes V12 and V22 are to be formed. In particular, a dry etching process is carried out in a condition that the portions to be removed by the dry etching process and the other portions to be left like the wiring line layers such as the wiring line layer 111HA exhibit a high etching selection ratio to form the holes V12 and V22.

Or, in order to simultaneously form the holes V12 and V22 of different aspect ratios, selection of different materials for or adjustment in thickness between the wiring line layers provided on the first substrate 101 such as the wiring line layer 111HA and the wiring line layers provided on the second substrate 201 such as the wiring line layer 211HA may be carried out.

Thereafter, similar steps to those in the embodiment 1 are applied (refer to FIGS. 17, 18 and 3 to 5) to complete the semiconductor device 1.

B. Conclusion

As described above, in the present embodiment, the n-type MOSFET 111N is provided on the first substrate 101 and the p-type MOSFET 211P is provided on the other second substrate 201 similarly as in the embodiment 1. Further, the first substrate 101 and the second substrate 201 are bonded to each other to electrically connect the n-type MOSFET 111N and the p-type MOSFET 211P to each other.

Accordingly, also with the present embodiment, enhancement of the fabrication efficiency, reduction of the cost and enhancement of the reliability of the apparatus can be implemented readily similarly as in the embodiment 1.

It is to be noted that, in the present embodiment, the holes V12 and V22 of different aspect ratios are formed collectively and simultaneously at the same step without forming them at different steps. Therefore, the fabrication efficiency can be enhanced further preferably.

<3. Embodiment 3>
A. Device Configuration

Figure 20:
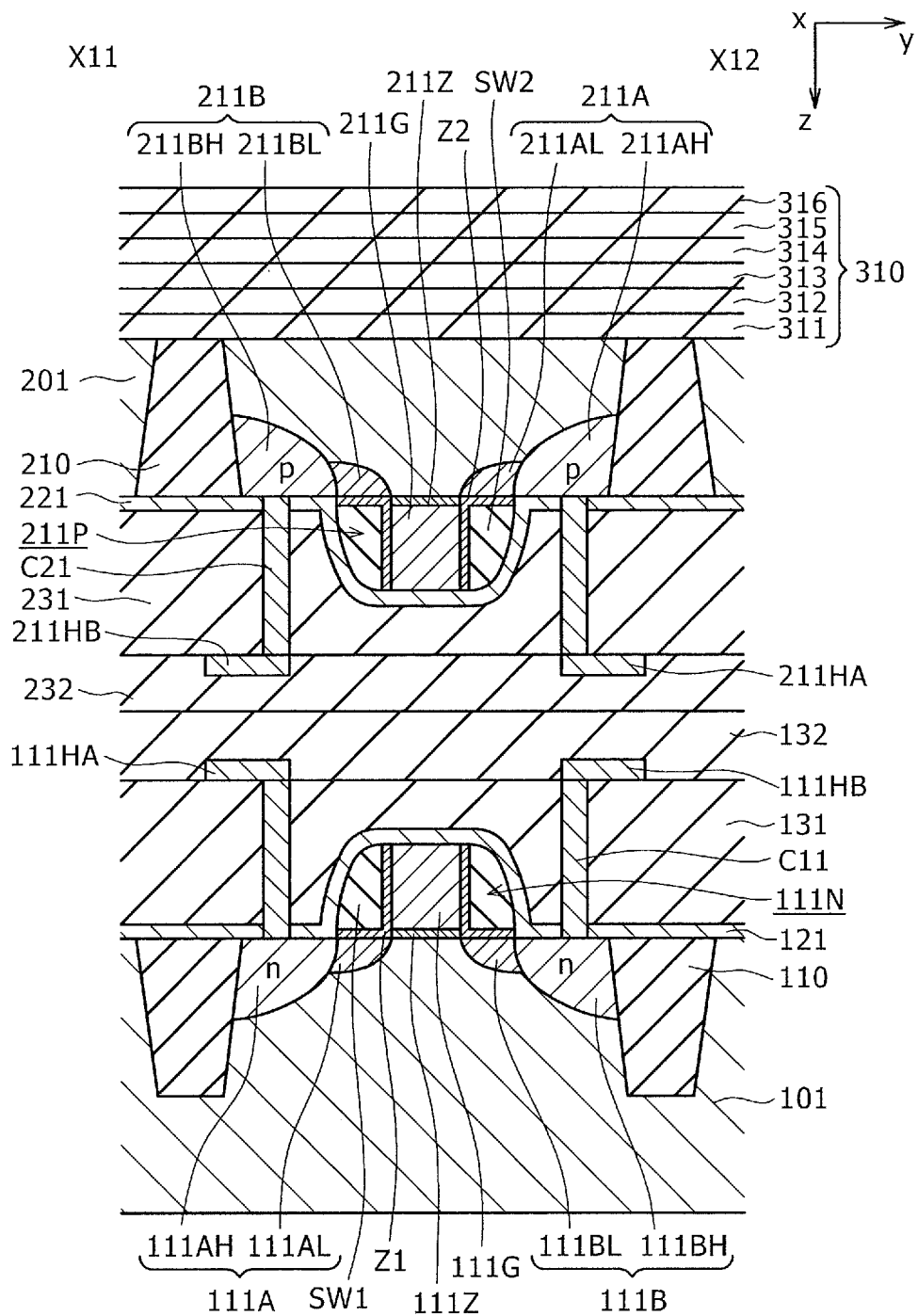
FIG. 20 is a schematic cross sectional view taken along plane X11-X12 of FIG. 2 but showing part of a semiconductor device according to an embodiment 3.

FIG. 20 shows essential part of a semiconductor device according to an embodiment 3.

Particularly, FIG. 20 shows a cross section taken along plane X11-X12 of FIG. 2 similarly to FIG. 3.

In the present embodiment, the interlayer insulating films 151 and 251 (refer to FIG. 3) are not provided as seen in FIG. 20. The present embodiment is similar to the embodiment 1 except this matter and an associated matter. Therefore, in the description of the present embodiment, description of overlapping matters with the matters in the embodiment 1 is suitably omitted herein to avoid redundancy.

As seen in FIG. 20, a face of a first substrate 101 on which an n-type MOSFET 111N is provided and a face of a second substrate 201 on which a p-type MOSFET 211P is provided are opposed to each other.

Here, an interlayer insulating film 132 provided on the first substrate 101 and an interlayer insulating film 232 provided on the second substrate 201 are disposed such that they are opposed to and contact directly with each other. Further, the interlayer insulating film 132 provided on the first substrate 101 and the interlayer insulating film 232 provided on the second substrate 201 are joined together.

In the present embodiment, the interlayer insulating films 132 and 232 are formed using a low dielectric constant or low-k material having a lower dielectric constant than that of silicon oxide.

B. Fabrication Method

Figure 21:
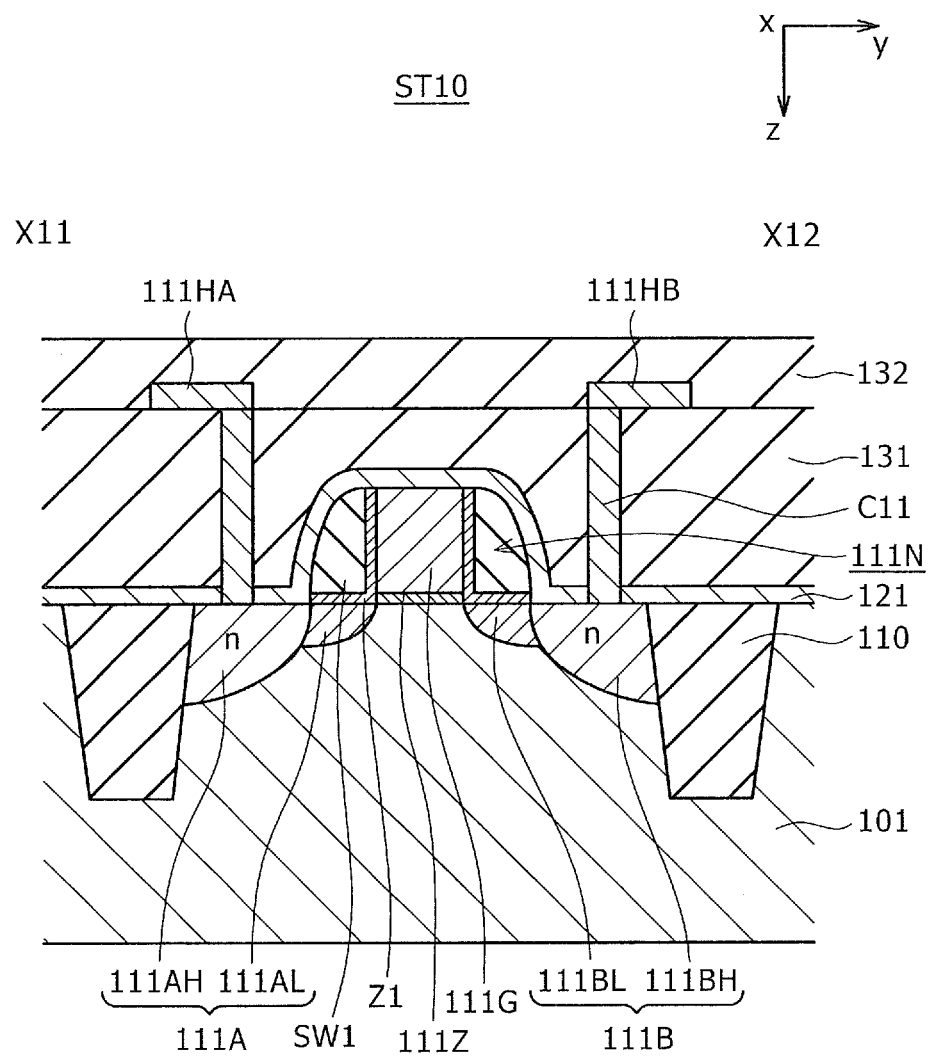
FIGS. 21 to 23 are schematic cross sectional views illustrating different steps of a fabrication method of the semiconductor device of FIG. 20.
Figure 22:
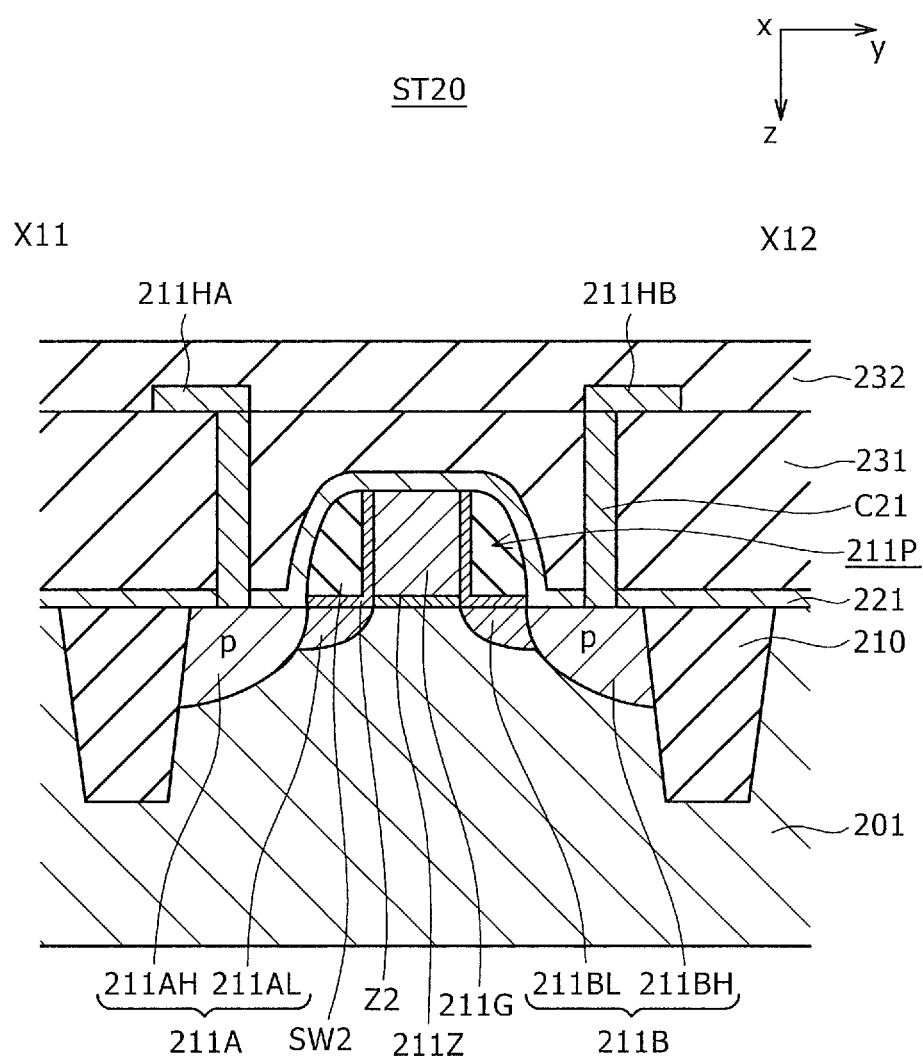
Figure 23:
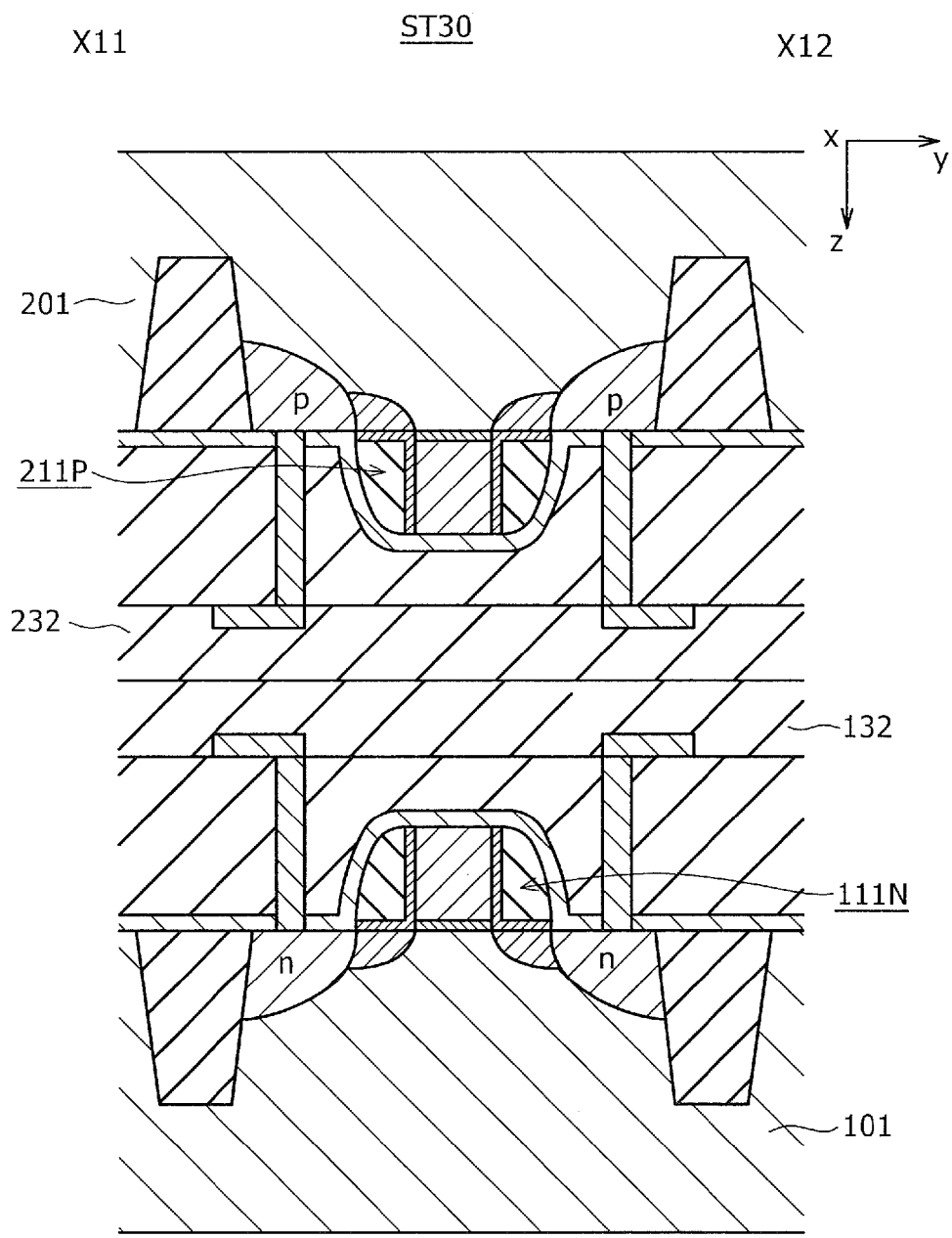

FIGS. 21 to 23 illustrate essential part of a fabrication method of the semiconductor device according to the embodiment 3.

Particularly, FIGS. 21 to 23 are sectional views similarly to FIG. 20. More particularly, FIG. 21 shows a cross section formed at step ST10 illustrated in FIG. 8. FIG. 22 shows a cross section formed at step ST20 illustrated in FIG. 8. FIG. 23 shows a cross section formed at step ST30 illustrated in FIG. 8.

B-1. Formation of the n-Type MOSFET 111N on the First Substrate 101

First, an n-type MOSFET 111N is formed on a first substrate 101 as illustrated in FIG. 8 (step ST10).

Here, the n-type MOSFET 111N is formed in a region of the upper face of the first substrate 101 partitioned by a device isolation layer 110 in a similar manner as in the embodiment 1.

Then, after the formation of the n-type MOSFET 111N, a stress liner layer 121, a flattening film 131 and a plurality of wiring line layers 111HA and 111HB (111HG, refer to FIG. 4) are successively provided similarly as in the embodiment 1.

Thereafter, an interlayer insulating film 132 is provided. In the present embodiment, the interlayer insulating film 151 of the second layer shown in FIG. 9 is not provided.

In the present embodiment, the interlayer insulating film 132 is formed using a low dielectric constant or low-k material.

For example, such a material as SiOC, SiOCH, SiOF or HSQ is used to form the interlayer insulating film 132. Further, a porous film of such materials may be formed as the interlayer insulating film 132. Or, the interlayer insulating film 132 may be formed using an organic film.

B-2. Formation of the p-Type MOSFET 211P on the Second Substrate 201

Then, a p-type MOSFET 211P is formed on a second substrate 201 as shown in FIG. 8 (step ST20).

Here, as seen in FIG. 22, the p-type MOSFET 211P is formed in a region of the upper face of the second substrate 201 partitioned by a device isolation layer 210 similarly as in the embodiment 1.

After the p-type MOSFET 211P is formed, a stress liner layer 221, a flattening film 231 and a plurality of wiring line layers 211HA and 211HB (211HG, refer to FIG. 4) are successively provided similarly as in the case of the embodiment 1.

Figure 10:
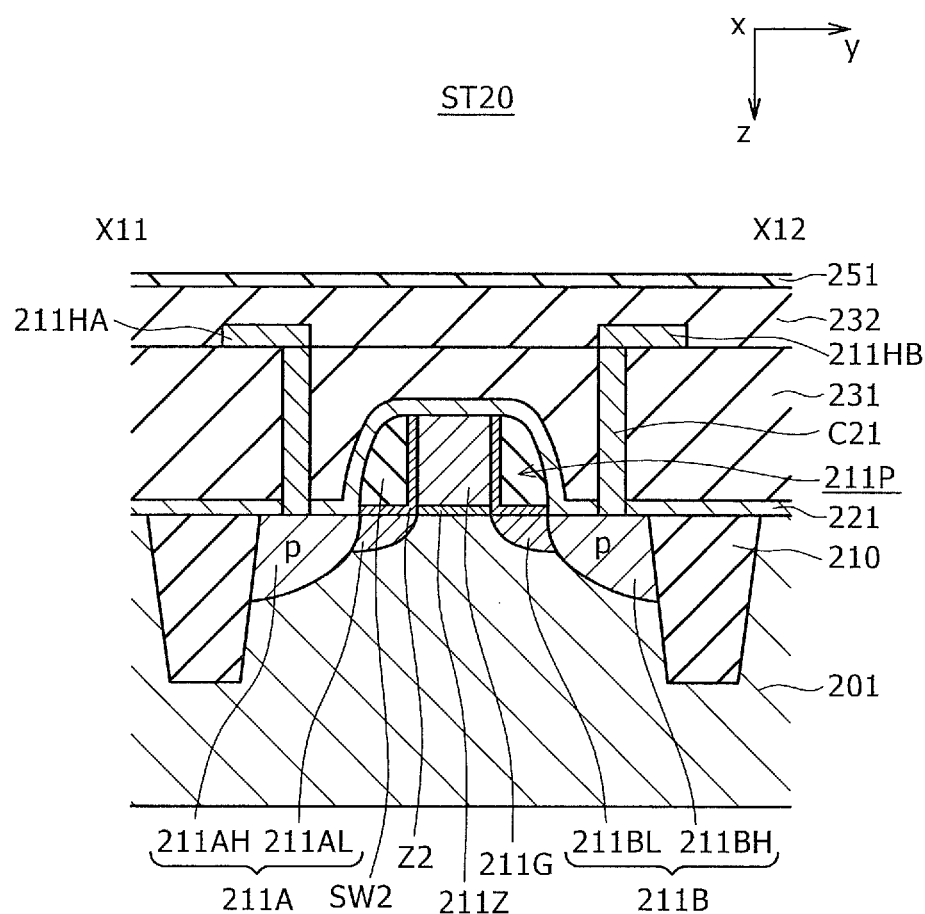

Thereafter, an interlayer insulating film 232 is provided. In the present embodiment, the interlayer insulating film 251 of the second layer shown in FIG. 10 is not provided.

In the present embodiment, the interlayer insulating film 232 is formed using a low dielectric constant or low-k material.

For example, a material similar to that used for the interlayer insulating film 132 provided in the first substrate 101 is used to form the interlayer insulating film 232. It is to be noted that the interlayer insulating film 232 may be formed using a material different from that used for the interlayer insulating film 132 provided on the first substrate 101.

B-3. Bonding of the First Substrate 101 and the Second Substrate 201

Then, the first substrate 101 and the second substrate 201 are bonded to each other as illustrated in FIG. 8 (step ST30).

Here, the first substrate 101 and the second substrate 201 are opposed and bonded to each other as seen in FIG. 23.

In particular, the face of the first substrate 101 on which the n-type MOSFET 111N is provided and the face of the second substrate 201 on which the p-type MOSFET 211P is provided are opposed to each other. In other words, the second substrate 201 is inverted and opposed to the first substrate 101.

Then, the interlayer insulating film 132 provided on the first substrate 101 and the interlayer insulating film 232 provided on the second substrate 201 are contacted with and joined to each other.

For example, the interlayer insulating film 132 and the interlayer insulating film 232 are joined together and bonded to each other by plasma joining. It is to be noted that, if the material itself which configures the interlayer insulating films 132 and 232 does not include the —OH group, then a plasma process in which $H_2O$, $H_2$ or the like is used is carried out for the interlayer insulating films 132 and 232 to introduce the —OH group into the surface, whereafter the joining is carried out. In other words, the interlayer insulating films 132 and 232 are processed so that a surface state in which a dehydration condensation process can be carried out upon plasma joining is obtained.

B-4. Other Steps

Thereafter, the second substrate 201 is thinned similarly as in the embodiment 1 as seen in FIG. 8 (step ST40).

Then, the n-type MOSFET 111N and the p-type MOSFET 211P are electrically connected to each other as seen in FIG. 8 similarly as in the case of the embodiment 1 (step ST50). Here, holes V12 and V22 of different aspect ratios may be formed at the same time as in the case of the embodiment 2.

In this manner, the semiconductor device 1 is completed as seen in FIG. 20.

C. Conclusion

As described above, in the present embodiment, the n-type MOSFET 111N is provided on the first substrate 101 and the p-type MOSFET 211P is provided on the second substrate 201 similarly as in the other embodiments. Then, the first substrate 101 and the second substrate 201 are bonded to each other to electrically connect the n-type MOSFET 111N and the p-type MOSFET 211P to each other.

Accordingly, also with the present embodiment, enhancement of the fabrication efficiency, reduction of the cost and enhancement of the reliability of the apparatus can be implemented readily similarly as in the embodiment 1.

Particularly in the present embodiment, the first substrate 101 and the second substrate 201 are bonded to each other by joining between the interlayer insulating films 132 and 232 which are formed from a Low-K material having a dielectric constant lower than that of silicon oxide.

Therefore, in the present embodiment, the coupling capacitance between the plural wiring line layers such as the wiring line layer 111HA provided on the first substrate 101 and the plural wiring line layers such as the wiring line layer 211HA provided on the second substrate 201 can be reduced. Consequently, the reliability of the device can be further improved.

<4. Embodiment 4>

A. Device Configuration

Figure 24:
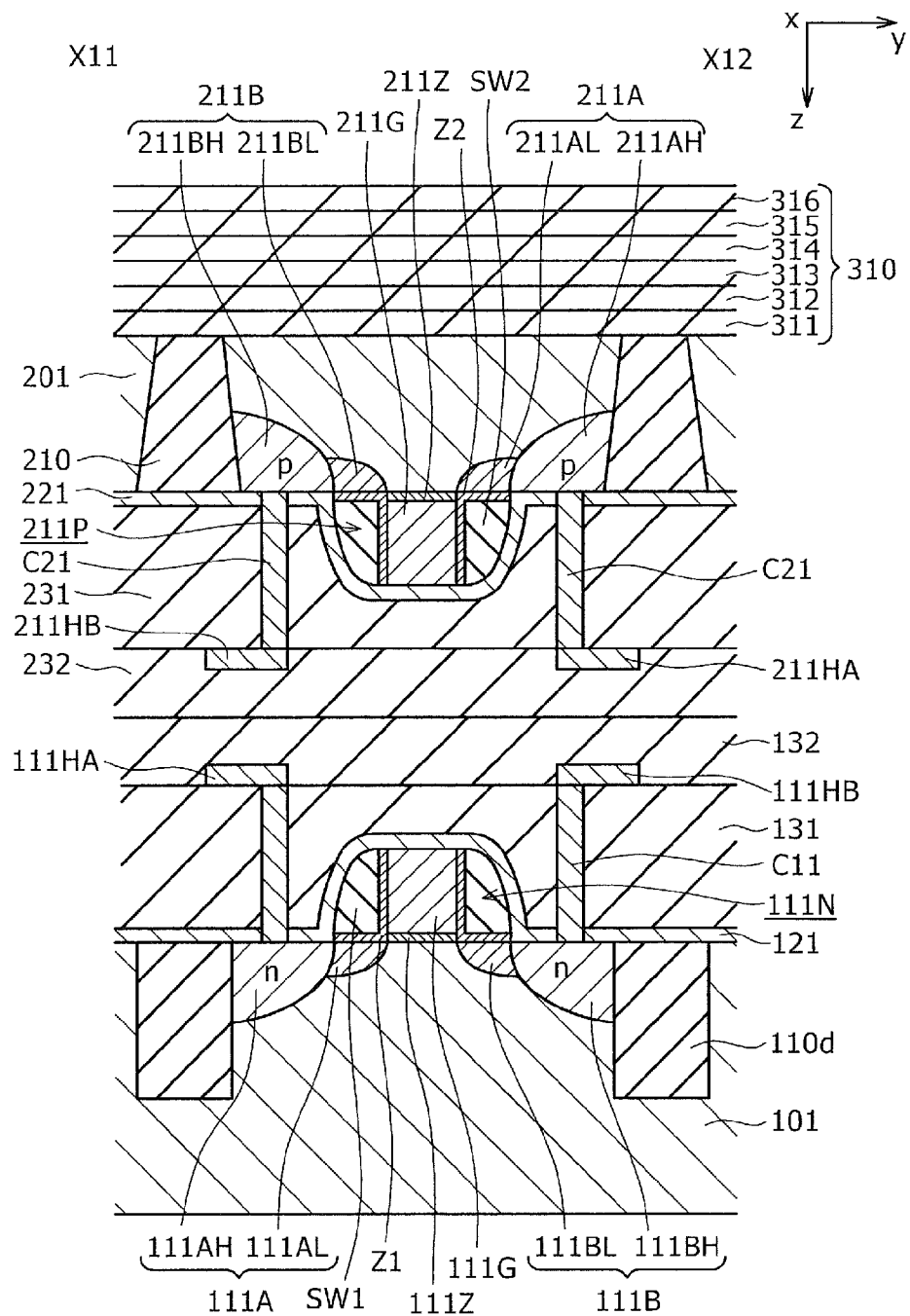
FIG. 24 is a schematic cross sectional view taken along plane X11-X12 of FIG. 2 but showing essential part of a semiconductor device according to an embodiment 4.

FIG. 24 shows essential part of a semiconductor device according to an embodiment 4.

Particularly, FIG. 24 shows a cross section taken along plane X11-X12 of FIG. 2 similarly to FIG. 20.

In the present embodiment, a device isolation layer 110d is different from that in the embodiment 3 as seen in FIG. 24. The present embodiment is different from the embodiment 3 except this manner and an associated matter. Therefore, in the description of the present embodiment, description of overlapping matters with the matters in the embodiment 3 is suitably omitted herein to avoid redundancy.

As seen in FIG. 24, in the present embodiment, the device isolation layer 110d is formed from an impurity diffusion layer formed by doping impurity into the first substrate 101.

B. Conclusion

As described above, in the present embodiment, the n-type MOSFET 111N is provided on the first substrate 101 and the p-type MOSFET 211P is provided on the second substrate 201 similarly as in the other embodiments. Then, the first substrate 101 and the second substrate 201 are bonded to each other to electrically connect the n-type MOSFET 111N and the p-type MOSFET 211P to each other.

Accordingly, also with the present embodiment, enhancement of the fabrication efficiency, reduction of the cost and enhancement of the reliability of the apparatus can be implemented readily similarly as in the other embodiments.

Particularly, in the present embodiment, the device isolation layer 110 is not a STI structure, but is formed from an impurity diffusion layer formed by doping an impurity into the first substrate 101. Therefore, since the device isolation layer 110d can be formed by a simple and easy process, the fabrication efficiency can be further improved. It is to be noted that the second substrate 201 is preferably formed from an insulator having a STI structure or a like structure because the contacts C12 and C22 extend through the second substrate 201.

<5. Embodiment 5>
A. Device Configuration

Figure 25:
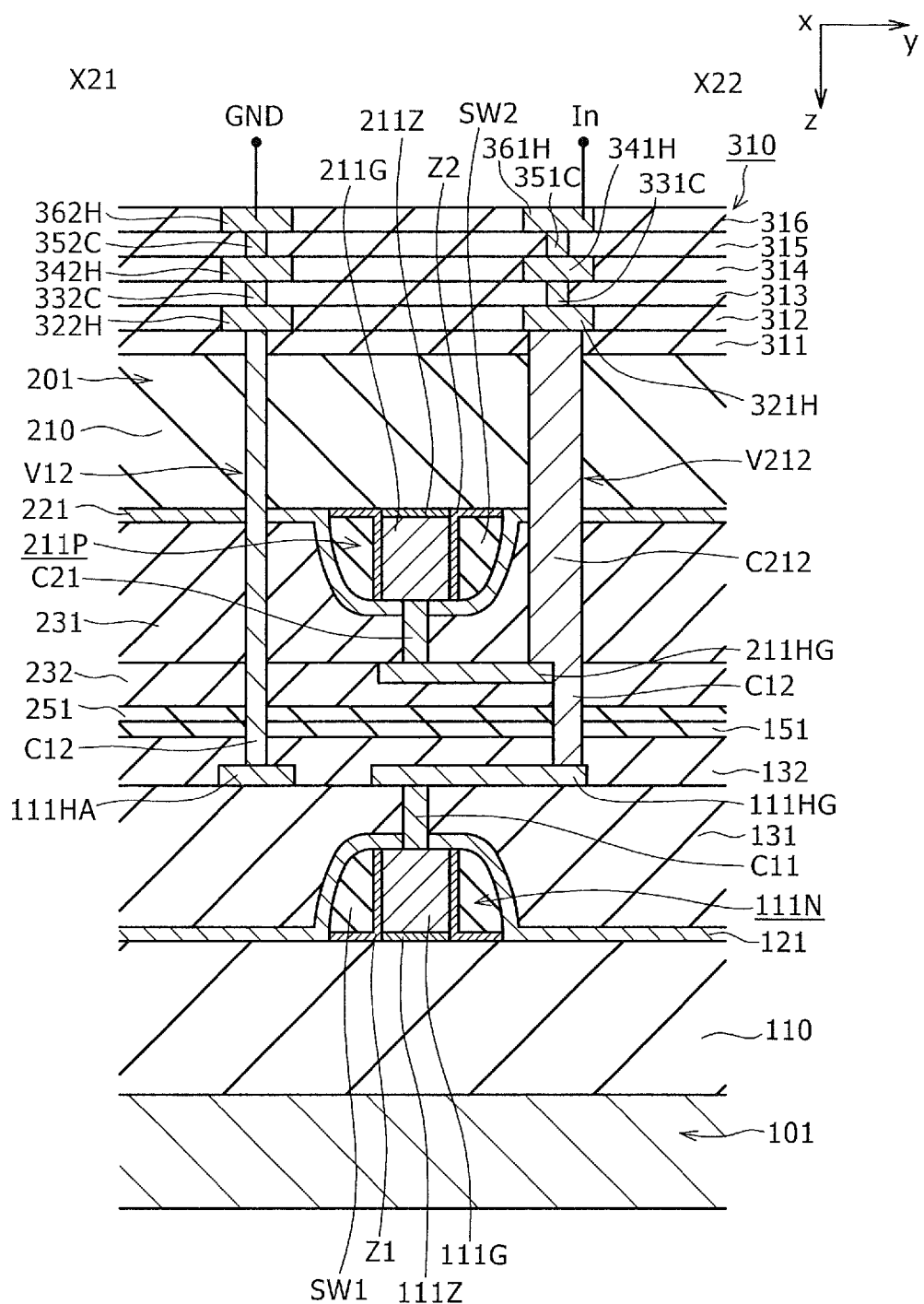
FIG. 25 is a schematic cross sectional view taken along plane X11-X12 of FIG. 2 but showing essential part of a semiconductor device according to an embodiment 5.
Figure 26:
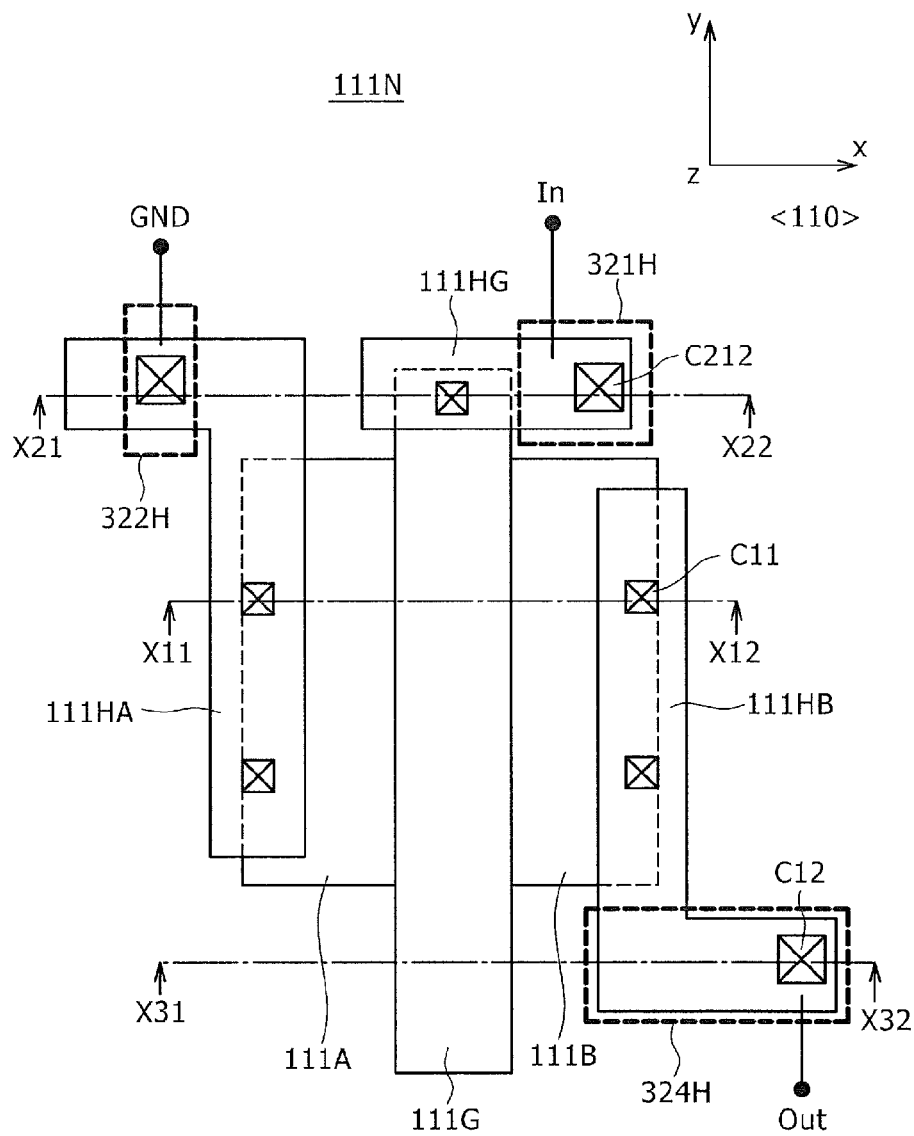
FIG. 26 is a schematic cross sectional view showing essential part of an n-type MOSFET of the semiconductor device of FIG. 25.
Figure 27:
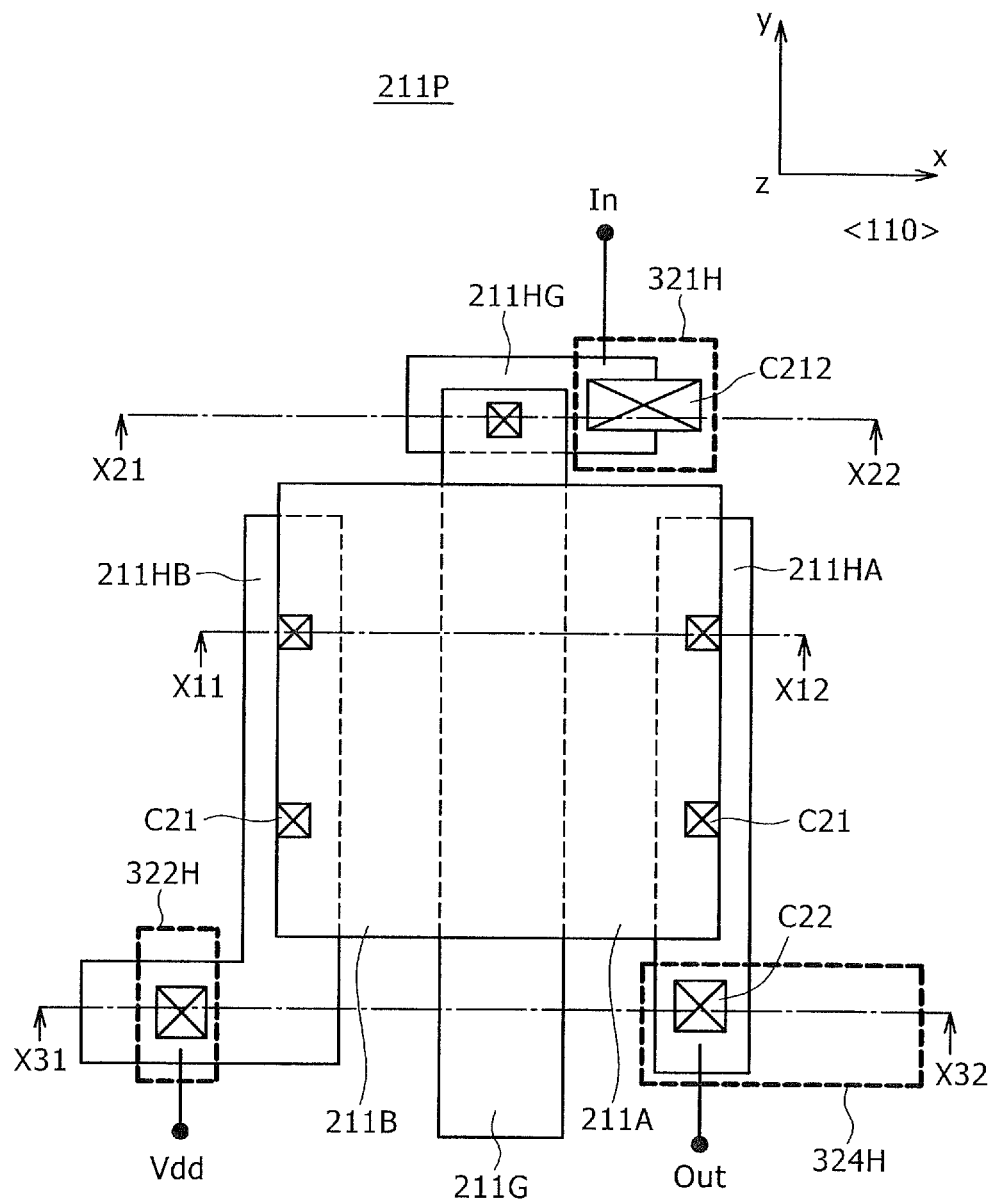
FIG. 27 is a schematic cross sectional view showing essential part of a p-type MOSFET of the semiconductor device of FIG. 25.

FIGS. 25 to 27 show essential part of a semiconductor device according to an embodiment 5.

Particularly, FIG. 25 shows a cross section taken along plane X11-X12 of FIG. 2 similarly to FIG. 3.

Further, FIG. 26 shows essential part of an n-type MOSFET which configures part of the semiconductor device similarly to FIG. 6. FIG. 27 shows essential part of a p-type MOSFET which configures part of the semiconductor device similarly to FIG. 7. FIGS. 26 and 27 show the MOSFETs in top plan.

In the present embodiment, as seen in FIGS. 25 to 27, the shape of a contact C212 connecting to a wiring line layer 321H provided on an upper face of an insulating layer 311 of the first layer in a multilayer wiring line layer 310 is different from that in the embodiment 1. The present embodiment is similar to the embodiment 1 except the matter just described and associated matters. Therefore, in the description of the present embodiment, description of overlapping matters with the matters in the embodiment 1 is suitably omitted herein to avoid redundancy.

Referring to FIGS. 25 to 27, the contact C212 is provided so as to connect to the wiring line layer 321H provided on an upper face of the insulating layer 311 of the first layer in the multilayer wiring line layer 310.

This contact C212 is provided so as to be electrically connected to both of the wiring line layer 111HG provided on the first substrate 101 and the wiring line layer 211HG provided on the second substrate 201. In other words, the contact C212 forms a share via.

In formation of the contact C212, a hole V212 is formed first such that the upper faces of both of the wiring line layer 111HG provided on the first substrate 101 and the wiring line layer 211HG provided on the second substrate 201 may be exposed. Thereafter, the hole V212 is filled up with a conductive material to form the contact C212.

B. Conclusion

As described above, in the present embodiment, the n-type MOSFET 111N is provided on the first substrate 101 and the p-type MOSFET 211P is provided on the second substrate 201 similarly as in the other embodiments. Then, the first substrate 101 and the second substrate 201 are bonded to each other to electrically connect the n-type MOSFET 111N and the p-type MOSFET 211P to each other.

Accordingly, also with the present embodiment, enhancement of the fabrication efficiency, reduction of the cost and enhancement of the reliability of the apparatus can be implemented readily similarly as in the embodiment 1.

Particularly, in the present embodiment, the contact C212 which electrically connects to both of the wiring line layer 111HG provided on the first substrate 101 and the wiring line layer 211HG provided on the second substrate 201 to each other is provided. Therefore, the area occupied by the semiconductor device can be reduced.

<6. Embodiment 6>
A. Device Configuration

Figure 28:
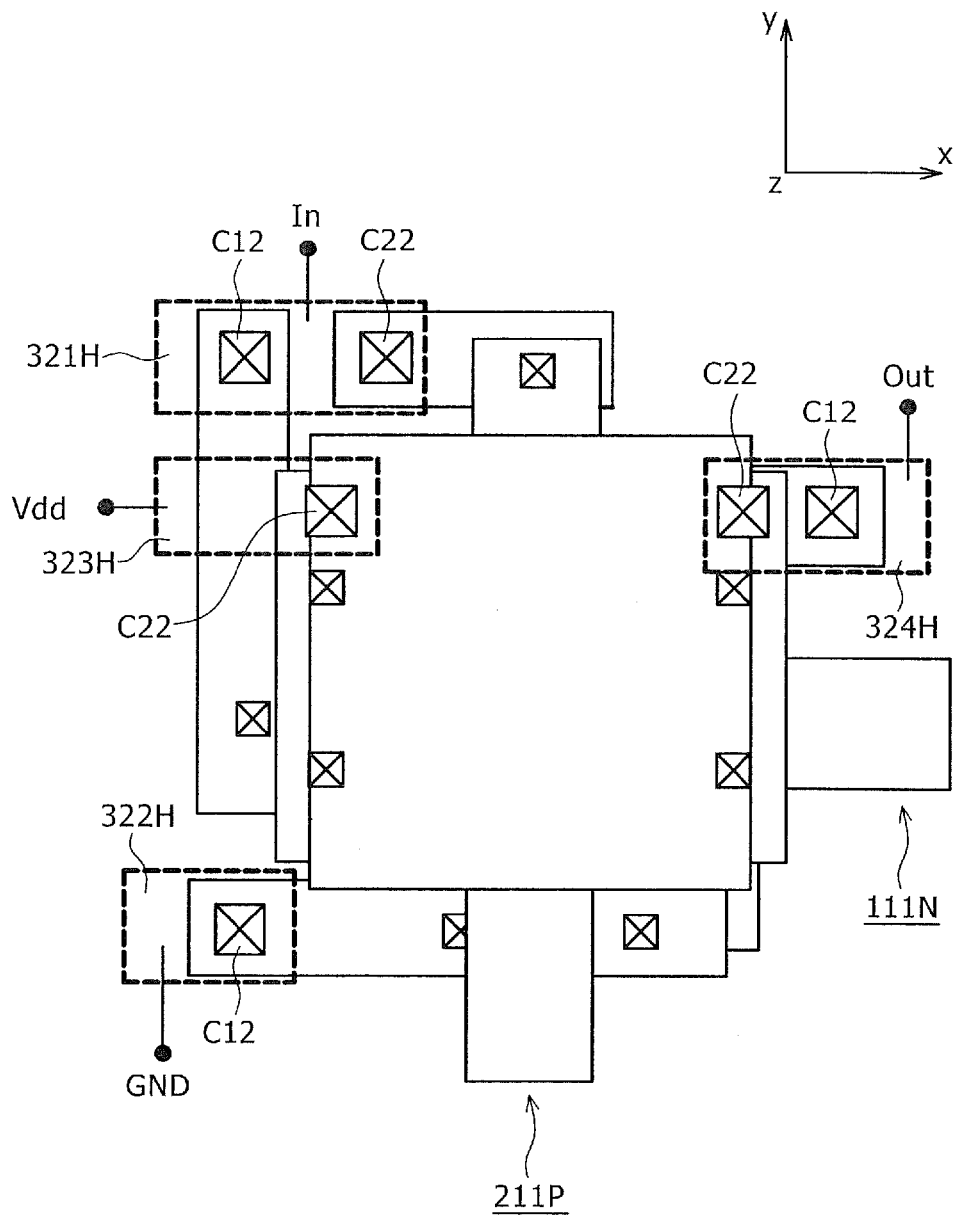
FIG. 28 is a schematic top plan view of a semiconductor device according to an embodiment 6.
Figure 29:
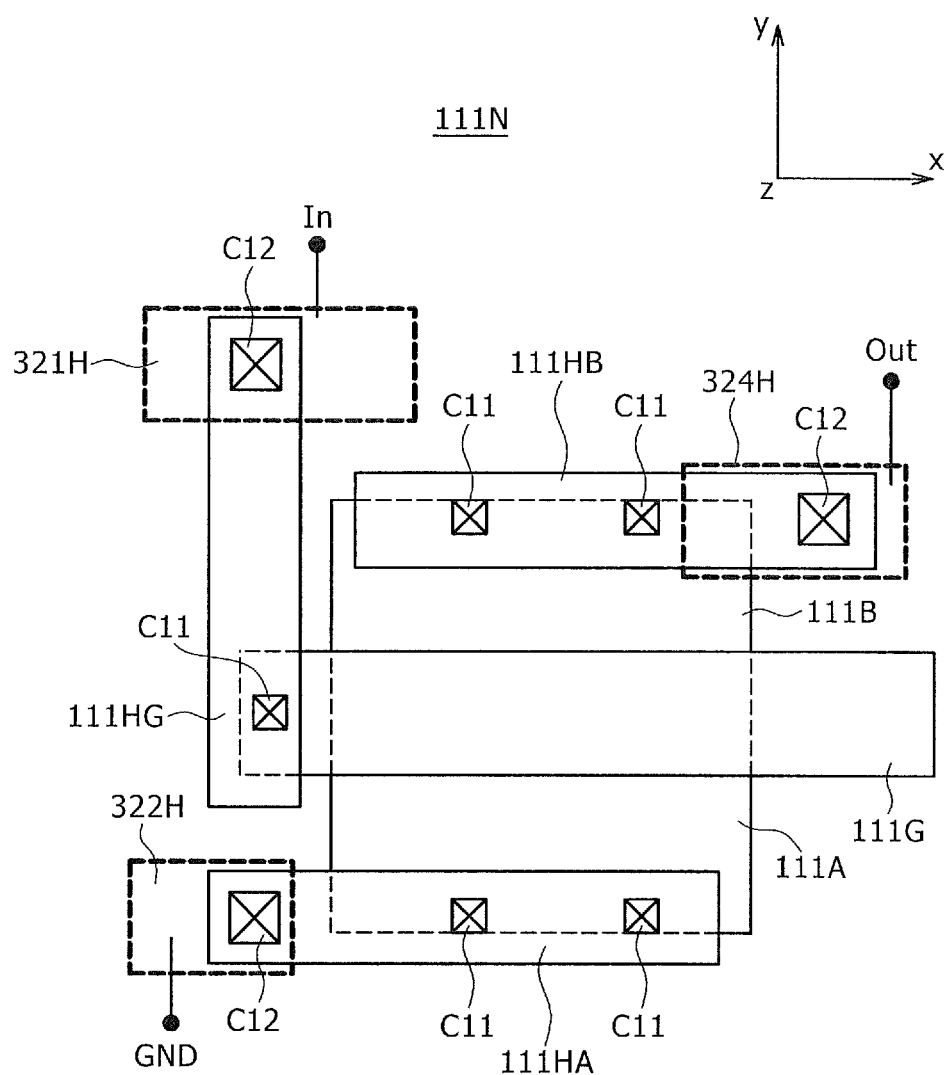
FIG. 29 is a schematic cross sectional view showing essential part of an n-type MOSFET of the semiconductor device of FIG. 28.
Figure 30:
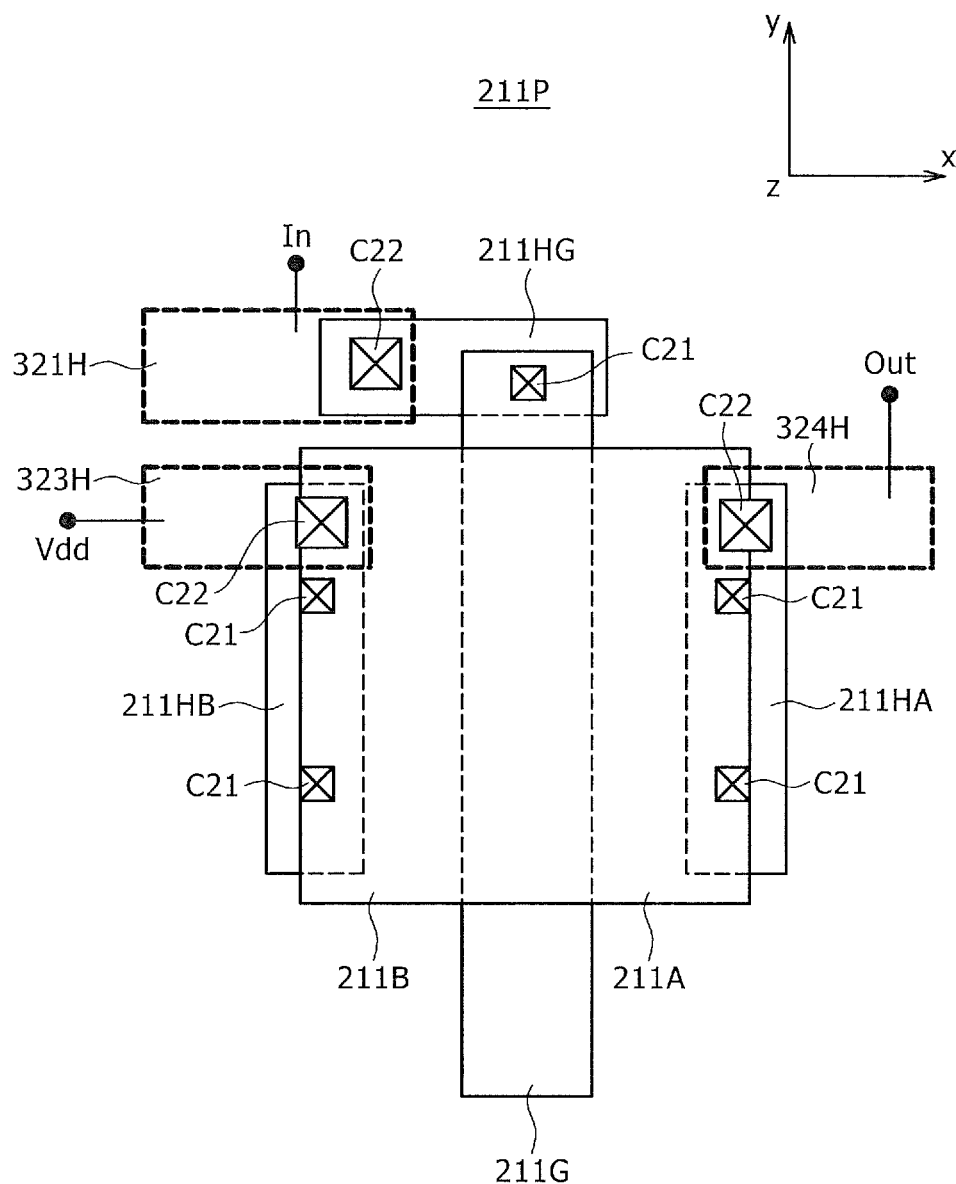
FIG. 30 is a schematic cross sectional view showing essential part of a p-type MOSFET of the semiconductor device of FIG. 28.

FIGS. 28 to 30 show essential part of a semiconductor device according to an embodiment 6.

Particularly, FIG. 28 shows a top plan of the semiconductor device.

FIG. 29 shows essential part of an n-type MOSFET which configures part of the semiconductor device similarly to FIG. 6.

FIG. 30 shows essential part of a p-type MOSFET which configures part of the semiconductor device similarly to FIG. 7.

FIGS. 29 and 30 show top plans similarly to FIGS. 6 and 7, and in FIGS. 29 and 30, profiles of portions of members in lower layers covered with upper layers are indicated by thin broken lines. Further, some of a plurality of wiring lines which configure the multilayer wiring line layer 310, that is, those wiring lines at the lowermost portion, above the n-type MOSFET 111N and the p-type MOSFET 211P are indicated by thick broken lines. A disposition relationship between the n-type MOSFET shown in FIG. 29 and the p-type MOSFET shown in FIG. 30 is shown in FIG. 28.

In the present embodiment, as seen in FIGS. 28 to 30, the n-type MOSFET 111N and the p-type MOSFET 211P are different in configuration from those in the embodiment 1. The present embodiment is similar to the embodiment 1 except the matter just described and associated matters. Therefore, in the description of the present embodiment, description of overlapping matters with the matters in the embodiment 1 is suitably omitted herein to avoid redundancy.

Referring to FIGS. 28 to 30, in the present embodiment, the n-type MOSFET 111N and the p-type MOSFET 211P are provided such that the channel directions thereof cross orthogonally with each other. In particular, the direction in which the paired source-drain regions 111A and 111B of the n-type MOSFET 111N are juxtaposed, that is, the y direction, and the direction in which the paired source-drain regions 211A and 211B of the p-type MOSFET 211P are juxtaposed, that is, the x direction, cross orthogonally with each other.

Details of the components are successively described.

A-1. n-Type MOSFET 111N

As seen in FIG. 29, in the n-type MOSFET 111N, the longitudinal direction of the gate electrode 111G coincides with the x direction, different from that in the case of the embodiment 1 shown in FIG. 6.

Further, as seen in FIG. 29, the longitudinal direction of the paired source-drain regions 111A and 111B coincides with the x direction, and the source-drain regions 111A and 111B are provided so as to be juxtaposed in the y direction with the gate electrode 111G interposed therebetween.

Further, as seen in FIG. 29, a plurality of wiring line layers 111HA, 111HB and 111HG are provided above the n-type MOSFET 111N.

Of the wiring line layers 111HA, 111HB and 111HG, the wiring line layer 111HA is provided so as to be electrically connected to the source-drain region 111A through a contact C11 as seen in FIG. 29. The wiring line layer 111HA is formed in such a manner as to include a portion extending along the x direction above the source-drain region 111A. In other words, the wiring line layer 111HA is formed such that the longitudinal direction thereof coincides with the x direction.

Of the plural wiring line layers 111HA, 111HB and 111HG, the wiring line layer 111HB is provided so as to be electrically connected to the source-drain region 111B through another contact C11 as seen in FIG. 29. The wiring line layer 111HB is formed in such a manner as to include a portion extending along the x direction above the source-drain region 111B. In other words, the wiring line layer 111HB is formed such that the longitudinal direction thereof coincides with the x direction.

Of the wiring line layers 111HA, 111HB and 111HG, the wiring line layer 111HG is provided so as to be electrically connected to the gate electrode 111G through a further contact C11 as seen in FIG. 29. The wiring line layer 111HG is formed in such a manner as to include a portion extending along the y direction from a left end of the gate electrode 111G above the gate electrode 111G. In other words, the wiring line layer 111HG is formed such that the longitudinal direction thereof coincides with the x direction.

A-2. p-Type MOSFET 211P

As seen in FIG. 30, in the p-type MOSFET 211P, the longitudinal direction of the gate electrode 111G coincides with the y direction similarly as in the case of the embodiment 1 (refer to FIG. 7).

Further, as seen in FIG. 30, the longitudinal direction of the paired source-drain regions 211A and 211B coincides with the y direction, and the paired source-drain regions 211A and 211B are juxtaposed in the x direction with the gate electrode 111G interposed therebetween.

Further, as seen in FIG. 30, a plurality of wiring line layers 211HA, 211HB and 211HG are provided below the p-type MOSFET 211P.

Of the wiring line layers 211HA, 211HB and 211HG, the wiring line layer 211HA is provided so as to be electrically connected to the source-drain region 211A through a contact C21 as seen in FIG. 30. The wiring line layer 211HA is formed so as to include a portion extending along the y direction below the source-drain region 211A. In other words, the wiring line layer 211HA is formed such that the longitudinal direction thereof coincides with the y direction.

Of the wiring line layers 211HA, 211HB and 211HG, the wiring line layer 211HB is provided so as to be electrically connected to the source-drain region 211B through another contact C21 as seen in FIG. 30. The wiring line layer 211HB is formed so as to include a portion extending along the y direction below the source-drain region 211B. In other words, the wiring line layer 211HB is formed such that the longitudinal direction thereof coincides with the y direction.

Of the wiring line layers 211HA, 211HB and 211HG, the wiring line layer 211HG is provided so as to be electrically connected to the gate electrode 211G through a further contact C21 as seen in FIG. 30. The wiring line layer 211HG is formed so as to include a portion extending along the x direction from an upper end portion of the gate electrode 211G below the gate electrode 211G. In other words, the wiring line layer 211HG is formed such that the longitudinal direction thereof coincides with the y direction.

A-3. Some of the Plural Wiring Line Layers which Configure the Multilayer Wiring Line Layer 310 (Refer to FIGS. 3 to 5), i.e., Lowermost Ones Such as the Wiring Line Layer 321H

The wiring line layer 321H is electrically connected to the wiring line layer 111HG through a contact C12 as seen in FIGS. 28 to 30. Further, the wiring line layer 321H is electrically connected to the wiring line layer 211HG through the contact C22. The wiring line layer 321H is formed such that it has a rectangular shape in plan. Further, the wiring line layer 321H is electrically connected to the input terminal In through a different wiring line and contact similarly as in the embodiment 1.

The wiring line layer 322H is electrically connected to the wiring line layer 111HA through another contact C12 as seen in FIGS. 28 and 29. The wiring line layer 322H is formed such that it has a rectangular shape in plan. Further, the wiring line layer 322H is electrically connected to the ground GND through a different wiring line and contact similarly as in the embodiment 1.

The wiring line layer 323H is electrically connected to the wiring line layer 211HB through another contact C22 as seen in FIGS. 28 and 30. The wiring line layer 323H is formed such that it has a rectangular shape in plan. Further, the wiring line layer 323H is electrically connected to the terminal Vdd of the power supply through a different wiring line and contact similarly as in the embodiment 1.

The wiring line layer 324H is electrically connected to the wiring line layer 111HB through a further contact C12 as seen in FIGS. 28 to 30. Further, the wiring line layer 324H is electrically connected to the wiring line layer 211HA through a further contact C22. The wiring line layer 324H is formed such that it has a rectangular shape in plan. Further, the wiring line layer 324H is electrically connected to the Output terminal Out through a different wiring line and contact similarly as in the embodiment 1.

In this manner, the wiring line layers 321H to 324H are electrically connected to each other such that the n-type MOSFET 111N and the p-type MOSFET 211P individually configure a CMOS inverter circuit, that is, a NOT circuit, similarly as in the embodiment 1.

B. Conclusion

As described above, in the present embodiment, the n-type MOSFET 111N is provided on the first substrate 101 and the p-type MOSFET 211P is provided on the second substrate 201 similarly as in the other embodiments. Then, the first substrate 101 and the second substrate 201 are bonded to each other to electrically connect the n-type MOSFET 111N and the p-type MOSFET 211P to each other.

Accordingly, also with the present embodiment, enhancement of the fabrication efficiency, reduction of the cost and enhancement of the reliability of the apparatus can be implemented readily similarly as in the other embodiments.

Particularly, in the present embodiment, the n-type MOSFET 111N and the p-type MOSFET 211P are provided such that the channel directions thereof cross orthogonally with each other. In particular, the direction in which the paired source-drain regions 111A and 111B are juxtaposed in the n-type MOSFET 111N and which is the y direction and the direction in which the paired source-drain regions 211A and 211B are juxtaposed in the p-type MOSFET 211P and which is the x direction cross orthogonally with each other. Therefore, the area of the mutually opposing faces of the wiring line layers provided on the first substrate 101 such as the wiring line layer 211HA and the wiring line layers provided on the second substrate 201 such as the wiring line layer 211HA is smaller than that in the embodiment 1 and so forth. Therefore, the coupling capacitance which appears between the wiring line layers can be reduced, and consequently, occurrence of a failure such as a delay can be prevented and the reliability of the device can be further improved.

<7. Embodiment 7>
A. Device Configuration

Figure 31:
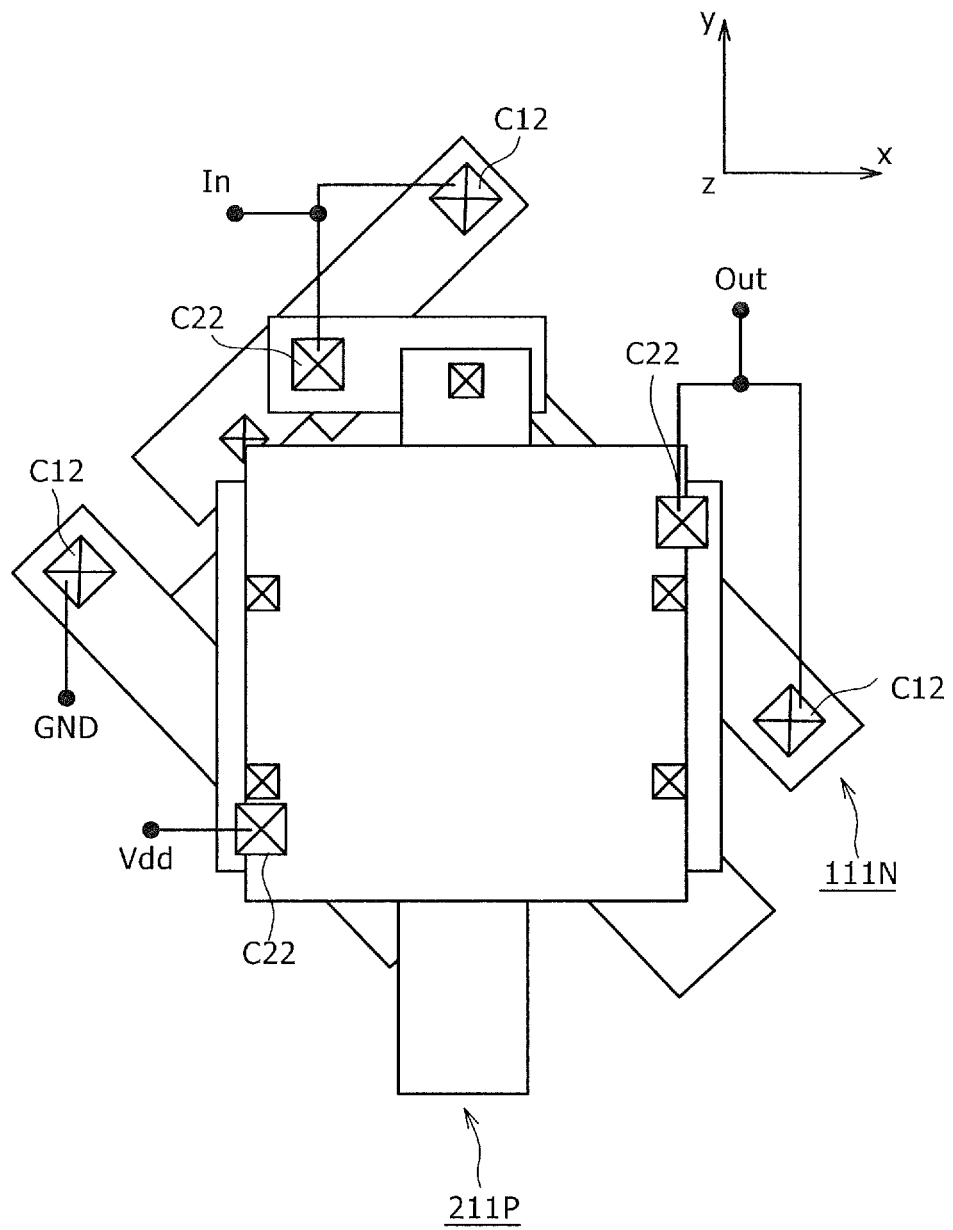
FIG. 31 is a schematic top plan view of a semiconductor device according to an embodiment 7.
Figure 32:
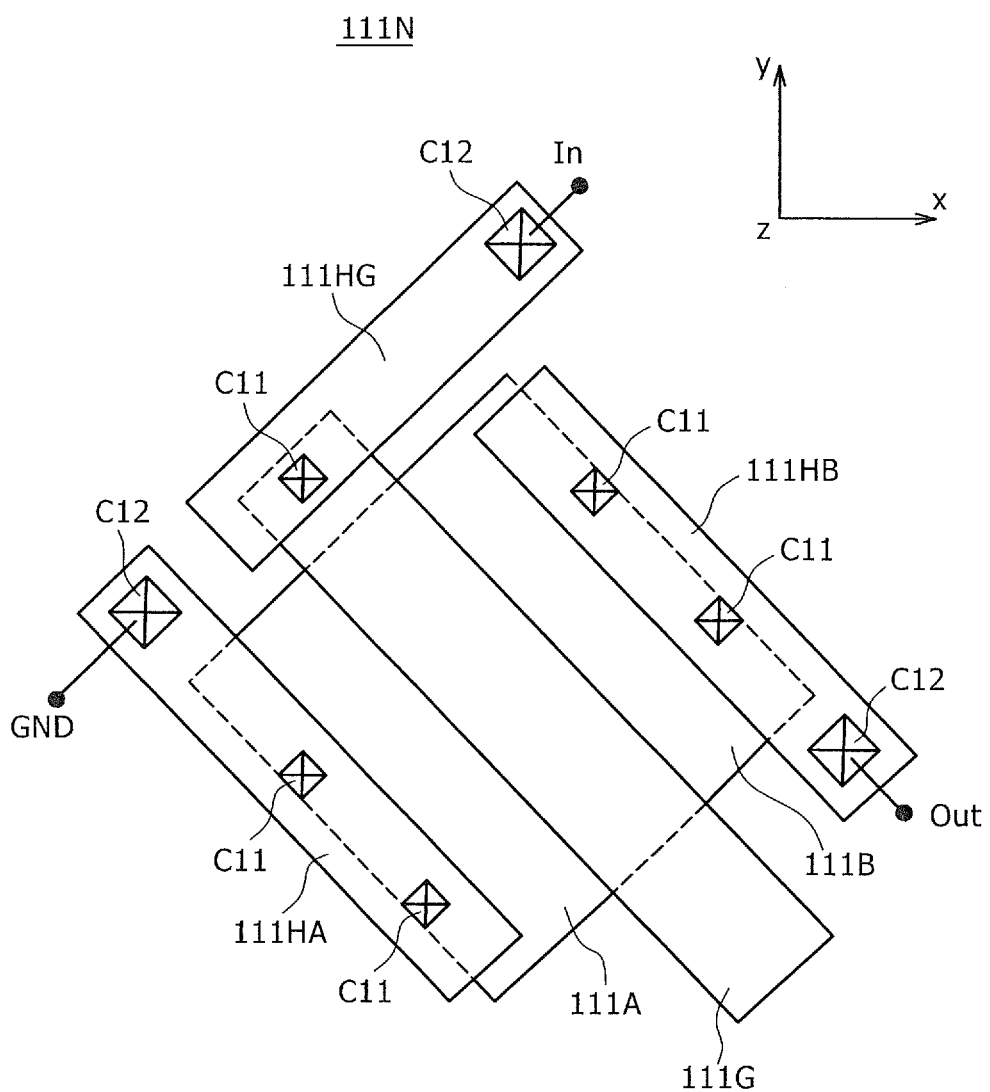
FIG. 32 is a schematic top plan view showing essential part of an n-type MOSFET of the semiconductor device of FIG. 28.
Figure 33:
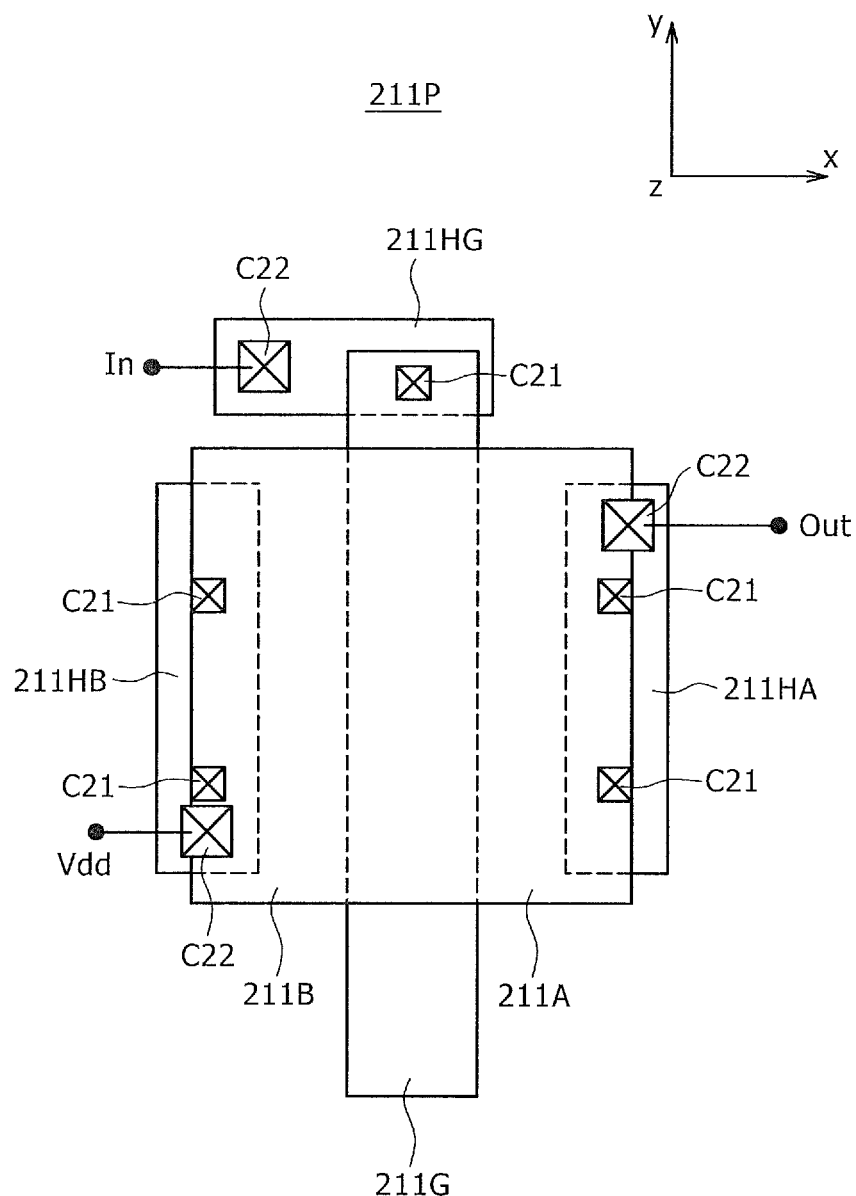
FIG. 33 is a schematic top plan view showing essential part of a p-type MOSFET of the semiconductor device of FIG. 28.

FIGS. 31 to 33 show essential part of a semiconductor device according to an embodiment 7.

Particularly, FIG. 31 shows a top plan of the semiconductor device similarly to FIG. 28.

FIG. 32 shows essential part of an n-type MOSFET which configures part of the semiconductor device similarly to FIG. 29.

FIG. 33 shows essential part of a p-type MOSFET which configures part of the semiconductor device similarly to FIG. 30.

FIGS. 32 and 33 show top plans similarly to FIGS. 29 and 30, and in FIGS. 32 and 33, profiles of portions of members in lower layers are indicated by thin broken lines. A disposition relationship between the n-type MOSFET shown in FIG. 32 and the p-type MOSFET shown in FIG. 33 is shown in FIG. 31.

In the present embodiment, as seen in FIGS. 31 to 33, the n-type MOSFET 111N and the p-type MOSFET 211P are different in configuration from those in the embodiment 6. The present embodiment is similar to the embodiment 6 except the matter just described and associated matters. Therefore, in the description of the present embodiment, description of overlapping matters with the matters in the embodiment 6 is suitably omitted herein to avoid redundancy.

Referring to FIGS. 31 to 33, in the present embodiment, the n-type MOSFET 111N and the p-type MOSFET 211P are provided such that the channel directions thereof cross with each other. In particular, the direction in which the paired source-drain regions 111A and 111B are juxtaposed in the n-type MOSFET 111N and which is the y direction and the direction in which the paired source-drain regions 211A and 211B are juxtaposed in the p-type MOSFET 211P and which is the x direction cross with each other. Here, as an example, the n-type MOSFET 111N and the p-type MOSFET 211P are provided such that the channel directions do not cross orthogonally with each other but are inclined by 45° from the orthogonally crossing state.

Details of the components are successively described.

A-1. n-Type MOSFET 111N

As shown in FIG. 32, in the n-type MOSFET 111N, different from that in the case of the embodiment 6 described hereinabove with reference to FIG. 28, the longitudinal direction of the gate electrode 111G extends in a direction inclined by an angle of 45° with respect to the x direction and the y direction.

Further, as seen in FIG. 32, the paired source-drain regions 111A and 111B are provided such that they are juxtaposed with each other with the gate electrode 111G interposed therebetween which extends along the direction inclined by the angle of 45° with respect to the x direction and the y direction.

Further, as seen in FIG. 32, a plurality of wiring line layers 111HA, 111HB and 111HG are provided above the n-type MOSFET 111N.

Of the wiring line layers 111HA, 111HB and 111HG, the wiring line layer 111HA is provided so as to be electrically connected to the source-drain region 111A through a contact C11 as seen in FIG. 32. The wiring line layer 111HA is formed in such a manner that the longitudinal direction thereof coincides with the longitudinal direction of the gate electrode 111G above the source-drain region 111A. In other words, the wiring line layer 111HA is formed such that the longitudinal direction thereof coincides with the direction inclined by the angle of 45° with respect to the x direction and the y direction.

Of the wiring line layers 111HA, 111HB and 111HG, the wiring line layer 111HB is provided so as to be electrically connected to the source-drain region 111B through another contact C11 as seen in FIG. 32. The wiring line layer 111HB is formed in such a manner that the longitudinal direction thereof coincides with the longitudinal direction of the gate electrode 111G above the source-drain region 111B. In other words, the wiring line layer 111HB is formed such that the longitudinal direction thereof coincides with the direction inclined by the angle of 45° with respect to the x direction and the y direction.

Of the wiring line layers 111HA, 111HB and 111HG, the wiring line layer 111HG is provided so as to be electrically connected to the gate electrode 111G through a further contact C11 as seen in FIG. 32. The wiring line layer 111HG is formed in such a manner that it includes a portion which extends in a direction perpendicular to the longitudinal direction of the gate electrode 111G from an upper end of the gate electrode 111G above the gate electrode 111G. In other words, the wiring line layer 111HG is formed such that the longitudinal direction thereof coincides with the direction perpendicular to the longitudinal direction of the gate electrode 111G.

A-2. p-Type MOSFET 211P

As seen in FIG. 33, in the p-type MOSFET 211P, the longitudinal direction of the gate electrode 211G coincides with the y direction similarly as in the case of the embodiment 6 described hereinabove with reference to FIG. 30.

Further, as seen in FIG. 33, the paired source-drain regions 211A and 211B are provided such that the longitudinal direction thereof coincides with the y direction and the source-drain regions 211A and 211B are juxtaposed in the x direction with the gate electrode 211G interposed therebetween.

Further, as shown in FIG. 33, a plurality of wiring line layers 211HA, 211HB and 211HG are provided below the p-type MOSFET 211P.

Of the wiring line layers 211HA, 211HB and 211HG, the wiring line layer 211HA is provided so as to be electrically connected to the source-drain region 211A through a contact C21 as seen in FIG. 33. The wiring line layer 211HA is formed in such a manner that it includes a portion which extends along the y direction below the source-drain region 211A. In other words, the wiring line layer 211HA is formed such that the longitudinal direction thereof coincides with the y direction.

Of the wiring line layers 211HA, 211HB and 211HG, the wiring line layer 211HB is provided so as to be electrically connected to the source-drain region 211B through another contact C21 as seen in FIG. 33. The wiring line layer 211HB is formed in such a manner that it includes a portion which extends along the y direction below the source-drain region 211B. In other words, the wiring line layer 211HB is formed such that the longitudinal direction thereof coincides with the y direction.

Of the wiring line layers 211HA, 211HB and 211HG, the wiring line layer 211HG is provided so as to be electrically connected to the gate electrode 211G through a further contact C21 as seen in FIG. 33. The wiring line layer 211HG is formed in such a manner that it includes a portion which extends along the x direction from an upper end portion of the gate electrode 211G below the gate electrode 211G. In other words, the wiring line layer 211HG is formed such that the longitudinal direction thereof coincides with the x direction.

A-3. Others

As seen in FIGS. 31 and 32, the plural wiring line layers 111HA, 111HB and 111HG connected to associated portions of the n-type MOSFET 111N are electrically connected to the associated portions through the contacts C12 similarly as in the case of the embodiment 6.

In particular, as seen in FIG. 32, the wiring line layer 111HG is electrically connected to the input terminal In. The wiring line layer 111HA is electrically connected to the ground GND. The wiring line layer 111HB is electrically connected to the output terminal Out. Such electric connections are implemented through wiring lines and contacts in a multilayer wiring line layer not shown similarly as in the case of the embodiment 6.

Further, as seen in FIGS. 31 and 33, a plurality of wiring line layers 211HA, 211HB and 211HG connected to associated portions of the p-type MOSFET 211P are electrically connected to the associated portions through the contacts C22 similarly as in the case of the embodiment 6.

In particular, as seen in FIG. 33, the wiring line layer 211HG is electrically connected to the input terminal In. The wiring line layer 211HA is electrically connected to the output terminal Out. The wiring line layer 211HB is electrically connected to the terminal Vdd of the power supply voltage. Such electric connections are implemented through wiring lines and contacts in the multilayer wiring line layer not shown similarly as in the case of the embodiment 6.

In this manner, the n-type MOSFET 111N and the p-type MOSFET 211P are electrically connected to each other such that a CMOS inverter circuit is configured similarly as in the case of the embodiment 6.

B. Conclusion

As described above, in the present embodiment, the n-type MOSFET 111N is provided on the first substrate 101 and the p-type MOSFET 211P is provided on the second substrate 201 similarly as in the other embodiments. Then, the first substrate 101 and the second substrate 201 are bonded to each other to electrically connect the n-type MOSFET 111N and the p-type MOSFET 211P to each other.

Accordingly, also with the present embodiment, enhancement of the fabrication efficiency, reduction of the cost and enhancement of the reliability of the apparatus can be implemented readily similarly as in the other embodiments.

Particularly in the present embodiment, the n-type MOSFET 111N and the p-type MOSFET 211P are provided such that the channel directions thereof cross with each other. Therefore, the area of the faces of the wiring line layers provided in the first substrate 101 such as the wiring line layer 111HA and the faces of the wiring line layers provided in the second substrate 201 such as the wiring line layer 211HA which oppose to each other is reduced from that in the case of the embodiment 1 and so forth. Therefore, the coupling capacitance which appears between them can be reduced, and consequently, occurrence of a failure such as a delay can be prevented and the reliability of the device can be further improved.

Further, in the case where the configuration described below is adopted, the semiconductor device of the present embodiment can be fabricated advantageously by positioning notches provided on the first substrate 101 and the second substrate 201 in advance relative to each other and then bonding them to each other.

First substrate 101: (100) substrate
Channel direction of n-type MOSFET 111N: <110>
Second substrate 201: (100) substrate
Channel direction of p-type MOSFET 211P: <100>

<8. Embodiment 8>

A. Device Configuration

FIGS. 34 to 37 show essential part of a semiconductor device according to an embodiment 8.

Figure 34:
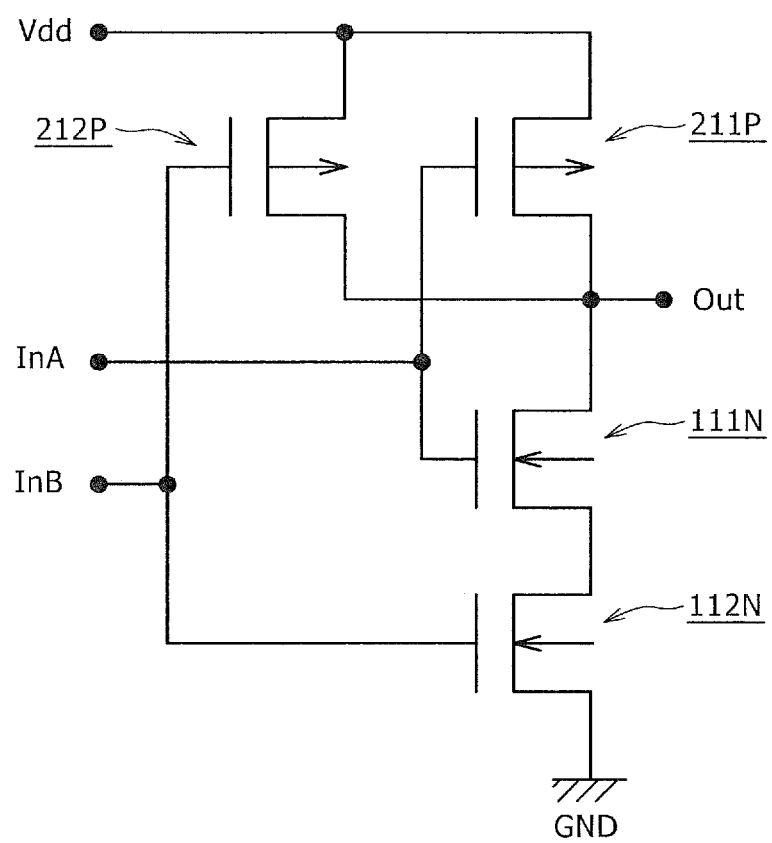
FIG. 34 is a circuit diagram showing a circuit configuration of a semiconductor device according to an embodiment 8.

In particular, FIG. 34 shows a circuit configuration of the semiconductor device similarly to FIG. 1.

Figure 35:
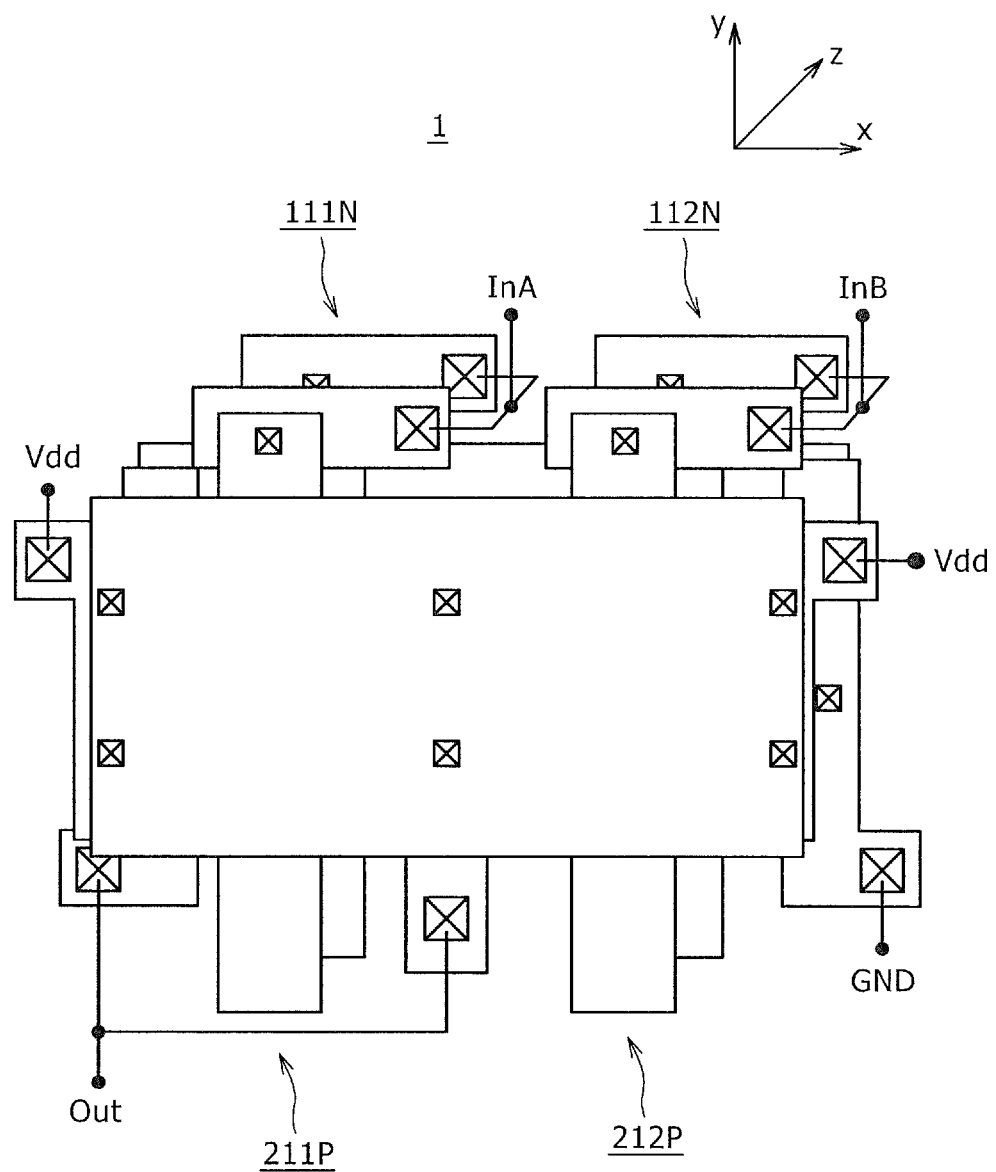
FIG. 35 is a perspective view showing essential part of the semiconductor device of FIG. 34.

FIG. 35 is a perspective view showing essential part of the semiconductor device similarly to FIG. 2. In FIG. 35, similarly as in the case of FIG. 2, p-type MOSFETs provided on a second substrate 201 (refer to FIG. 3 and so forth) are indicated by dots. Meanwhile, no dot is applied to n-type MOSFETs provided on a first substrate 101 (refer to FIG. 3 and so forth).

Figure 36:
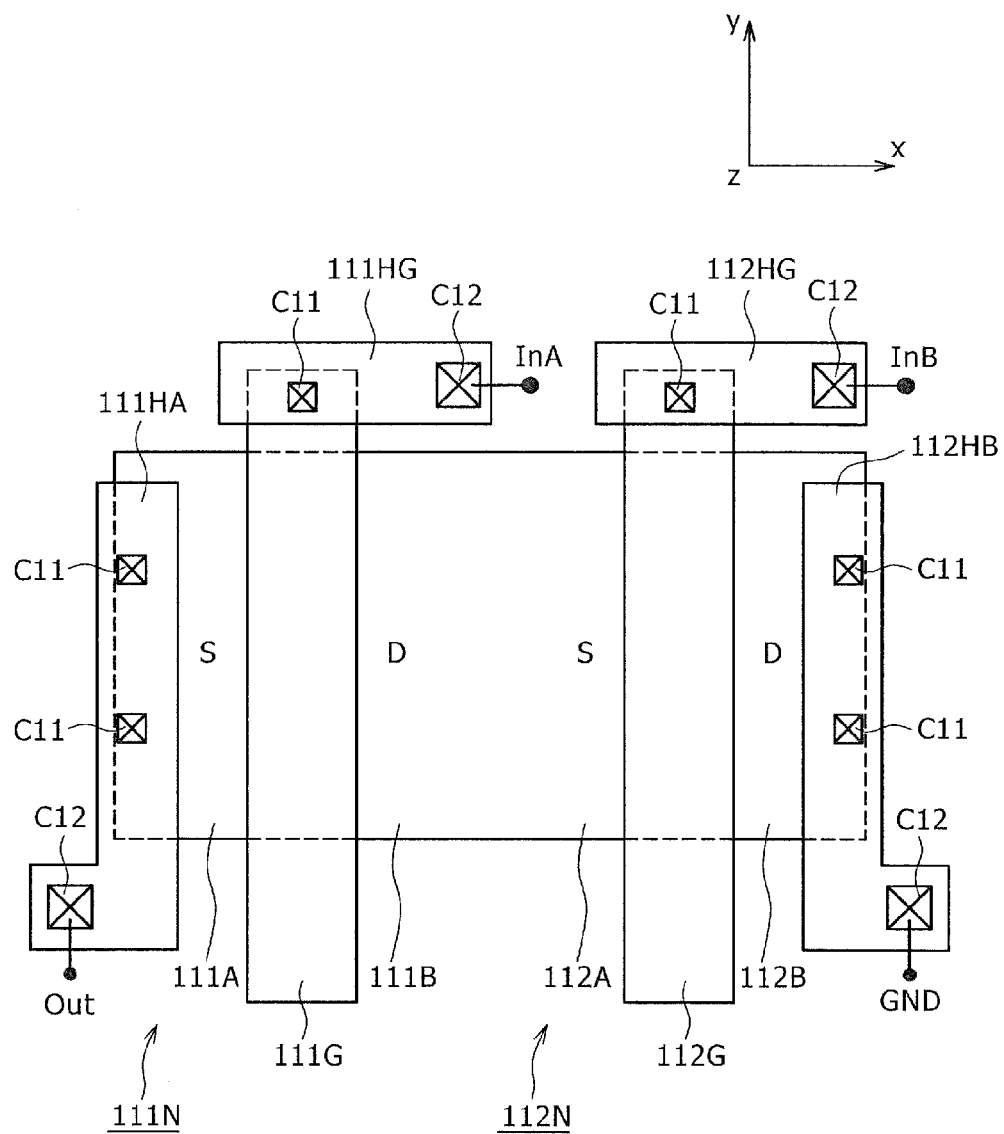
FIG. 36 is a schematic top plan view of n-type MOSFETs provided on a first substrate of the semiconductor device of FIG. 34.

FIG. 36 shows part of the semiconductor device and shows a top plan of n-type MOSFETs provided on the first substrate 101 (refer to FIG. 3 and so forth).

Figure 37:
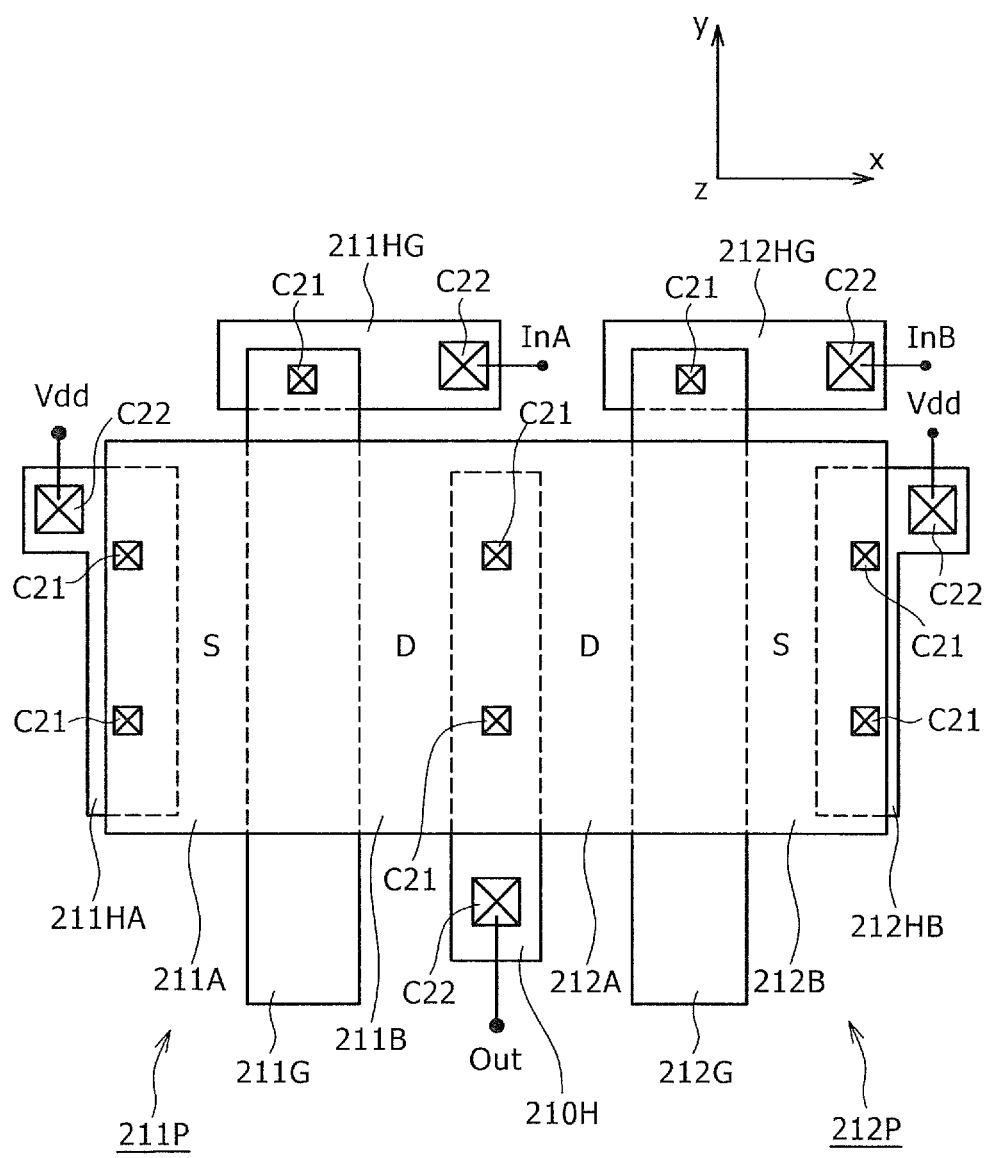
FIG. 37 is a schematic top plan view showing p-type MOSFETs provided on a second substrate of the semiconductor device of FIG. 34.

FIG. 37 shows part of the semiconductor device and shows an upper face of p-type MOSFETs provided on the second substrate 201 (refer to FIG. 3 and so forth).

FIGS. 36 and 37 show top plans similarly to FIGS. 6 and 7, and in FIGS. 36 and 37, profiles of portions of members in lower layers covered with an upper layer are indicated by thin broken lines.

Referring to FIGS. 34 to 37, the present embodiment is different from the embodiment 1 in part of a configuration of the n-type MOSFETs 111N and 112N and p-type MOSFETs 211P and 212P which configure the semiconductor device 1. Here, the semiconductor device 1 includes two n-type MOSFETs 111N and 112N and two p-type MOSFETs 211P and 212P. The present embodiment is similar to the embodiment 1 except the matter just described and associated matters. Therefore, in the description of the present embodiment, description of overlapping matters with the matters in the embodiment 1 is suitably omitted herein to avoid redundancy.

Referring to FIG. 34, the semiconductor device 1 includes a CMOS circuit which in turn includes n-type MOSFETs 111N and 112N and p-type MOSFETs 211P and 212P. The semiconductor device 1 is electrically connected such that the n-type MOSFETs 111N and 112N and the p-type MOSFETs 211P and 212P individually configure a CMOS-NAND circuit. In particular, the semiconductor device 1 is configured such that it outputs an output signal of the low level when both of an input signal from a first input terminal InA and another input signal from a second input terminal InB exhibit the high level, but outputs an output signal of the high level when the two input signals exhibit any other signal level combination.

In particular, the first n-type MOSFET 111N and the second n-type MOSFET 112N are connected in series. Further, the first p-type MOSFET 211P and the second p-type MOSFET 212P are connected in parallel.

Meanwhile, the first n-type MOSFET 111N and the first p-type MOSFET 211P are electrically connected at the gates thereof to each other and are electrically connected to the first input terminal InA. The second n-type MOSFET 112N and the second p-type MOSFET 212P are electrically connected at the gates thereof to each other and are electrically connected to the second input terminal InB.

Further, the source of the first n-type MOSFET 111N and the drains of the p-type MOSFETs 211P and 212P are electrically connected to each other and are electrically connected to the output terminal Out.

Further, the second n-type MOSFET 112N is electrically connected at the drain thereof to the ground GND. Further, the p-type MOSFETs 211P and 212P are electrically connected at the sources thereof to the terminal Vdd of the power supply voltage.

Referring to FIG. 35, in the semiconductor device 1, the n-type MOSFETs 111N and 112N and the p-type MOSFETs 211P and 212P are disposed in an opposing relationship to each other similarly as in the case of the embodiment 1.

Although sectional views are not shown, the components are provided similarly as in the embodiment 1. In particular, the n-type MOSFETs 111N and 112N are provided on the face of the first substrate 101 opposing to the second substrate 201, that is, on the upper face of the first substrate 101 (refer to FIGS. 3 to 5). Meanwhile, the p-type MOSFETs 211P and 212P are provided on the face of the second substrate 201 opposing to the first substrate 101, that is, on the lower face of the second substrate 201 (refer to FIGS. 3 to 5).

Further, the multilayer wiring line layer 310 is provided similarly as in the case of the embodiment 1 (refer to FIGS. 3 to 5). The n-type MOSFETs 111N and 112N and the p-type MOSFETs 211P and 212P are electrically connected to each other through wiring lines provided in the multilayer wiring line layer 310 such as the wiring line 321H.

Particulars of the components are successively described.

A-1. n-Type MOSFETs 111N and 112N

Referring to FIG. 36, the first n-type MOSFET 111N and the second n-type MOSFET 112N are provided in a juxtaposed relationship with each other in the x direction.

The first n-type MOSFET 111N and the second n-type MOSFET 112N are disposed such that the longitudinal direction of the gate electrodes 111G and 112G coincides with the y direction as seen in FIG. 36.

As seen in FIG. 36, in the first n-type MOSFET 111N, the longitudinal direction of the source-drain regions 111A and 111B coincides with the y direction. The source-drain region 111A and the source-drain region 111B are provided in a juxtaposed relationship with each other in the x direction with the gate electrode 111G interposed therebetween.

Similarly, also in the second n-type MOSFET 112N, the longitudinal direction of the source-drain regions 112A and 112B coincides with the y direction. The source-drain region 112A and the source-drain region 112B are provided in a juxtaposed relationship with each other in the x direction with the gate electrode 112G interposed therebetween.

Here, the source-drain region 111B which configures the first n-type MOSFET 111N and the source-drain region 112A which configures the second n-type MOSFET 112N are formed such that they are connected to each other.

Further, as seen in FIG. 36, a plurality of wiring line layers 111HA and 111HG are provided above the first n-type MOSFET 111N. Further, a plurality of wiring line layers 112HB and 112HG are provided above the second n-type MOSFET 112N.

Of the wiring line layers 111HA and 111HG and the wiring line layers 112HB and 112HG, the wiring line layer 111HA is electrically connected to the source-drain region 111A which configures the first n-type MOSFET 111N through a contact C11 as seen in FIG. 36. The wiring line layer 111HA is formed in such a manner as to include a portion extending along the y direction above the source-drain region 111A.

As seen in FIG. 36, the wiring line layer 111HG is electrically connected to the gate electrode 111G which configures the first n-type MOSFET 111N through another contact C11. The wiring line layer 111HG is formed so as to include a portion extending along the x direction from an upper end of the gate electrode 111G above the gate electrode 111G.

As seen in FIG. 36, the wiring line layer 112HB is electrically connected to the source-drain region 112B which configures the second n-type MOSFET 112N through a further contact C11. The wiring line layer 112HB is formed so as to include a portion extending along the y direction above the source-drain region 112B.

As seen in FIG. 36, the wiring line layer 112HG is electrically connected to the gate electrode 112G which configures the second n-type MOSFET 112N through a still further contact C11. The wiring line layer 112HG is formed so as to include a portion extending along the x direction from an upper end of the gate electrode 112G above the gate electrode 112G.

A-2. p-Type MOSFET 211P

Referring to FIG. 37, the first p-type MOSFET 211P and the second p-type MOSFET 212P are provided in a juxtaposed relationship with each other in the x direction.

The first p-type MOSFET 211P and the second p-type MOSFET 212P are disposed such that the longitudinal direction of the gate electrodes 211G and 212G coincides with the y direction as seen in FIG. 37.

As seen in FIG. 37, in the first p-type MOSFET 211P, the longitudinal direction of the source-drain regions 211A and 211B coincides with the y direction. The source-drain region 211A and the source-drain region 211B are provided in a juxtaposed relationship with each other in the x direction with the gate electrode 211G interposed therebetween.

Similarly, also in the second p-type MOSFET 212P, the longitudinal direction of the source-drain regions 212A and 212B coincides with the y direction. The source-drain region 212A and the source-drain region 212B are provided in a juxtaposed relationship in the x direction with the gate electrode 212G interposed therebetween.

Here, the source-drain region 211B which configures the first p-type MOSFET 211P and the source-drain region 212A which configures the second p-type MOSFET 212P are formed such that they are connected to each other.

Further, as seen in FIG. 37, the wiring line layers 211HA and 211HG are provided below the first p-type MOSFET 211P. Further, a plurality of wiring line layers 212HB and 212HG are provided below the second p-type MOSFET 212P. Further, a wiring line layer 210H is provided below the source-drain region 211B which configures the first p-type MOSFET 211P and the source-drain region 212A which configures the second p-type MOSFET 212P.

Of the wiring line layers 211HA and 211HG and the wiring line layers 212HB and 212HG, the wiring line layer 211HA is electrically connected to the source-drain region 211A which configures the first p-type MOSFET 211P through a contact C21 as seen in FIG. 37. The wiring line layer 211HA is formed in such a manner as to include a portion extending along the y direction below the source-drain region 211A.

As seen in FIG. 37, the wiring line layer 211HG is electrically connected to the gate electrode 211G which configures the first p-type MOSFET 211P through another contact C21. The wiring line layer 211HG is formed so as to include a portion extending along the x direction from an upper end of the gate electrode 211G below the gate electrode 211G.

As seen in FIG. 37, the wiring line layer 212HB is electrically connected to the source-drain region 212B which configures the second p-type MOSFET 212P through a further contact C21. The wiring line layer 212HB is formed so as to include a portion extending along the y direction below the source-drain region 212B.

As seen in FIG. 37, the wiring line layer 212HG is electrically connected to the gate electrode 212G which configures the second p-type MOSFET 212P through a still further contact C21. The wiring line layer 212HG is formed so as to include a portion extending along the x direction from an upper end of the gate electrode 212G below the gate electrode 212G.

As seen in FIG. 37, the wiring line layer 210H is electrically connected to the source-drain region 211B of the first p-type MOSFET 211P and the source-drain region 212A of the second p-type MOSFET 212P through a contact C21. The wiring line layer 210H is formed so as to include a portion extending along the y direction.

A-3. Others

As seen in FIGS. 35 and 36, the plural wiring line layers 111HA, 111HG, 112HB and 112HG connected to the associated portions of the n-type MOSFETs 111N and 112N are electrically connected to the associated portions through contacts C12 similarly as in the embodiment 1.

In particular, as seen in FIG. 36, the wiring line layer 111HG is electrically connected to the first input terminal InA. The wiring line layer 111HA is electrically connected to the output terminal Out. The wiring line layer 112HG is electrically connected to the second input terminal InB. The wiring line layer 112HB is electrically connected to the ground GND. Such electric connections are implemented through the wiring lines and contacts in the multilayer wiring line layer not shown similarly as in the embodiment 1.

As seen in FIGS. 35 and 37, the plural wiring line layers 211HA, 211HG, 212HB and 212HG connected to the associated portions of the p-type MOSFETs 211P and 212P are electrically connected to the associated portions through contacts C22 similarly as in the embodiment 1.

In particular, as seen in FIG. 37, the wiring line layer 211HG is electrically connected to the first input terminal InA. The wiring line layer 211HA is electrically connected to the terminal Vdd of the power supply voltage. The wiring line layer 212HG is electrically connected to the second input terminal InB. The wiring line layer 212HB is electrically connected to the terminal Vdd of the power supply voltage. Such electric connections are implemented through the wiring lines and contacts in the multilayer wiring line layer not shown similarly as in the embodiment 1.

B. Conclusion

As described above, in the present embodiment, the n-type MOSFETs 111N and 112N and the p-type MOSFETs 211P and 212P are electrically connected to each other in such a manner as to configure a NAND circuit. Here, the n-type MOSFETs 111N and 112N are provided on the first substrate 101, and the p-type MOSFETs 211P and 212P are provided on the second substrate 201, similarly as in the other embodiments. Then, the first substrate 101 and the second substrate 201 are bonded to each other to electrically connect the n-type MOSFETs 111N and 112N and the p-type MOSFETs 211P and 212P to each other.

Accordingly, also with the present embodiment, enhancement of the fabrication efficiency, reduction of the cost and enhancement of the reliability of the apparatus can be implemented readily similarly as in the embodiment 1.

9. Embodiment 9

A. Device Configuration

Figure 38:
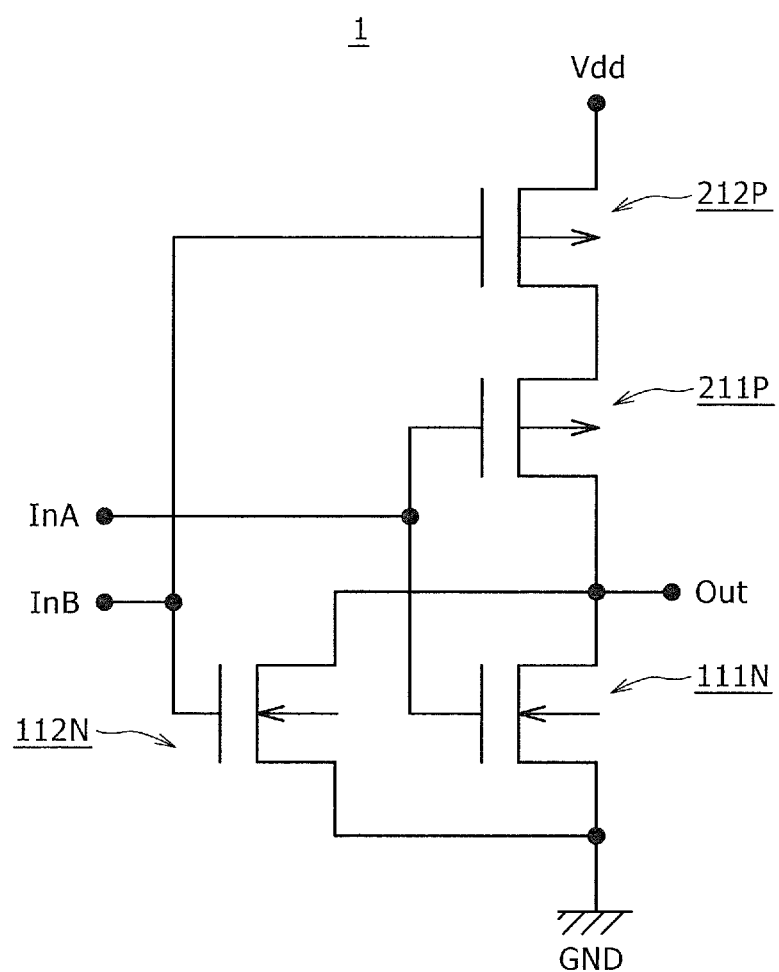
FIG. 38 is a circuit diagram showing essential part of a semiconductor device according to an embodiment 9.

FIG. 38 shows essential part of a semiconductor device according to an embodiment 9.

FIG. 38 shows a circuit configuration of the semiconductor device.

Referring to FIG. 38, the semiconductor device 1 is different in circuit configuration from that in the embodiment 8. The present embodiment is similar to the embodiment 8 except the matter just described and associated matters. Therefore, in the description of the present embodiment, description of overlapping matters with the matters in the embodiment 1 is suitably omitted herein to avoid redundancy.

As seen in FIG. 38, in the semiconductor device 1, the n-type MOSFETs 111N and 112N and the p-type MOSFET 211P and 212P are electrically connected to each other so as to configure a CMOS-NOR circuit. In particular, the semiconductor device 1 is configured such that, where both of an input signal from the first input terminal InA and another input signal from the second input terminal InB exhibit the low level, the output signal exhibits the high level. However, the output signal exhibits the low level when the two input signals exhibit any other signal level combination.

In particular, the first n-type MOSFET 111N and the second n-type MOSFET 112N are connected in parallel. Further, the first p-type MOSFET 211P and the second p-type MOSFET 212P are connected in series.

The first n-type MOSFET 111N and the first p-type MOSFET 211P are electrically connected at the gates thereof to each other and are electrically connected to the first input terminal InA. Further, the second n-type MOSFET 112N and the second p-type MOSFET 212P are electrically connected at the gates thereof to each other and are electrically connected to the second input terminal InB.

The drain of the first p-type MOSFET 211P and the drains of the first and second n-type MOSFETs 111N and 112N are electrically connected to each other and are electrically connected to the output terminal Out.

Further, the second p-type MOSFET 212P is electrically connected at the source thereof to the terminal Vdd of the power supply voltage. Further, the first and second n-type MOSFETs 111N and 112N are electrically connected at the source thereof to the ground GND.

While illustration of the upper face and so forth is omitted, if the MOSFETs in the semiconductor device 1 shown in FIGS. 35 to 37 are configured so as to have the individually opposite conductive types, then the semiconductor device 1 in the present embodiment can be configured.

B. Conclusion

As described above, in the present embodiment, the n-type MOSFETs 111N and 112N and the p-type MOSFETs 211P and 212P are electrically connected to each other so as to configure the NOR circuit. Here, similarly as in the different embodiments, the n-type MOSFETs 111N and 112N are provided on the first substrate 101 and the p-type MOSFETs 211P and 212P are provided on the second substrate 201. Further, the first and second substrates 101 and 201 are bonded to each other so that the n-type MOSFETs 111N and 112N and the p-type MOSFETs 211P and 212P are electrically connected to each other.

Accordingly, also with the present embodiment, enhancement of the fabrication efficiency, reduction of the cost and enhancement of the reliability of the device can be implemented readily similarly as in the other embodiments.

The embodiments 1 to 9 described hereinabove have the following characteristic.

"A first field effect transistor formed on a first substrate and a second field effect transistor formed on a second substrate are electrically connected to each other using a wiring line layer in a multilayer wiring line layer provided on the side of the second substrate on the opposite side to the first substrate.

In the following, embodiments beginning with an embodiment 10 are directed to a case in which "a first field effect transistor formed on a first substrate and a second field effect transistor formed on a second substrate are electrically connected to each other by direct joining of wiring line layers on the faces of the substrates which are joined together.

<Embodiment 10>

Figure 39:
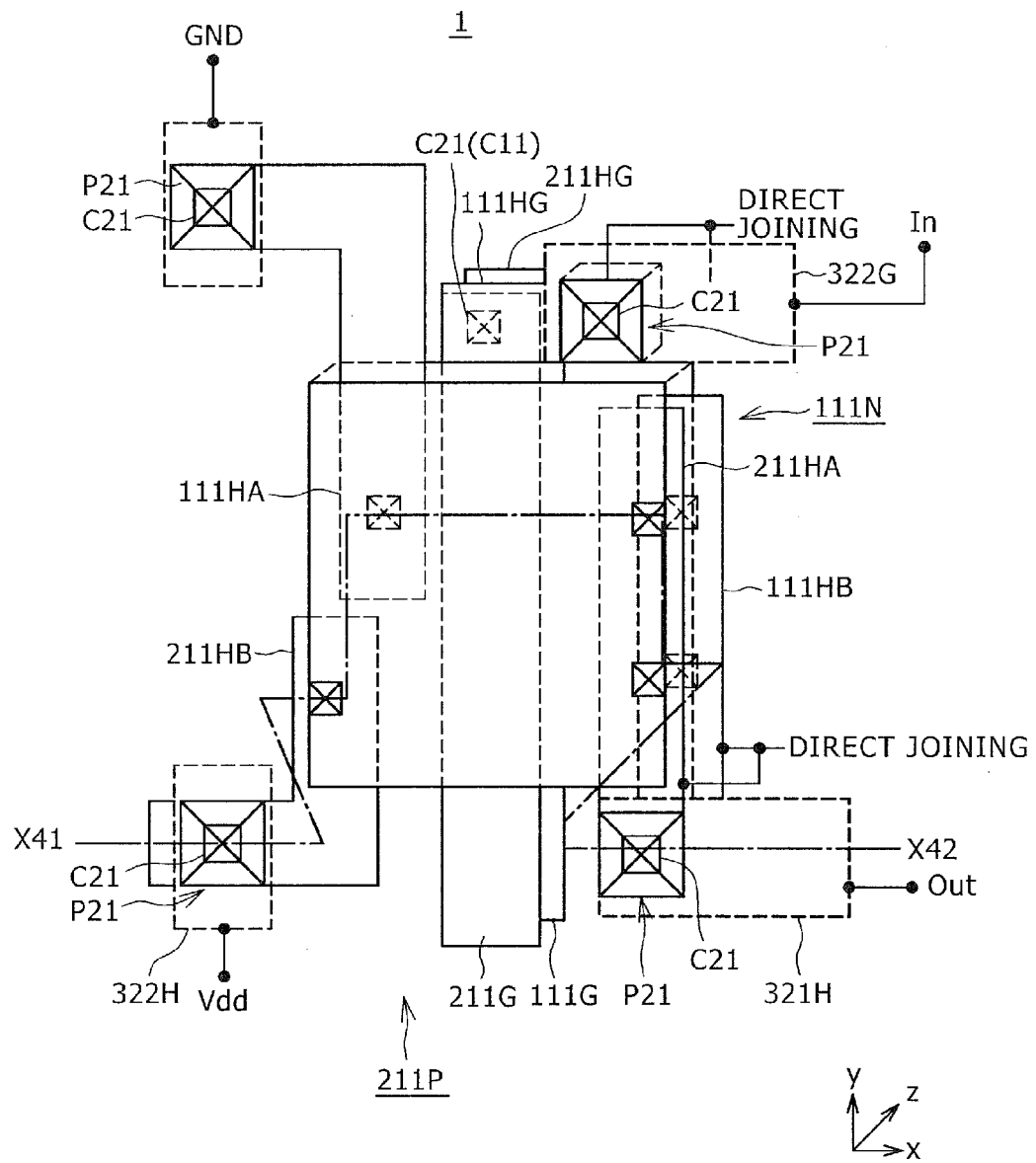
FIG. 39 is a schematic top plan view showing essential part of a semiconductor device according to an embodiment 10.

FIG. 39 shows essential part of a semiconductor device according to a tenth embodiment of the disclosed technology. In particular, FIG. 39 is a schematic plan view where two substrates are placed one on the other and shows patterns formed on the two substrates in a displaced relationship by a small distance from each other in a leftward and rightward direction, that is, an x direction, and an upward and downward direction, that is, a y direction in order to assure high visibility.

Figure 40:
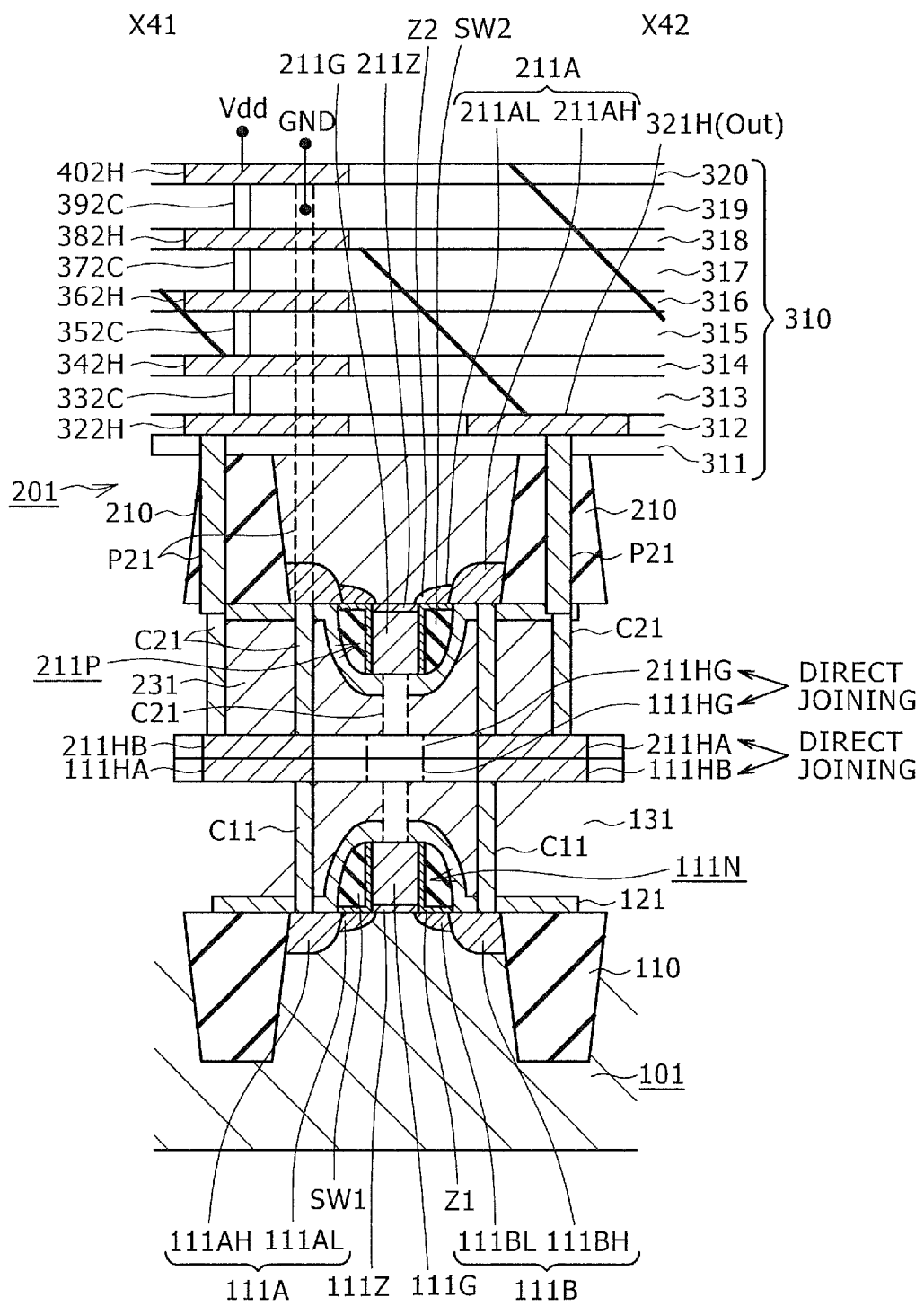
FIG. 40 is a schematic cross sectional view taken along plane X41-X42 of FIG. 39.

FIG. 40 is a sectional view showing essential part of the semiconductor device. In particular, FIG. 40 shows a section taken along plane X41-X42 of FIG. 39. As regards a corresponding relationship between FIGS. 39 and 40, the scale is suitably made different among different portions so that the layout of the portions can be recognized readily. Further, the portion of the semiconductor device 1 shown in FIGS. 39 and 40 implements the CMOS inverter circuit of FIG. 1. Since the CMOS inverter circuit is described hereinabove with reference to FIG. 1, description of the same is omitted herein to avoid redundancy.

Referring to FIGS. 39 and 40, the semiconductor device 1 includes a CMOS circuit which in turn includes an n-type MOSFET 111N and a p-type MOSFET 211P. It is to be noted that elements which are used only in the p-type MOSFET 211P, that is, a channel region, a wiring line layer and a gate electrode, are indicated by dots in FIG. 39. Meanwhile, no dot is applied to the n-type MOSFET 111N.

Referring first to FIG. 39, the n-type MOSFET 111N and the p-type MOSFET 211P in the semiconductor device 1 are disposed in an opposing relationship to each other. It is to be noted that "opposing to each other" regarding FETs signifies that faces on the opposite side to the channel side of the gate electrodes, that is, upper faces, face each other.

Referring now to FIG. 40, the semiconductor device 1 includes a first substrate 101 and a second substrate 201. The first substrate 101 and the second substrate 201 oppose to each other.

The n-type MOSFET 111N is provided on the face of the first substrate 101 opposing to the second substrate 201, that is, on the upper face side of the first substrate 101. Meanwhile, the p-type MOSFET 211P is provided on the face of the second substrate 201 opposing to the first substrate 101, that is, on the lower face side of the second substrate 201. The first substrate 101 and the second substrate 201 are joined together at the sides thereof on which MOSFETs are formed.

It is to be noted that the structure of the substrate side with respect to a flattening film 131 of the n-type MOSFET shown in FIG. 39 is similar to that in the embodiments 1 to 9, and therefore, overlapping description of the same is omitted herein to avoid redundancy. Similarly, the structure of the substrate side with respect to a flattening film 231 of the p-type MOSFET is similar to that in the embodiments 1 to 9, and overlapping description of the same is omitted herein to redundancy.

Referring to FIG. 40, a multilayer wiring line layer 310 is provided on the face of the second substrate 201 on the opposite side to the face opposing to the first substrate 101, that is, to the lower face of the second substrate 201, that is, is provided on the upper face of the second substrate 201. The multilayer wiring line layer 310 configures a global wiring line group for connecting the CMOS inverter circuit shown in FIG. 40 and other circuits and elements not shown in FIG. 40 to each other. The multilayer wiring line layer 310 shown in FIG. 40 has a five-layer structure different from the three-layer structure in the embodiments 1 to 9. However, the layer number of the multilayer wiring line layer is determined arbitrarily, and the structure in which wiring line layers 322H, 342H, . . . and contacts 332C, 352C, . . . are disposed alternately. Accordingly, overlapping detailed description of the multilayer wiring line layer 310 is omitted herein to avoid redundancy.

In the present embodiment, different from the embodiment 1 and so forth, the n-type MOSFET 111N and the p-type MOSFET 211P are connected to each other not only by paths using wiring lines provided in the multilayer wiring line layer 310. Although details are hereinafter described, "direct joining of the wiring line layers, that is, transistor connecting wiring line layers, provided on the first and second substrates to each other" is a characteristic matter of the present embodiment. More particularly, the transistors are mutually connected to each other by the direct joining of the wiring line layers and also by means of the multilayer wiring line layer 310.

The transistor connecting wiring line layers are a wiring ling group layered upon formation of the first and second substrates and are used for internal connection between nodes in the CMOS inverter circuit. In this connection, a transistor connecting wiring line layer is a kind of "local wiring line layer."

Figure 41:
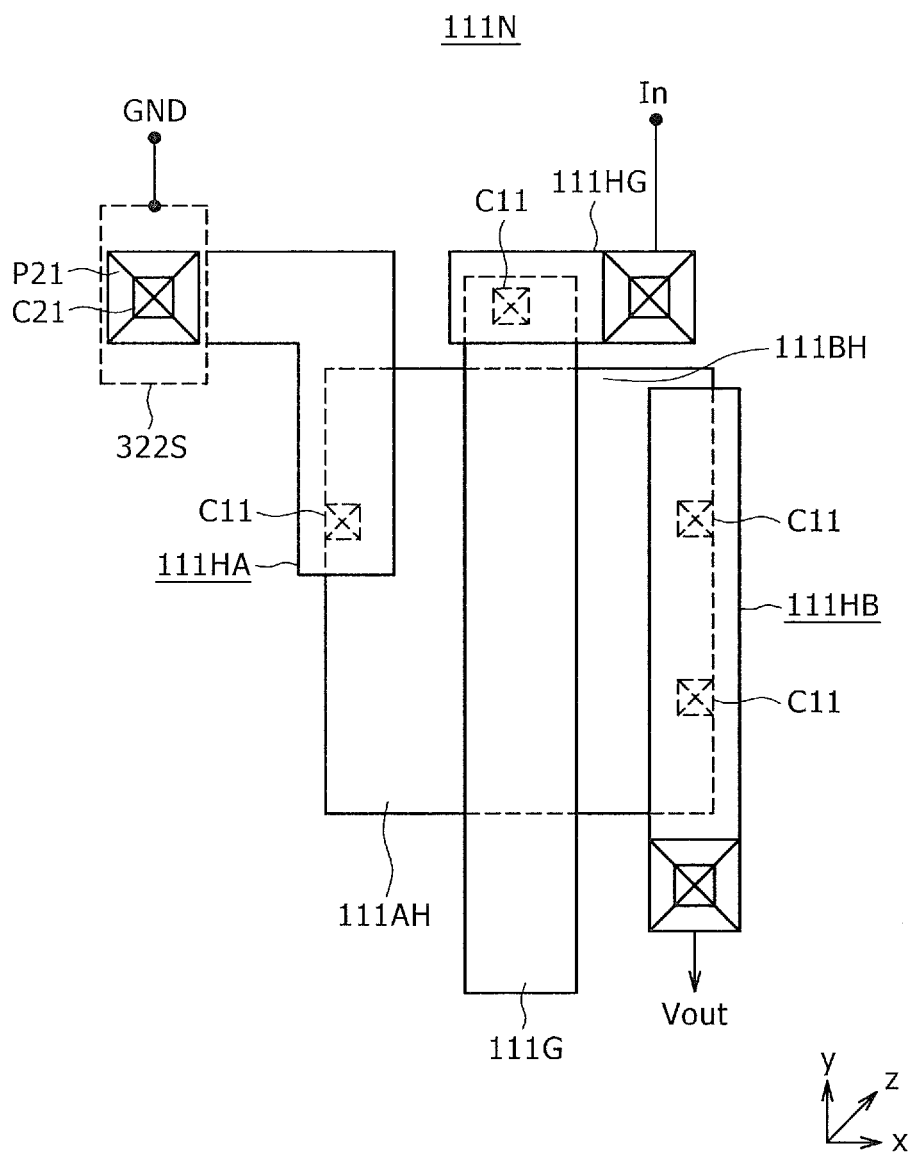
FIG. 41 is a schematic view showing essential part of an n-type MOSFET which configures part of the semiconductor device of FIG. 39.
Figure 42:
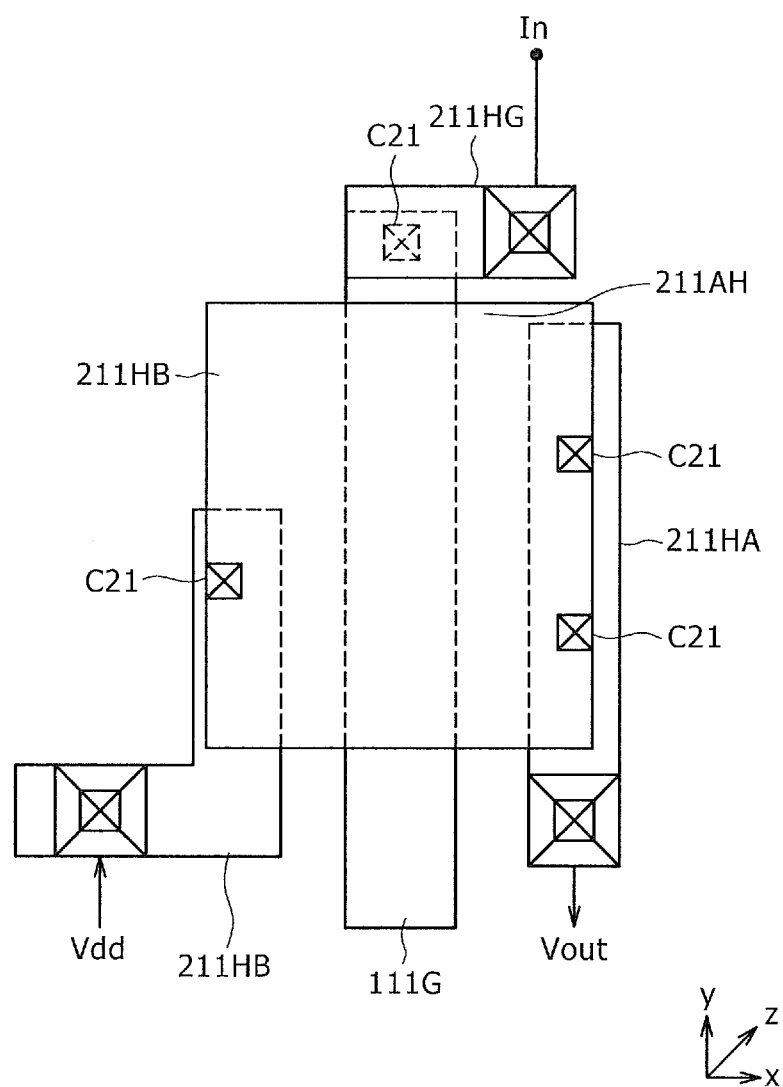
FIG. 42 is a schematic view showing essential part of a p-type MOSFET which configures part of the semiconductor device of FIG. 39.

FIG. 41 shows essential part of the n-type MOSFET which configures part of the semiconductor device in the embodiment 10. FIG. 42 shows essential part of the p-type MOSFET which configures part of the semiconductor device in the embodiment 10.

In FIGS. 39, 41 and 42, a local wiring line layer formed in advance on a substrate in order to connect the n-type MOSFET 111N and the p-type MOSFET 211P to each other is indicated by a thin solid line similar to that used to indicate a gate electrode. However, profiles of portions of members in a lower layer covered with an upper layer are indicated by thin broken lines. Meanwhile, as regards one of layers of the multilayer wiring line layer 310 as a global wiring line layer, particularly the lowermost layer, a thick broken line is used.

A-1. n-Type MOSFET 111N

Referring to FIG. 41, the n-type MOSFET 111N includes a gate electrode 111G.

The gate electrode 111G is connected to a transistor connecting wiring line layer, that is, a wiring line layer 111HG, through a contact C11 formed in a flattening film 131 as shown in FIG. 40.

Referring to FIG. 41, the contact C11 is formed at one end portion in the y direction of the gate electrode 111G positioned on the element isolation layer on the outer side with respect to a region in which a channel is formed. The wiring line layer 111HG is formed in a rectangular shape having a long side extending along the x direction and is connected at one end portion thereof in the x direction to the gate electrode 111G through the contact C11.

A pair of transistor connecting wiring line layers, that is, wiring line layers 111HA and 111HB, are disposed in a partly overlapping relationship with a pair of source-drain regions, that is, the source-drain regions 111AH and 111BH. The wiring line layer 111HA has a rectangular portion having a dimension in a lengthwise direction which is smaller than that of the wiring line layer 111HB.

More particularly, the rectangular portion of the wiring line layer 111HA extends in the negative side in the y direction from the positive side in the y direction and overlaps, as viewed in plan, with a portion a little smaller than one half the dimension of the source-drain region 111AH.

In contrast, the wiring line layer 111HB extends from the negative side to the positive side in the y direction and to a place in front of the positive side end of the source-drain region 111BH in the y direction.

The wiring line layer 111HA is a wiring line layer on the ground or source side, and the wiring line layer 111HB is a wiring line layer on the output or drain side.

As seen in FIGS. 40 and 41, the wiring line layer 111HA is connected to the source-drain region 111AH through a contact C11. Similarly, the wiring line layer 111HB is connected to the source-drain region 111BH through another contact C11.

A-2. p-Type MOSFET 211P

Referring now to FIG. 42, the p-type MOSFET 211P includes a gate electrode 211G.

The gate electrode 211G is connected to a transistor connecting wiring line layer, that is, a wiring line layer 211HG, through a contact C21 formed in a flattening film 231 shown in FIG. 40.

In FIG. 42, the contact C21 is formed at one end portion in the y direction of the gate electrode 211G positioned on the element isolating layer on the outer side with respect to a region in which a channel is formed. The wiring line layer 211HG is formed in a rectangular shape having a long side extending along the x direction and is connected at one end portion thereof in the x direction to the gate electrode 211G through the contact C21.

As seen in FIG. 42, a pair of transistor connecting wiring line layers, that is, wiring line layers 211HA and 211HB, are disposed in a partly overlapping relationship with a pair of source-drain regions, that is, the source-drain regions 211AH and 211BH.

More particularly, the wiring line layer 211HB extends at the rectangular portion thereof toward the positive side in the y direction from the negative side in the y direction and overlaps, as viewed in plan, in a region a little smaller than one half the dimension of the source-drain region 211BH in the y direction.

In contrast, the wiring line layer 211HA extends to the positive side from the negative side in the y direction and to a place in front of the positive side end of the source-drain region 211AH in the y direction.

The wiring line layer 211HB is a Vdd or source side wiring line layer, and the wiring line layer 211HA is an output or drain side wiring line layer.

As seen in FIGS. 40 and 42, the wiring line layer 211HA is connected to the source-drain region 211AH through a contact C21. Similarly the wiring line layer 211HB is connected to the source-drain region 211BH through another contact C21.

A-3. Direct Joining of Wiring Line Layers

As seen in FIG. 40, the wiring line layer 111HB and the wiring line layer 211HA on the output or drain side are directly joined together.

Further, the wiring line layer 111HG and the wiring line layer 211HG on the gate side are directly joined together.

It is to be noted that, although the wiring line layer 111HA and the wiring line layer 211HB on the source side shown in FIG. 40 look such that they contact within each other in the sectional view, actually since they are formed in a spaced relationship from each other as viewed in plan, they do not "directly joined together."

Further, while, in FIG. 40, the wiring line layers which are "directly joined together" preferably are the first wiring line layers of the substrates, they may otherwise be the second or other wiring line layers.

In the present embodiment, at least one terminal of a FET of the first substrate 101, that is, the gate electrode or the source-drain region is connected to a wiring line layer provided on a face at which another substrate is bonded through a contact. Further, at least one of the terminals of a FET of the second substrate 201 is connected to a wiring line layer provided on a face at which another substrate is bonded through a contact. Further, the corresponding wiring line layers, that is, the transistor connecting wiring line layers, are directly joined together upon bonding.

It is to be noted that "direct joining" signifies that wiring line layers are directly joined together without the intervention of a contact, and this permits that, for example, a thin reduced-resistance layer is formed by a surface treatment of a joining face and join the joining face through the thin reduced-resistance layer in order to reduce the series resistance upon joining.

Further, while the wiring line layers which are directly joined together preferably are the first wiring line layers of the substrates positioned nearest to the transistors, they may otherwise be the second or other wiring line layers. In other words, the "transistor connecting wiring line layer" signifies a wiring line layer electrically connected to a transistor in a wiring line structure formed on each of the substrates.

Although the wiring line layers 111HB and 111HG of the first substrate 101 side and the wiring line layers 211HA and 211HG of the second substrate 201 side may be formed from different conductive materials, preferably they are formed from the same conductive material.

As the conductive materials to be joined, copper and copper (Cu to Cu) or aluminum and aluminum (Al to Al) can be listed favorably. Further, copper or aluminum containing some other metal such as, for example, tantalum (Ta), titanium (Ti) or tungsten (W) may be used.

The wiring line layers are not necessarily formed from a single layer but may be structured such that they are formed by layering two or more layers.

A-4. Some of a Plurality of Wiring Line Layers which Configure the Multilayer Wiring Line Layer 310 (Refer to FIGS. 39 to 42), Particularly the Lowermost Wiring Line Layer Such as the Wiring Line Layer 321H Referring to FIGS. 39 to 41, contacts C21 extending through the flattening film 231 are connected to the wiring line layer 211HB. Further, connection vias P21 formed in an element isolation layer 210 of the second substrate 201 is connected to an end face of the contacts C21. The wiring line layer 211HB is connected to a wiring line layer 322H of an upper layer through the contacts C21 and the connection vias P21.

Similarly, the wiring line layer 211HA is connected to the wiring line layer 321H of the upper layer through contacts C21 and connection vias P21.

Similarly, the wiring line layer 211HG is connected to a wiring line layer 322G of an upper layer through another contact C21 and another connection via P21.

Though not shown in FIG. 40, a wiring line layer 322S (refer to FIGS. 39 and 41) is provided in the same layer as the wiring line layer 322H and so forth. The wiring line layer 111HA is connected to the wiring line layer 322S of an upper layer through a contact C21 and a connection via P21.

It is to be noted that, although the contact C21 and the connection via P21 may otherwise be formed as a single connection via, since there is no necessity to form a via of the substrate penetration type of a high aspect, the connection structure of the contact C21 and the connection via P21 is preferably used. However, as hereinafter described, if the second substrate 201 is formed in a SOI structure and is reduced in thickness, then a connection from wiring line layers directly joined together to the lowermost wiring line layer of the multilayer wiring line layer 310 may be established by a single connection via.

B. Fabrication Method

FIGS. 43A to 47 illustrate different stages of a fabrication method of the semiconductor device according to the embodiment 10.

Figure 43A:
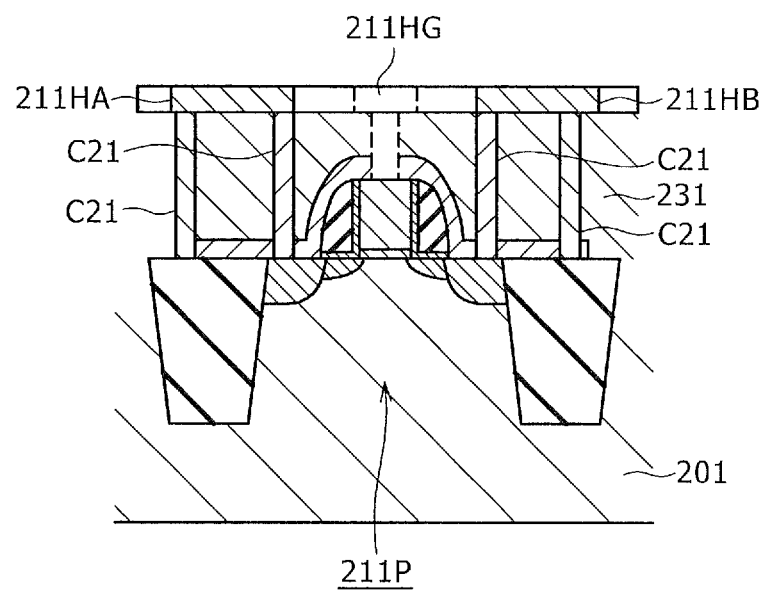
Figure 43B:
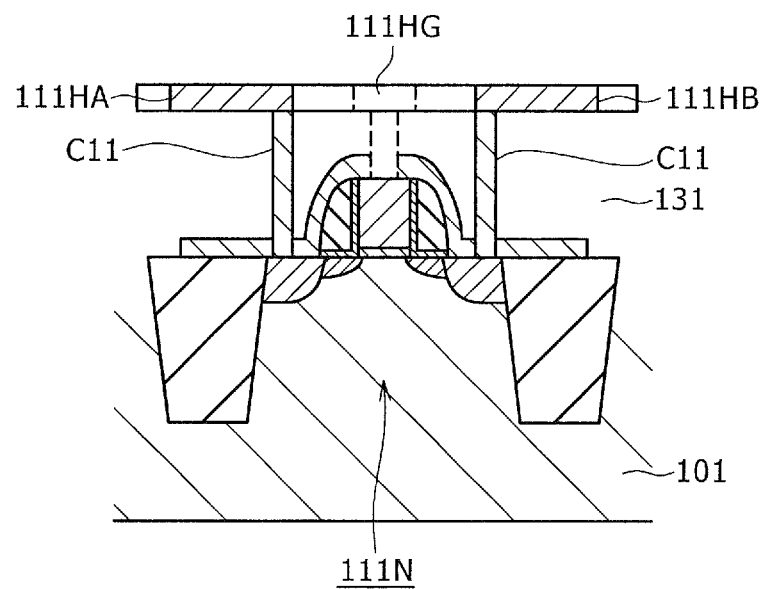

FIG. 43A shows a second substrate 201 on which a p-type MOSFET 211P is formed while FIG. 43B shows a first substrate 101 on which an n-type MOSFET 111N is formed.

FIGS. 43A and 43B show a section taken along plane X41-X42 of FIG. 39 similarly to FIG. 40.

FIGS. 43A and 43B correspond to FIGS. 9 and 10, respectively, and illustrate that steps until a contact C11 or C21 is formed in a flattening film 131 or 231 by a method similar to that described hereinabove with reference to FIGS. 9 and 10.

At the contact formation step in this instance, a number of contacts C21 greater than that in the first substrate 101 are formed in advance on the second substrate 201 side in FIG. 43A. Those contacts which are formed similarly in the first substrate 101 and the second substrate 201 are the contacts C11 and C21 in the source-drain regions in a large square shown at the center in FIG. 39. Meanwhile, those contacts C21 which are formed by a greater number in the second substrate 201 than in the first substrate 101 are the contacts C21 at four places corresponding to wiring line layer positions of an upper layer surrounded by thick lines in FIG. 39.

Then, wiring line layers for direct joining, that is, wiring line layers 211HA and 211HB and so forth, are formed on the flattening film 231 of the second substrate 201 by a Damascene interconnect process. Similarly, wiring line layers for direct joining, that is, wiring line layers 111HA and 111HB, are formed on the flattening film 131 of the first substrate 101 by a Damascene interconnect process.

In the Damascene interconnect process, openings are formed in the interlayer insulating film formed on the flattening film 131 or 231 such that they extend in the thicknesswise direction through the interlayer insulating film. Then, a conductive material is filled into the openings and is ground and polished from the surface so as to flatten the surface. Consequently, the conductive material is separated for the individual openings to make wiring line layers.

Figure 44:
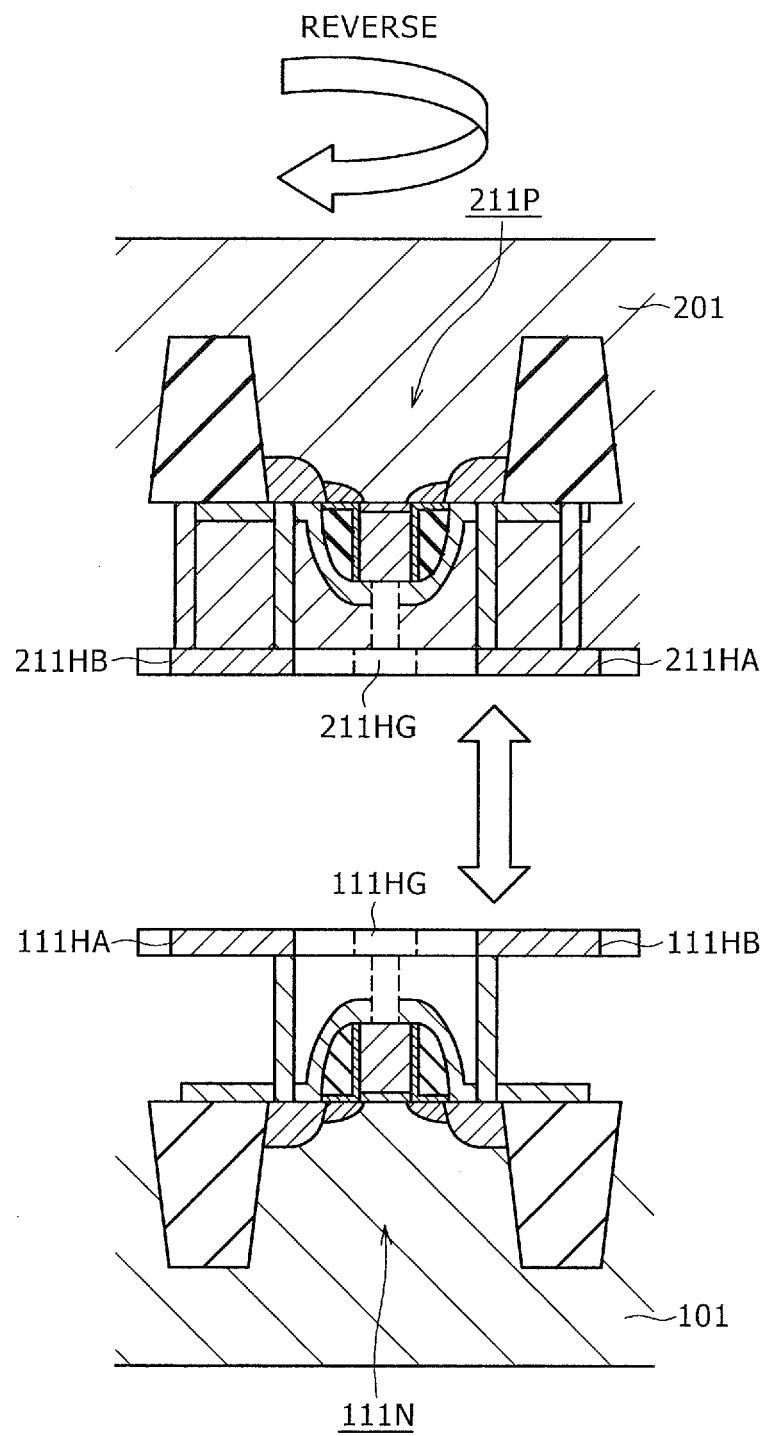

Thereafter, the second substrate 201 is reversed upside down and is bonded to the first substrate 101 with the wiring line layers for direct joining contacted with each other as seen in FIG. 44. A thin conductive film or conductive agent may be interposed between the joining faces of the second substrate 201 and the first substrate 101. For good joining, suitable heating, pressurization, plasma application, high frequency vibration application or the like can be carried out suitably.

Figure 45:
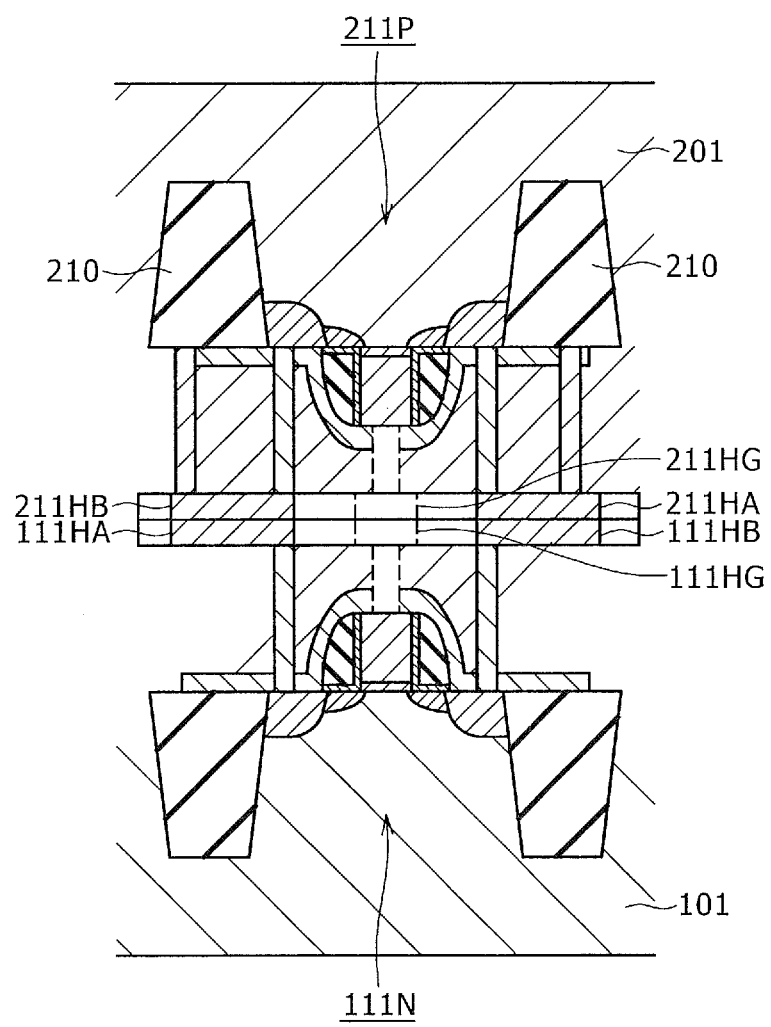

The second substrate 201 and the first substrate 101 in a stage after bonded to each other are shown in FIG. 45. The wiring line layer 111HB of the first substrate 101 side contacts with low resistance with the wiring line layer 211HA of the second substrate 201 side to establish electric connection between them. Further, the wiring line layer 111HG of the first substrate 101 side contacts with low resistance with the wiring line layer 211HG of the second substrate 201 side to establish electric connection between them.

Figure 46:
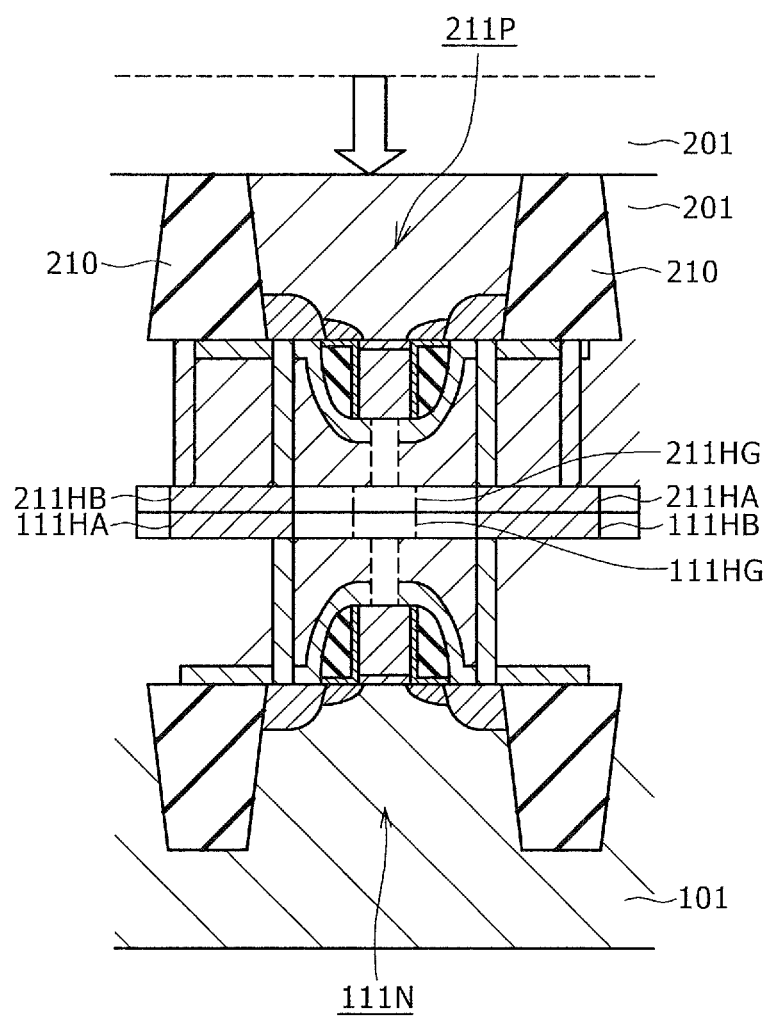

Thereafter, the second substrate 201 is ground and polished from the rear face side to convert the same into a thin layer as seen in FIG. 46. In chemical-mechanical polishing (CMP) or the like, the element isolation layer 210 may possibly serve as a stopper. It is to be noted that, in the case where the element isolation layer is formed by STI, if an insulating substance is filled into a trench after a stopper film for polishing is formed on the bottom of the trench, then polishing can be stopped with a high degree of accuracy at a point of time at which the stopper film for polishing is exposed.

Figure 47:
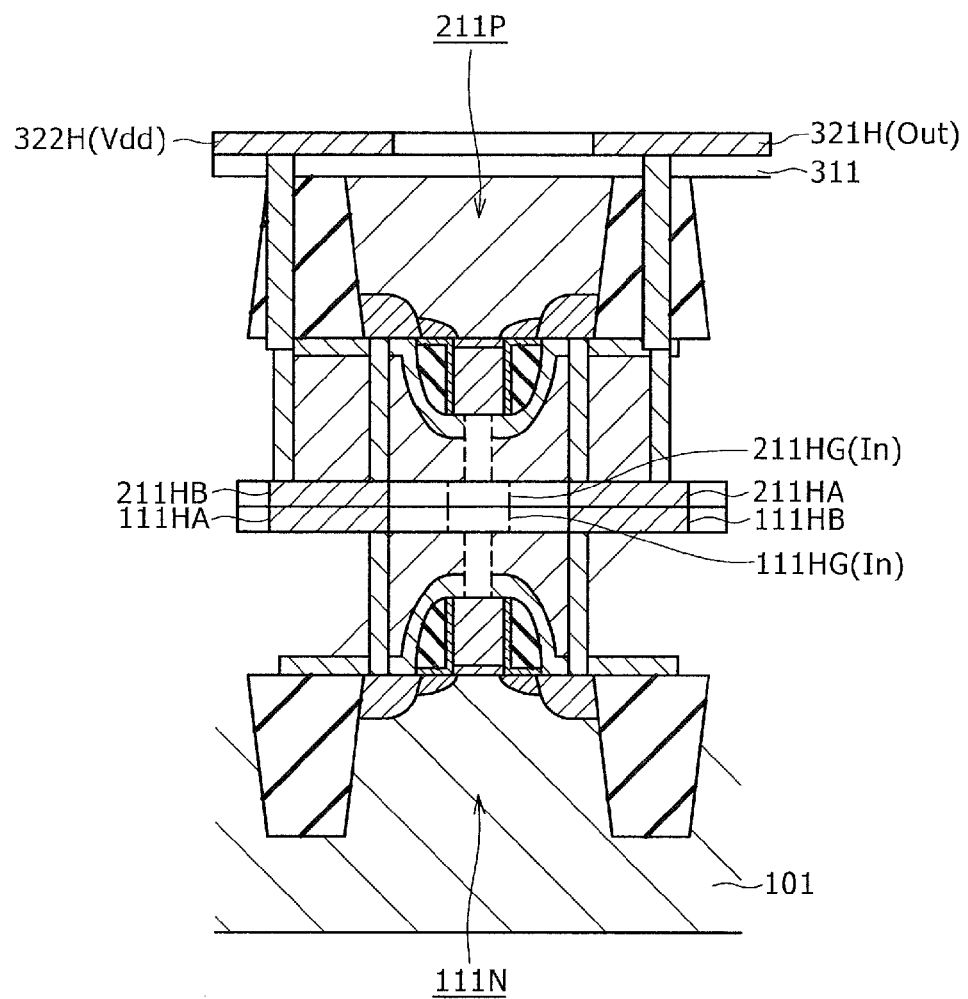

Then, a silicon oxide film of, for example, 10 to 50 nm thick is formed as an insulating layer 311 of the first layer on the polished face as seen in FIG. 47.

Then, a hole which extends through the second substrate 201 of the reduced thickness in the thicknesswise direction from the surface of the insulating layer 311 is formed. Such through-holes are provided at four locations corresponding to the positions at which wiring line layers of an upper layer indicated by a thick broken line in FIG. 39 are formed, that is, at locations of reference character P21. Such through-holes are preferably formed a little greater so that the top portion of the contacts C21 in the lower layer may be exposed therethrough. Accordingly, the through-holes have a comparative low aspect ratio and can be configured readily.

The through-holes formed in this manner are filled with a conductive semiconductor material or metal material, and then surplus material is removed. As a result, connection vias P21 of the substrate penetration type are obtained.

The wiring line layer of the first layer in the multilayer wiring line layer 310 is formed while suitably establishing a connection to the formed connection vias P21. Consequently, four wiring lines, that is, wiring lines 322G, 321H, 322H and so forth, indicated by a thick broken line in FIG. 39 are obtained.

Thereafter, contacts and second and other wiring line layers are formed so that matching with external terminals may be obtained on the uppermost layer of the multilayer wiring line layer 310 or a connection scheme to a different circuit not shown may be obtained. Fabrication in this instance may be carried out in accordance with an ordinary multilayer wiring process, thereby to complete a semiconductor device.

C. Conclusion

As described above, in the present embodiment, the n-type MOSFET 111N is provided on the first substrate 101 while the p-type MOSFET 211P is provided on the other second substrate 201. Further, the first substrate 101 and the second substrate 201 are bonded to each other to electrically connect the n-type MOSFET 111N and the p-type MOSFET 211P to each other.

Accordingly, also with the present embodiment, enhancement of the fabrication efficiency, reduction of the cost and enhancement of the reliability of the device can be implemented readily similarly as in the other embodiments.

Particularly, in the present embodiment, since the transistor connecting wiring line layers of the n-type MOSFET 111N and the p-type MOSFET 211P are directly joined together, the following advantages can be achieved.

In the case where the n-type MOSFET 111N and the p-type MOSFET 211P are connected to the multilayer wiring line layer 310 through contacts of a high aspect ratio as in the case of the embodiment 1 and so forth, two contacts are required in pair, and therefore, the area increases as much.

In contrast, in the present embodiment, after direct joining, only it is necessary to basically use a single contact to connect the n-type MOSFET 111N and the p-type MOSFET 211P to the multilayer wiring line layer 310 of an upper layer, and the contact disposition space can be reduced by one contact. Since the reduction of the contact disposition state by one contact is achieved by the gate and the drain, in the case of an inverter circuit, it is possible to reduce the space for two contacts.

It is to be noted that, although it looks in FIG. 40 that two contacts C21 are disposed in pair, this is because the section shown in FIG. 40 is taken along a complicated polygonal line, that is, along line X41-X42, of FIG. 39. As seen in FIG. 39, as regards the contact on the drain side, two contacts are disposed in a substantially juxtaposed relationship on a substantially linear line in the y direction because there is a sufficient room for the disposition space. However, since the two contacts occupy a contact space for one contact in the x direction, the area can be reduced in comparison with the embodiment 1.

Further, another advantage of the direct joining is that enhancement and stability in circuit characteristic are obtained.

Particularly, the present technology can be applied suitably to a circuit which requires circuit connection of the gates to each other as in the case of an inverter circuit. By this application, an input characteristic of the inverter is enhanced and stabilized. Further, in the case of an inverter, since a p-type MOSFET and an n-type MOSFET operate differentially, if the drains are connected to each other at a place as near as possible to the MOSFETs and are used as an output node, then operation is liable to be stabilized. Also characteristic enhancement by wiring line delay suppression can be anticipated with regard to both of the input and the output.

Since the inverter is a base of all logic circuits and a very great number of inverters are used, a significant effect can be anticipated with an integrated circuit, that is, a semiconductor device.

<Embodiment 11>

A. Device Configuration

Figure 48:
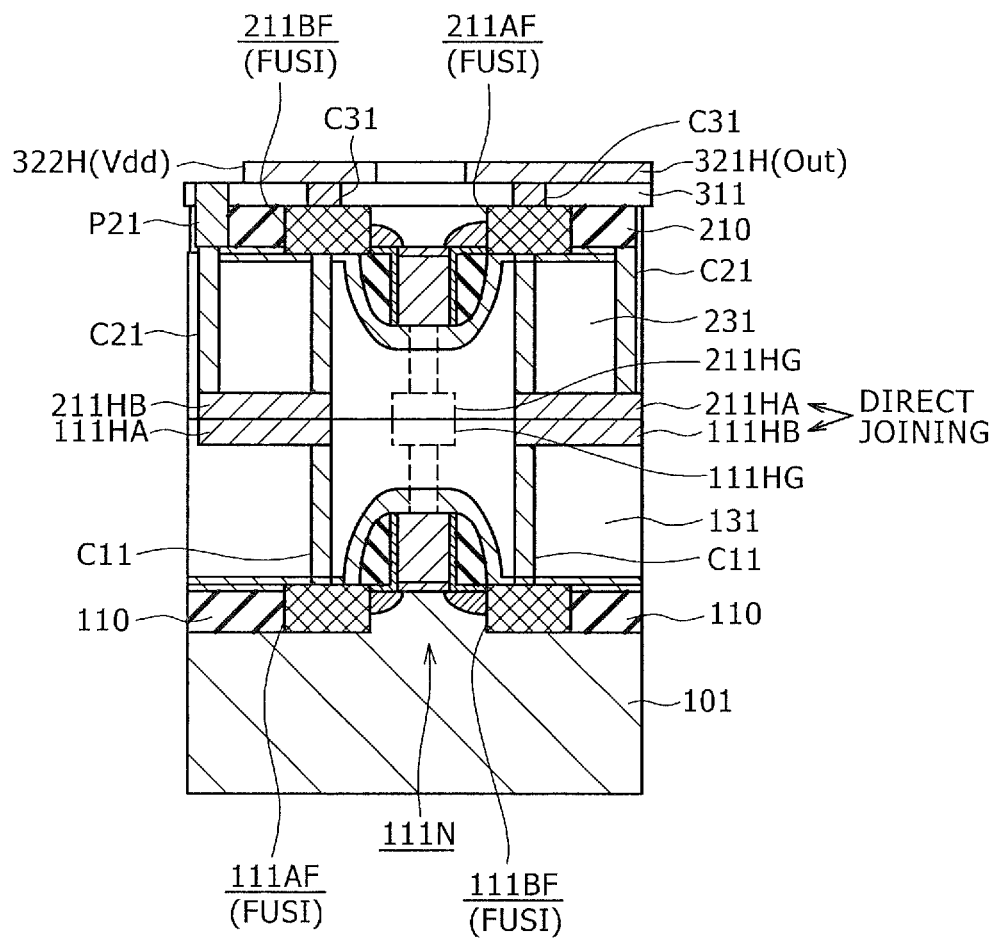
FIG. 48 is a schematic cross sectional view taken along plane X41-X42 of FIG. 39 but showing essential part of a semiconductor device according to an embodiment 11.

FIG. 48 shows essential part of a semiconductor device according to an embodiment 11.

In particular, FIG. 48 shows a section taken along plane X41-X42 of FIG. 39 similarly to FIG. 40.

The present embodiment is different from the embodiments 1 to 10 described hereinabove in structure and material of the source-drain regions of MOSFETs.

In the sectional structure shown in FIG. 48, the source-drain regions in both of an n-type MOSFET 111N formed on a first substrate 101 and a p-type MOSFET 211P formed on a second substrate 201 have a FUSI (Full Silicide) structure. In the n-type MOSFET 111N, the source-drain regions of the FUSI structure are denoted by reference characters 111AF and 111BF with a character F added. In the p-type MOSFET 211P, the source-drain regions of the FUSI structure are denoted by reference characters 211AF and 211BF with a character F added.

The source-drain regions of the FUSI structure are formed by fully siliciding a silicon semiconductor region to the inside.

In FIG. 48, a SOI structure is preferably applied particularly to the second substrate 201 of the upper layer side together with the adoption of the FUSI structure. In this instance, the fully silicided source-drain regions are easy to connect and can contribute to reduction of the area because they can contact at both of an upper face and a lower face thereof.

An insulating layer 311 is formed in the fully silicided source-drain regions, that is, in the source-drain regions 211AF and 211BF, and contacts C31 are formed at necessary places. For the contacts C31, a contact made of metal such as copper or tungsten is suitably used.

Wiring line layers 321H and 322H which are the lowermost wiring line layers of the multilayer wiring line layer 310 (refer to FIG. 40) are formed on the insulating layer 311 on which the contacts C31 are suitably formed.

A wiring line layer 322H is a wiring line layer which applies a power supply voltage Vdd and is connected to the source-drain region 211BF, which is fully silicided and functions as the source of the p-type MOSFET 211P, through a contact C31. Meanwhile, since the wiring line layer 321H serves as an output (Out), it is connected to the fully silicided source-drain region 211AF, which functions as the drain of the p-type MOSFET 211P, through a contact C31.

It is to be noted that the connection via P21 can be used for application of the ground potential which is not shown in FIG. 48. Further, the connection via P21 can function as a relay via which passes merely as a vertical wiring line without being connected to an element in a certain substrate by multilayer configuration of a substrate hereinafter described.

The present embodiment is similar to the embodiment 10 except this point and relating points. Therefore, in the description of the present embodiment, overlapping configurations to those of the embodiment 10 is omitted herein to avoid redundancy.

Further, the full silicidation technology can be applied not only to the combination with direct joining by wiring lines upon bonding of substrates described hereinabove in connection with the embodiment 10 but can be combined also with any of the embodiments 1 to 9.

B. Fabrication Method

FIGS. 49A to 52 show different steps of a fabrication method of a semiconductor device according to the embodiment 11.

Figure 49A:
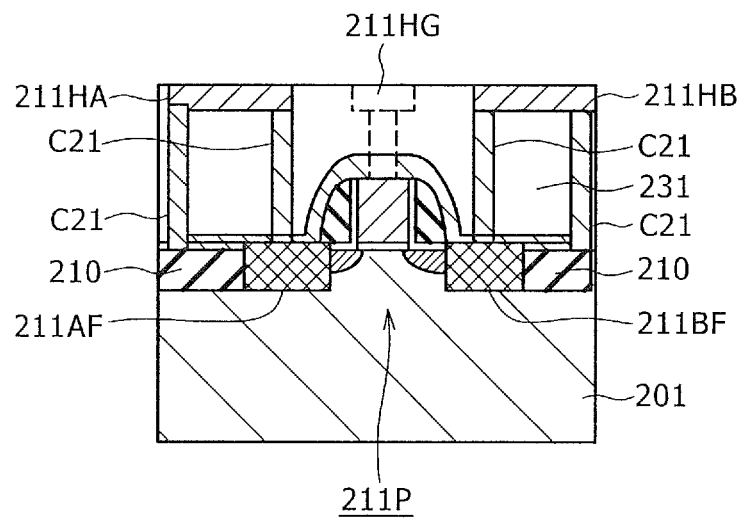
Figure 49B:
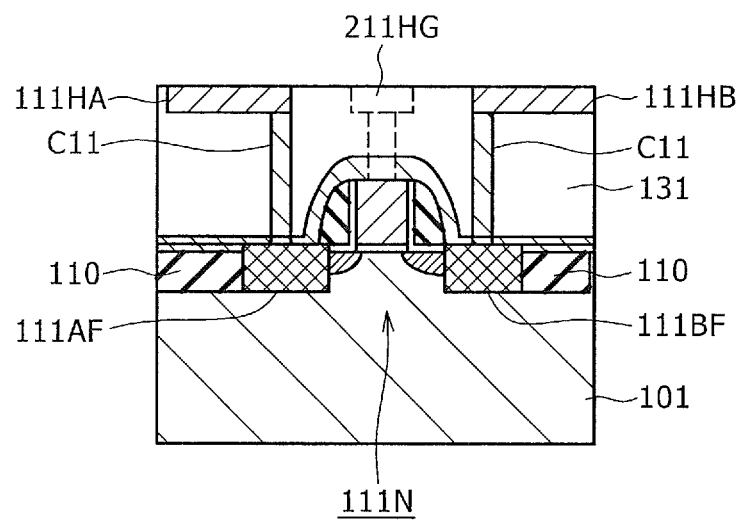

FIG. 49A shows a second substrate 201 on which a p-type MOSFET 211P is formed and FIG. 49B shows a first substrate 101 on which an n-type MOSFET 111N is formed.

FIGS. 49A and 49B show a section taken along plane X41-X42 of FIG. 39 similarly to FIG. 40.

FIGS. 49A and 49B correspond to FIGS. 9 and 10, respectively, and illustrate that steps until a contact C11 or C21 is formed in a flattening film 131 or 231 by a method similar to that described hereinabove with reference to FIGS. 9 and 10.

However, formation of source-drain regions is different from that in the embodiment 1 and so forth.

In the present embodiment, fully silicided source-drain regions, that is, source-drain regions 111AF and 111BF, are formed on the first substrate 101. Further, fully silicided source-drain regions, that is, source-drain regions 211AF and 211BF, are formed on the second substrate 201.

For example, after an element isolation layer, that is, an element isolation layer 110 or 210, is formed, a region in which a channel is to be formed is covered with a mask layer, that is, an insulating layer, and a high melting point metal is layered on the mask layer and the substrate region which is not covered with the mask layer. While the mask layer is left formed, the substrate region which is not covered with the mask layer is alloyed by heating. At this time, the substrate is heated until the silicon region, that is, the substrate region, which contacts with the high melting point metal is fully alloyed in the thicknesswise direction. At the portion of the substrate which is covered with the element isolation layer or the mask layer, alloying is not carried out, but only the silicon region, that is, the substrate region, which contacts with the high melting point metal, is alloyed. The fully silicided source-drain regions are formed thereby.

Thereafter, the MOSFET is completed by a method similar to that in the embodiment 1 and so forth, and a flattening layer, that is, a flattening film 131 or flattening film 231, is formed, and contacts, that is, contacts C11 or C21, are formed to flatten the surface.

At the contact formation step in this instance, a greater number of contacts C21 than that of the contacts C21 formed in the first substrate 101 are formed in advance in the second substrate 201 side shown in FIG. 49A. Those contacts which are formed similarly between the first substrate 101 and the second substrate 201 are the contacts C11 and contacts C21 in the source-drain regions in a large square shown at the center in FIG. 39. Meanwhile, those contacts C21 by which the contacts C21 are formed by a greater number in the second substrate 201 than in the first substrate 101 are the contacts C21 at the four places corresponding to the wiring line positions in the upper layer surrounded by thick lines in FIG. 39.

Then, wiring line layers for direct joining, that is, wiring line layers 211HA and 211HB, are formed on the flattening film 231 of the second substrate 201 by a method similar to that in the embodiment 10 in which a Damascene interconnect process is used. Similarly, wiring line layers for direct joining, that is, wiring line layers 111HA and 111HB, are formed on the flattening film 131 of the first substrate 101.

Figure 50:
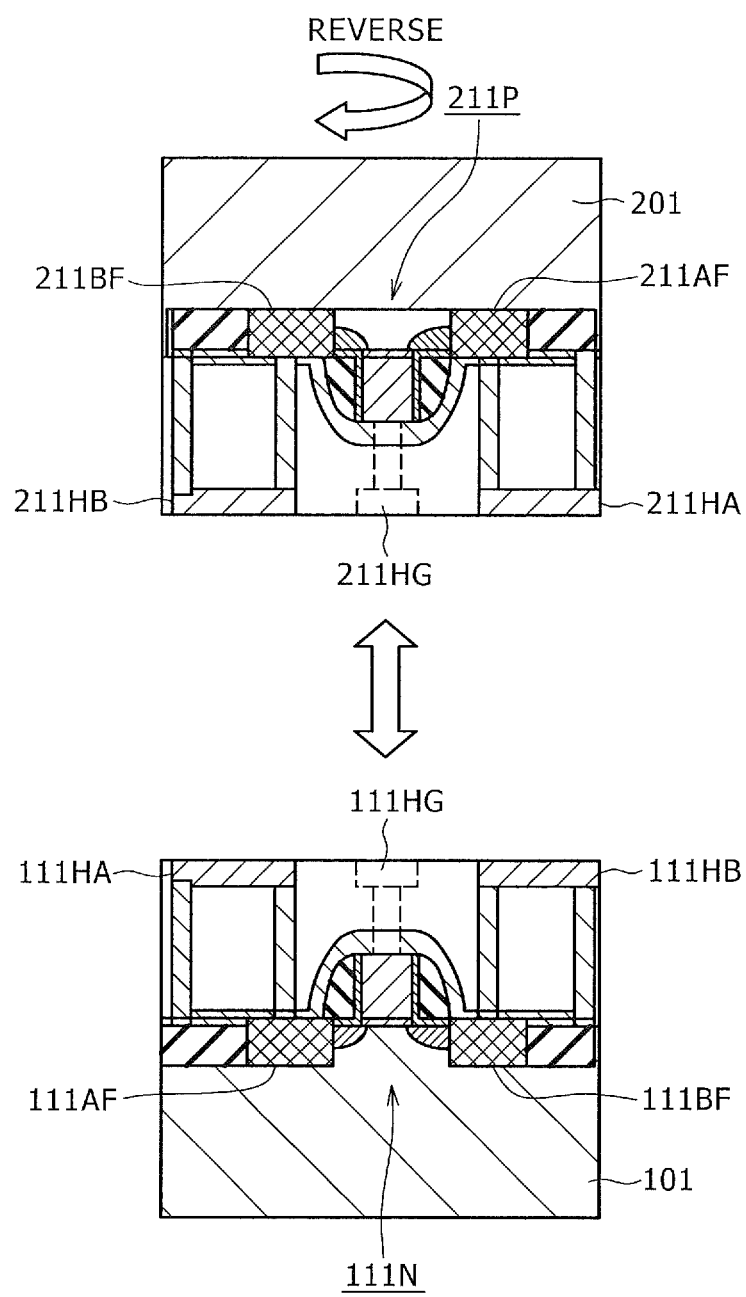

Then, the second substrate 201 is reversed upside down as seen in FIG. 50, and the second substrate 201 is bonded to the first substrate 101 with the wiring line layers for direction joining contacted with each other. A thin conductive film or conductive agent may be interposed between the joining faces. For good joining, suitable heating, pressurization, high frequency vibration application or the like may be carried out suitably.

By the bonding of the substrates, the wiring line layer 111HB of the first substrate 101 contacts with low resistance with the wiring line layer 211HA of the second substrate 201 side to establish electric connection therebetween. Further, the wiring line layer 111HG of the first substrate 101 side contacts with low resistance with the wiring line layer 211HG of the second substrate 201 to establish electric connection therebetween.

Figure 51:
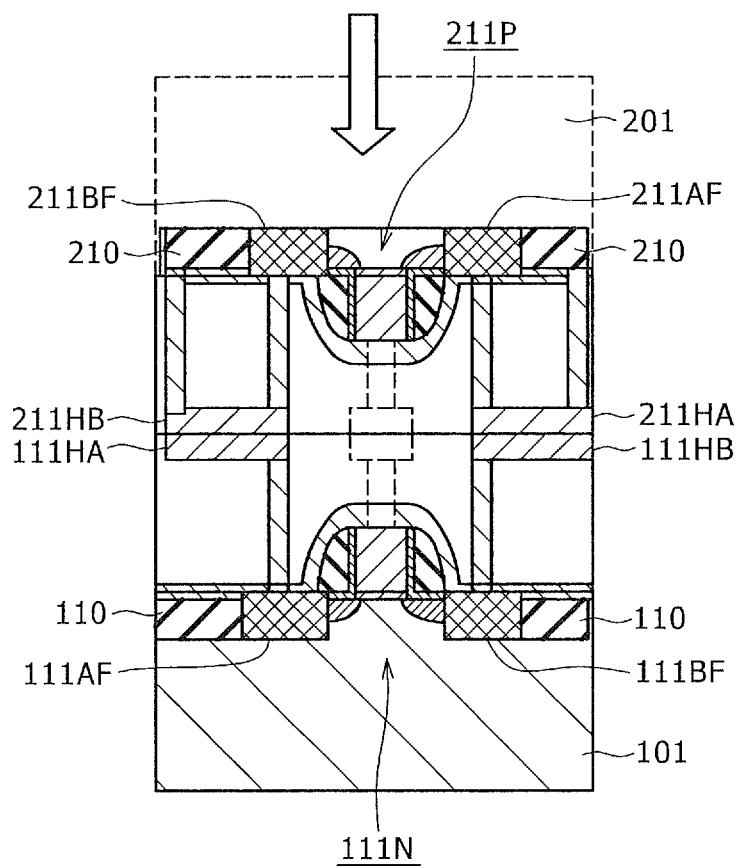

Thereafter, the second substrate 201 is ground and polished from the rear face side to thin the second substrate 201 as seen in FIG. 51. In chemical-mechanical polishing (CMP) or the like, the element isolation layer 210 or the fully silicided source-drain regions may possibly serve as a stopper. It is to be noted that, in the case where the element isolation layer is formed by STI, if an insulating substance is filled into a trench after a stopper film for polishing is formed on the bottom of the trench, then polishing can be stopped with a high degree of accuracy at a point of time at which the stopper film for polishing is exposed.

Figure 52:
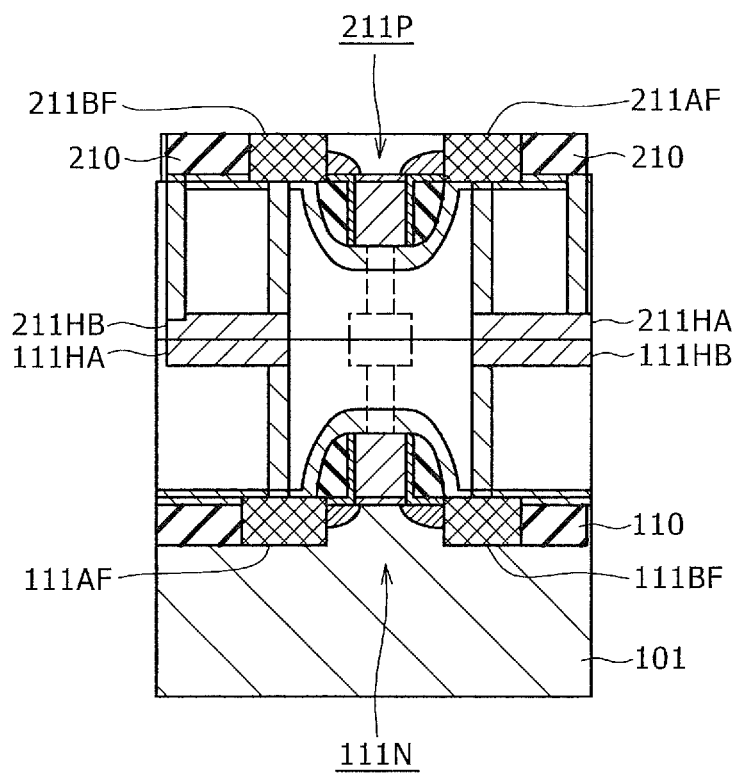

Then, in the state after the polishing illustrated in FIG. 52, a silicon oxide film of, for example, 10 to 50 nm thick is formed as an insulating layer 311 of the first layer on the polished face (refer to FIG. 48).

Then, holes extending from the surface of the insulating layer 311 to the fully silicided source-drain regions are formed and are filled with metal material to form contacts C31.

Further, as occasion demands, connection vias P21 are formed simultaneously. The contacts C31 and the connection vias P21 can be formed readily because they have a comparatively low aspect ratio.

A wiring line layer of the first layer in the multilayer wiring line layer 310 is formed while suitably establishing a connection to the contacts C31 and the connection vias P21 formed as described above.

Thereafter, contacts and second and other wiring line layers are formed so that matching with external terminals may be obtained on the uppermost layer of the multilayer wiring line layer 310 or a connection scheme to a different circuit not shown may be obtained. Fabrication in this instance may be carried out in accordance with an ordinary multilayer wiring process, thereby to complete a semiconductor device.

C. Conclusion

As described above, in the present embodiment, the n-type MOSFET 111N is provided on the first substrate 101 while the p-type MOSFET 211P is provided on the other second substrate 201 similarly as in the other embodiments. Further, the first substrate 101 and the second substrate 201 are bonded to each other to electrically connect the n-type MOSFET 111N and the p-type MOSFET 211P to each other.

Accordingly, also with the present embodiment, enhancement of the fabrication efficiency, reduction of the cost and enhancement of the reliability of the device can be implemented readily similarly as in the other embodiments.

Particularly, in the present embodiment, since the transistor connecting wiring line layers of the n-type MOSFET 111N and the p-type MOSFET 211P are directly joined together, the various advantages described hereinabove in connection with the embodiment 10 can be achieved. Since the advantages of this direct joining are described hereinabove, overlapping description of the same is omitted herein to avoid redundancy.

According to the present embodiment, since the source-drain regions are fully silicided, such a further advance as described below is achieved.

By forming the p-type MOSFET 211P in a FUSI structure, the connection between the wiring line layer of the lowermost layer of the multilayer wiring line layer 310 and the p-type MOSFET 211P can be established by a contact C31 on a fully-silicided source-drain region.

The advantage is described, for example, with reference to FIG. 39. In the case of the embodiment 10 shown in FIG. 39, for example, the wiring line layer 322H for supplying the power supply voltage Vdd to the source of the p-type MOSFET 211P has a contact on the outer side of the source-drain regions, which are indicated by a large rectangle substantially shown at the center in FIG. 39. In other words, the wiring line layer 211HB is wired in an L-shaped bent state, and a contact for supplying the power supply voltage Vdd is provided on a free end side of the L-shaped wiring line.

In contrast, in the present embodiment, the contacts C31 are disposed immediately above the fully silicided source-drain regions so that contacts for supplying the power supply voltage Vdd can be provided here. Therefore, the disposition space for the wiring line layer 211HB can be omitted, and reduction in size of the circuitry can be anticipated. This similarly applies also to the contacts from which an output is to be extracted.

It is to be noted that also a contact for supplying a voltage to the n-type MOSFET 111N of the lower layer such as, for example, a ground contact, can be disposed immediately above a fully silicided source-drain region. However, a relay via is disposed on the outside of the source-drain regions.

<12. Embodiment 12>

In an embodiment 12, the present disclosed technology is applied to a semiconductor device having the direct joining structure of wiring line layers of the embodiment 10, wherein the channel directions of two p-type and n-type MOSFETs extend orthogonally with each other. The relationship of the present embodiment 12 to the embodiment 10 is similar to that of the embodiment 6 to the embodiment 1.

Basic Structure of the MOSFETs

First, a basic structure of a MOSFET is described which has been devised to assure, in a direct joining structure of wiring line layers, a region in which the wiring line layers are joined together and another region in which the wiring line layers are not joined together.

Figure 53A:
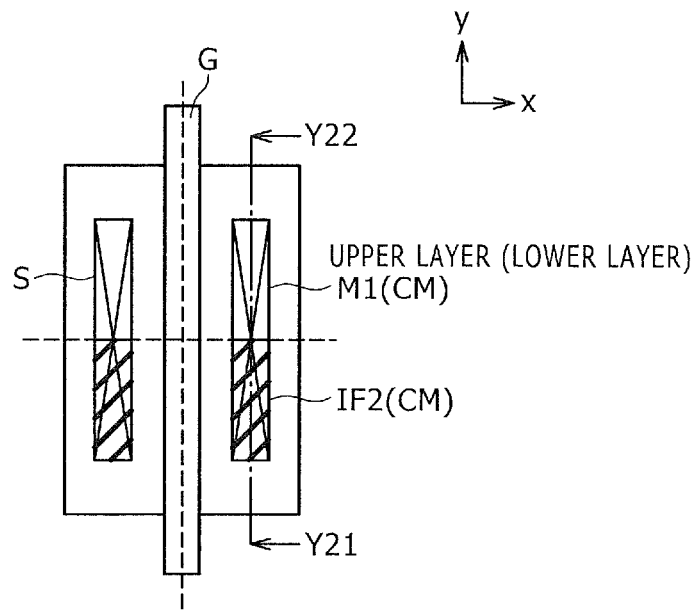
FIG. 53A is a schematic plan view showing a basic structure of a MOSFET of a semiconductor device according to an embodiment 12 and FIG. 53B is a schematic cross sectional view taken along line Y21-Y22 of FIG. 53A.
Figure 53B:
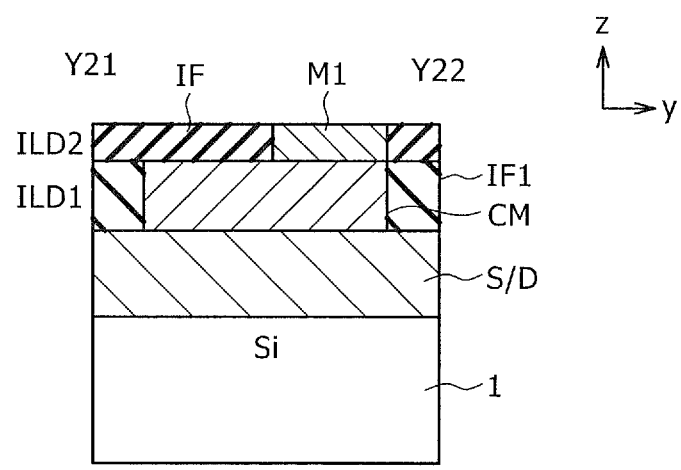

FIGS. 53A and 53B are a plan view and a sectional view, respectively, showing the basic structure. In particular, FIG. 53B shows a schematic section taken along line Y21-Y22 of FIG. 53A.

Referring to FIGS. 53A and 53B, a source-drain region S/D is formed on a substrate 1 of silicon or the like. A contact metal layer CM is formed on the source-drain region S/D. The contact metal layer CM is provided in place of the contact C11 or C21 described hereinabove in connection with the above-described embodiments. In other words, while a columnar contact having a small area is used in the foregoing embodiments, in the present embodiment, an elongated contact metal layer CM of a comparatively great area is used.

A flattening film, that is, an insulating film IF1, having a surface flattened together with the contact metal layer CM exists around the contact metal layer CM.

A wiring line layer M1 of the first layer formed by a Damascene interconnect process is disposed on the flattened face of the insulating film IF1 and the contact metal layer CM. The wiring line layer M1 is disposed in an overlapping relationship with part of the contact metal layer CM in the lengthwise direction, that is, in the y direction. Another insulating film IF2 having a thickness substantially equal to that of the wiring line layer M1 exists around the wiring line layer M1.

The structure shown in FIGS. 53A and 53B is formed on both of an n-type MOSFET and a p-type MOSFET. The wiring line layers M1 configure transistor connecting wiring line layers directly joined together between the two MOSFETs.

For example, it is assumed to place the p-type MOSFET in an upwardly and downwardly reversed state, that is, with the gate directed downwardly, on the n-type MOSFET. At this time, if the wiring line layer M1 portion of the p-type MOSFET is placed on the wiring line layer M1 portion of the n-type MOSFET, then direct joining of the wiring line layers is obtained. On the other, if the wiring line layer M1 portion of the p-type MOSFET is placed on the insulating film IF2 portion of the n-type MOSFET, then the wiring line layers have a non-joining state, that is, an isolated state.

In the embodiment 10 shown in FIG. 39, a joining state and a non-joining state are assured by patterns.

In contrast, in the present embodiment, a joining state or a non-joining state of the wiring line layers can be selected depending upon the manner of placement of patterns relative to each other or depending upon on which side in the lengthwise direction of the contact metal layer CM the wiring line layer M1 and the insulating film IF2 are provided.

A-1. Device Configuration 1 (Wherein the Channels Extend in Parallel) and Fabrication Method of the Same In a device configuration 1, when the two MOSFETS of the basic structure described above are placed one on the other, the channel directions of them are directed so as to be substantially parallel to each other. Also this configuration is one of embodiments of the present disclosed technology because direct joining of wiring line layers is utilized.

FIGS. 54A and 55B show essential part of the semiconductor device according to the device configuration 1 of the embodiment 12 in the order of fabrication steps.

In particular, FIGS. 54A and 54B individually show a p-type MOSFET and an n-type MOSFET, and FIG. 55B shows a completed form of the device configuration 1. Meanwhile, FIGS. 54C and 55A show the p-type MOSFET and the n-type MOSFET at different stages in the process of fabrication of the device configuration 1. It is to be noted that, in the figures in which two MOSFETs are placed one on the other, patterns formed on the two substrates are shown in a displaced relationship by a small distance from each other in the leftward and rightward direction, that is, in the x direction, and in the upward and downward direction, that is, in the y direction in order to assure high visibility, similarly as in the figures of the other embodiments.

Here, attention should be paid to how to read the views. FIGS. 54A to 54C are through-views from the first substrate side. In contrast, FIGS. 55A and 55B are similar views but further showing contacts and upper layer wiring lines. However, since also FIGS. 55A and 55B are basically through-views from the first substrate side, although the contacts and the upper layer wiring lines look as if they were placed one on another, actually they overlap with each other from the remote side of the planes of the figures.

Further, reference numerals in FIGS. 54A to 55B are basically same as those used for the embodiment 10. However, regarding contact portions, the following representations are used.

In particular, a film corresponding to the flattening film 131 shown in FIG. 40 is represented as "flattening film 131 (IF1)" in order to represent that the basic structure of FIGS. 53A and 53B is applied.

A layer corresponding to a contact C11 shown in FIG. 40 is represented as "contact C11(CM)" in order to represent that the basic structure of FIGS. 53A and 53B is applied. This similarly applied also to a contact C21.

A layer corresponding to the wiring line layer 111HB shown in FIG. 40 is represented as "wiring line layer 111HB (M1)" in order to represent that the basic structure of FIGS. 53A and 53B is applied. This similarly applies also to the other wiring line layers for direct joining.

Except the characteristic configurations described above, reference characters similar to those used in FIGS. 39 to 42 are used and overlapping description of the same is omitted herein to avoid redundancy.

If the p-type MOSFET 211P shown in FIG. 54A is placed on the n-type MOSFET 111N shown in FIG. 54B, then they exhibit such arrangement as shown in FIG. 54C.

At this time, the n-type MOSFET 111N and the p-type MOSFET 211P are isolated on the source side thereof from each other.

More particularly, as seen in FIGS. 54A and 54B, between the wiring line layer 111HA(M1) and the wiring line layer 211HB(M1), the position of the insulating film IF2 indicated by thick slanting lines in FIGS. 54A and 54B is different. In the wiring line layer 111HA(M1), the insulating film IF2 is positioned on the negative side in the y direction while, in the wiring line layer 211HB(M1), the insulating film IF2 exists on the positive side in the y direction. Therefore, when the wiring line layer 111HA(M1) and the wiring line layer 211HB(M1) are placed one on another, they are not short-circuited to each other.

On the other hand, the wiring line layer 111HB(M1) and the wiring line layer 211HA(M1) on the drain side are directly joined together over the overall area. Also the wiring line layer 111HG(M1) and the wiring line layer 211HG(M1) are directly joined together over the overall area.

Four contacts C21 are formed at different places in FIG. 55A, and a wiring line layer of the upper layer, that is, the wiring line layer 111HB or the like, is formed in FIG. 55B to complete the device configuration 1. Thereafter, multilayer wiring is carried out in a similar manner as in the embodiment 1 to complete the semiconductor device.

With the present embodiment, similar advantages to those achieved by the embodiment 10 can be achieved.

A-2. Device Configuration 2 (Wherein the Channels Extend Orthogonally) and Fabrication Method of the Same In a device configuration 2, when the two MOSFETS of the basic structure described above are placed one on the other, the channel directions of them are directed so as to be substantially orthogonally with each other.

FIGS. 56A to 57B show the semiconductor device according to the device configuration 2 of the embodiment 1 in the order of fabrication steps.

In particular, FIGS. 56A and 56B individually show a p-type MOSFET and an n-type MOSFET, and FIG. 57B shows a completed form of the device configuration 2. Meanwhile, FIGS. 56C and 57A show the p-type MOSFET and the n-type MOSFET at different stages in the process of fabrication of the device configuration 2. It is to be noted that, in the figures in which two MOSFETs are placed one on the other, patterns formed on the two substrates are shown in a displaced relationship by a small distance from each other in the leftward and rightward direction, that is, in the x direction, and in the upward and downward direction, that is, in the y direction in order to assure high visibility, similarly as in the figures of the other embodiments.

Here, it is assumed that the first substrate 101 having the n-type MOSFET 111N shown in FIG. 56B is rotated by 90° in the clockwise direction.

Under the assumption, the n-type MOSFET 111N shown in FIG. 56B has a wiring line layer 111HB(M1) disposed on the negative side in the x direction while the wiring line layer 111HA(M1) is disposed on the positive side in the x direction.

Attention should be paid to the fact that this relationship is reverse to that in FIG. 54B.

FIG. 56C shows the two MOSFETs placed one on the other after the rotation. It is to be noted here that some of the components shown in FIGS. 56A and 56B are omitted. In particular, the wiring line layers extending at a right angle from the gate electrodes are not shown. Further, although the wiring line layers disposed on the opposite sides of the gate electrodes and extending in parallel to each other are shown, the portions of the different wiring line layers extending at a right angle from the end portions of the wiring line layers are not shown.

The wiring line layer 111HB(M1) and the wiring line layer 211HA(M1) cross with and are joined to each other at a place indicated by a broken line circle in FIG. 56C to achieve a drain connection which serves as an output terminal Out. Further, at the other crossing portions at three places except the gate crossing portion, at least one of the wiring line layers has an insulating film IF2 indicated by thick slanting lines, and therefore, crossing by which the wiring line layers are isolated from each other is implemented.

FIG. 57A shows the MOSFETs after formation of contacts C21, and the wiring line layers omitted in FIG. 56B are shown in FIG. 57A.

Figure 59A:
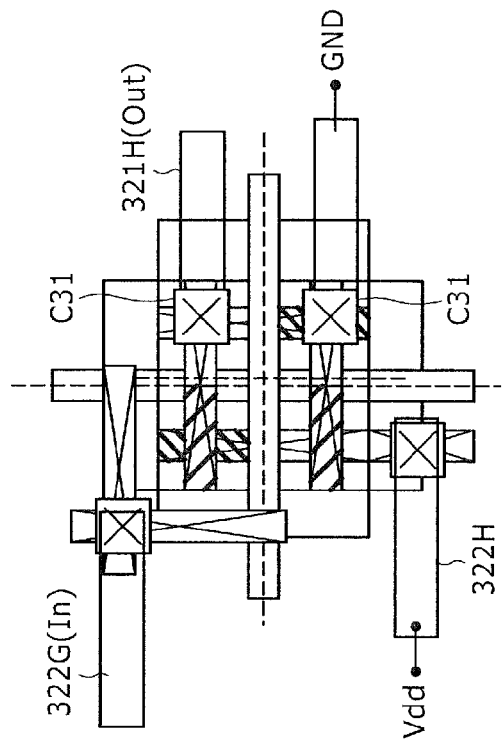
Figure 59B:
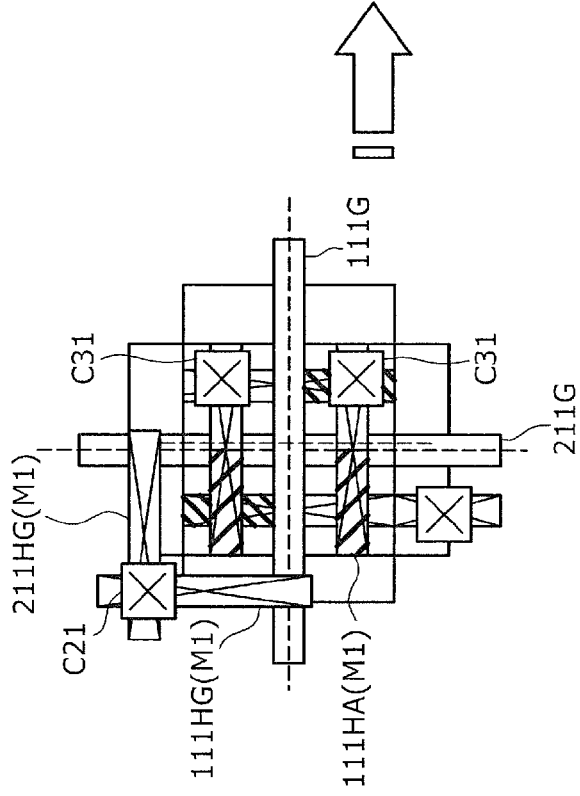

To the contacts C21 at the four places, corresponding wiring line layers, that is, a wiring line layer 321H and so forth, of the upper layer are connected as seen in FIG. 59B to complete the device configuration 2. Thereafter, multilayer wiring is carried out similarly as in the embodiment 1 to complete the semiconductor device.

In the present embodiment, similar advantages to those achieved by the embodiment 10 can be achieved.

Further, the present embodiment can achieve a layout which is tough against misalignment similarly to the embodiment 6.

In the device configuration 1 in which the channel directions extend in parallel to each other, if great misalignment appears in a widthwise direction of directly joined wiring line layers, then the junction resistance becomes high, and the possibility that a connection may not be able to be established cannot be denied.

In contrast, in the present device configuration 2, since crossing joining is applied, even if great misalignment occurs in both of the x direction and the y direction, joining of wiring line layers can be carried out favorably with low resistance.

A-3. Device Configuration 3 (which has a FUSI Structure) and Fabrication Method of the Same In a device configuration 3, when the two MOSFETS of the basic structure described above are placed one on the other, the channel directions of them are directed so as to be substantially orthogonal with each other similarly as in the device configuration 2.

FIGS. 58A to 59B show essential part of the semiconductor device according to the device configuration 3 of the embodiment 12 in the order of fabrication steps.

In particular, FIGS. 58A and 58B individually show a p-type MOSFET and an n-type MOSFET, and FIG. 59B shows a completed form of the device configuration 3. Meanwhile, FIGS. 58C and 59A show the p-type MOSFET and the n-type MOSFET at different stages in the process of fabrication of the device configuration 3. It is to be noted that, in the figures in which two MOSFETs are placed one over the other, patterns formed on the two substrates are shown in a displaced relationship by a small distance from each other in the leftward and rightward direction, that is, in the x direction, and in the upward and downward direction, that is, in the y direction in order to assure high visibility, similarly as in the figures of the other embodiments.

Here, it is assumed that the first substrate 101 having the n-type MOSFET 111N shown in FIG. 58B is rotated by 90° in the clockwise direction.

Under the assumption, the n-type MOSFET 111N shown in FIG. 58B has a wiring line layer 111HB(M1) disposed on the negative side in the x direction while the wiring line layer 111HA(M1) is disposed on the positive side in the x direction.

Attention should be paid to the fact that this relationship is reverse to that in FIG. 54B.

FIG. 58C shows the two MOSFETs placed one on the other after the rotation. It is to be noted here that some of the components shown in FIGS. 58A and 58B are omitted in FIG. 58C. In particular, the wiring line layers extending at a right angle from the gate electrodes are not shown in FIG. 58C.

The wiring line layer 111HB(M1) and the wiring line layer 211HA(M1) cross with and are joined to each other in FIG. 58C to achieve a drain connection which serves as an output terminal Out. Further, at the other crossing portions at three places except the gate crossing portion, at least one of the wiring line layers has an insulating film IF2 indicated by thick slanting lines, and therefore, crossing by which the wiring line layers are isolated from each other is implemented.

FIG. 59A shows the MOSFETs after formation of contacts C21, and the wiring line layers omitted in FIG. 58B are shown in FIG. 59A.

To the contacts C21 at the four places, corresponding wiring line layers, that is, the wiring line layer 321H and so forth, of the upper layer are connected as seen in FIG. 59B to complete the device configuration 2. Thereafter, multilayer wiring is carried out similarly as in the embodiment 1 to complete the semiconductor device.

In the present embodiment, similar advantages to those achieved by the embodiment 10 can be achieved.

Further, the present embodiment can achieve a layout which is tough against misalignment similarly to the embodiment 6.

In the device configuration 1 in which the channel directions extend in parallel to each other, if great misalignment appears in a widthwise direction of directly joined wiring line layers, then the junction resistance becomes high, and the possibility that a connection may not be able to be established cannot be denied.

In contrast, in the present device configuration 3, since crossing joining is applied, even if great misalignment occurs in both of the x direction and the y direction, joining of wiring line layers can be carried out favorably with low resistance.

Further, as described hereinabove in connection with the embodiment 11, by full silicidation, contacts C31 can be disposed immediately above the fully silicided source-drain regions, that is, above the source-drain regions 211AF and 211BF. Consequently, reduction of the area can be achieved in the arrangement of FIG. 59B in comparison with the arrangement of FIG. 57B in which the contacts C21 are disposed outside the source-drain regions to establish contact.

It is to be noted that the full silicidation can be applied also to the device configuration 1 in which the channel directions of the FETs extend in parallel to each other.

<13. Embodiment 13>

A. Device Configuration (FinFET)

Figure 60:
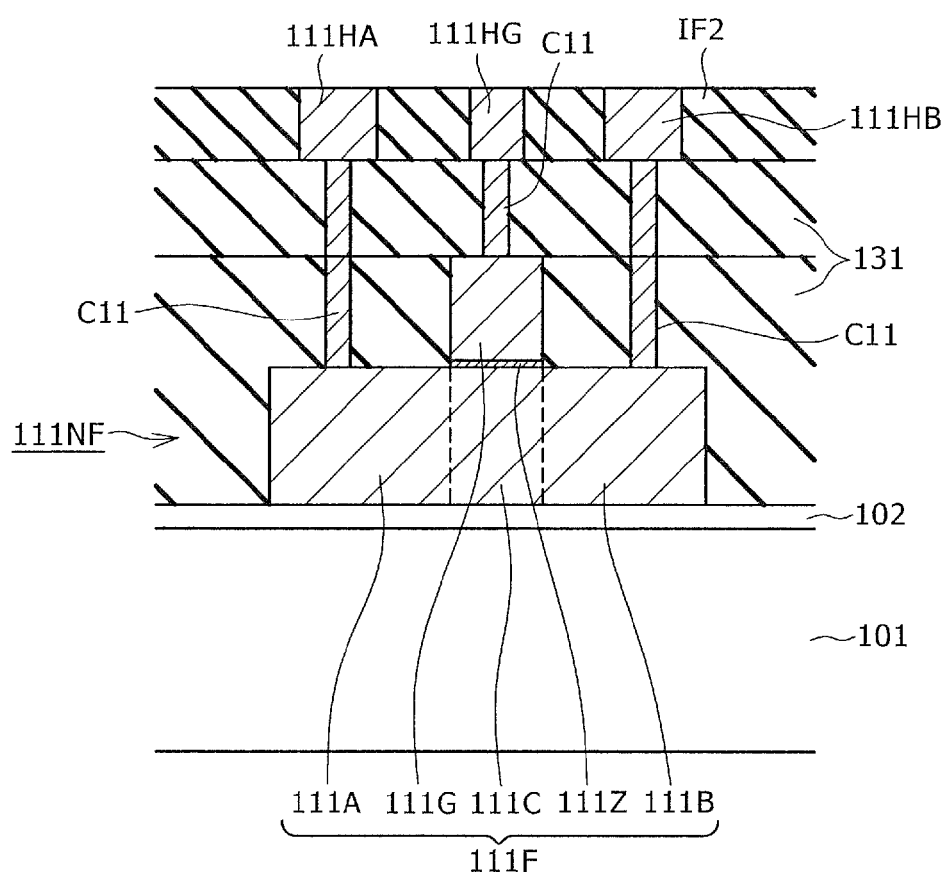
FIGS. 60 and 61 are a schematic sectional view and a perspective view, respectively, showing essential part of a semiconductor device according to an embodiment 13.
Figure 61:
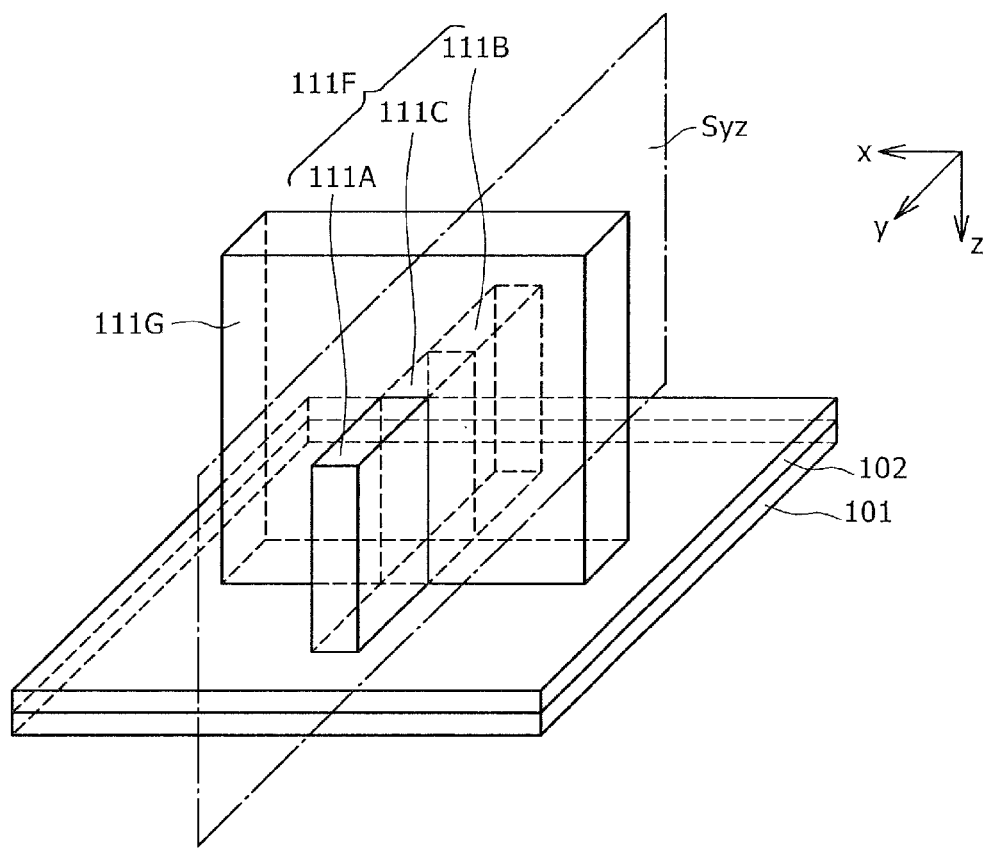

FIGS. 60 and 61 show essential part of a basic device, that is, a FinFET, of a semiconductor device according to an embodiment 13.

In particular, FIG. 60 is a sectional view showing one FIN type MOSFET, that is, a FinFET, which is formed on a substrate on one side of the semiconductor device of FIG. 40 or the like. Elements having like functions to those of FIG. 40 are denoted by like reference characters and overlapping description of the same is omitted herein to avoid redundancy.

FIG. 61 is a perspective view of the FinFET, and a plane Sxy shown in FIG. 61 corresponds to the section of FIG. 60. It is to be noted that, in FIGS. 60 and 61, the shape such as the width or the like of the elements is suitably modified for the convenience of illustration.

Referring to FIGS. 60 and 61, in the semiconductor device of the present embodiment, the configuration of an n-type FET 111NF is different from that in the other embodiments. The present embodiment is similar to the embodiments 10 and 11 except the point just described and associated points. Therefore, description of those elements in the present embodiment which are common to those of the embodiments 10 and 11 is suitably omitted herein to avoid redundancy. It is to be noted that also a p-type FET 211PF is formed in a configuration similar to that of the n-type FET 111NF.

The n-type FET 111NF is a FIN type field effect transistor, that is, a FinFET, as seen in FIGS. 60 and 61.

In particular, the n-type FET 111NF has a FIN 111F and a gate electrode 111G as seen in FIGS. 60 and 61.

In the n-type FET 111NF, the FIN 111F is a semiconductor active layer and includes a pair of source-drain regions 111A and 111B provided in such a manner as to sandwich a channel region 111C therebetween as seen in FIGS. 60 and 61. Here, the FIN 111F extends in the y direction and includes the channel region 111C and the paired source-drain regions 111A and 111B provided in a juxtaposed relationship with each other in the y direction. For example, the FIN 111F is 20 to 100 nm thick and 5 to 20 nm wide.

Further, in the n-type FET 111NF, the gate electrode 111G is provided such that it crosses orthogonally with the FIN 111F in the channel region 111C as shown in FIG. 61. In other words, the gate electrode 111G is provided so as to extend in the x direction. As seen in FIG. 60, the gate electrode 111G is provided such that a gate insulating film 111Z is interposed between the gate electrode 111G and the FIN 111F. The gate electrode 111G is provided such that it projects in a convex manner, for example, with a thickness of 5 to 30 nm from an upper face of the FIN 111F.

The n-type FET 111NF provided in such a manner as described above is formed on the first substrate 101 with the insulating film 102 interposed therebetween. Therefore, the n-type FET 111NF is a device dielectrically isolated from the substrate similarly to the SOI and having low parasitic capacitance. Therefore, the FinFET can be formed on a SOI substrate formed at a predetermined depth from the surface of a dielectric isolation film (BOX layer) on the semiconductor substrate.

Further, as seen in FIG. 60, on the surface, that is, on the upper face, of the flattening film 131, a plurality of conductive layers 111HA, 111HB and 111HG are formed as the "transistor connecting wiring line layers" similarly as in the embodiments 10, 12 and so forth.

Further, similarly as in the embodiments 10 and 11, the connection between the wiring line layer 111HB and the source-drain region 111B is achieved by a contact C11 formed in the flattening film 131. Similarly, the connection between the wiring line layer 111A and the source-drain region 111A and the connection between the wiring line layer 111HG and the gate electrode 111G are achieved by contacts C11.

B. Fabrication Method

In the following, a fabrication method for fabricating the semiconductor device described above is described.

FIGS. 62A to 63B illustrate different stages of the fabrication method for the semiconductor device in the embodiment 13.

FIGS. 62A to 63B show the entire semiconductor device in a section similar to that of FIG. 60 and successively show sections formed at the individual steps in the fabrication method of the semiconductor device.

Figure 62A:
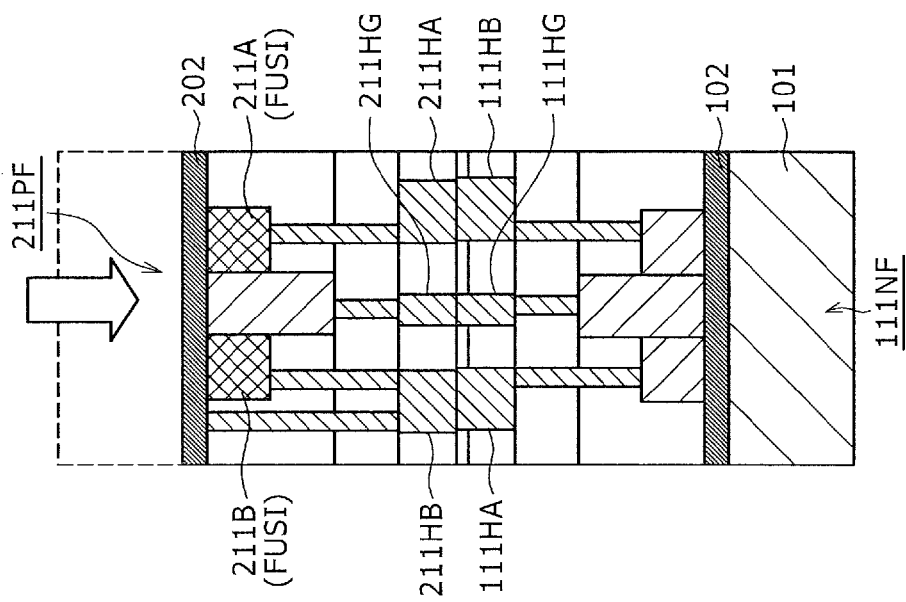

First, several elements such as an n-type FET 111NF are formed as seen in FIG. 62A.

Here, an n-type FET 111NF is formed first using a SOI substrate including a silicon semiconductor substrate and a BOX layer. In short, the n-type FET 111NF is formed on the surface or upper face side of the BOX layer. The BOX layer corresponds to the insulating film 102 shown in FIG. 60.

Thereafter, a flattening film 131, an insulating film IF2 and conductive layers 111HA, 111HB and 111HG are provided in a similar manner as in the embodiment 10.

The foregoing fabrication method can be applied similarly also to a p-type FET having a different channel conduction type. A second substrate 201 on which a p-type FET 211PF is formed is shown on the upper side in FIGS. 62A.

Preferably, in the p-type FET 211PF on the upper layer side, the two source-drain regions 211A and 211B are fully silicided by a method similar to that used in the embodiment 11 so as to have a FUSI structure.

The second substrate 201 on which the p-type FET 211PF is formed is reversed upside down and then is bonded to the first substrate 101 on which the n-type FET 111NF is formed.

Consequently, direct joining of the transistor connection wiring line layers is achieved similarly as in the embodiments 10 and 11.

Figure 62B:
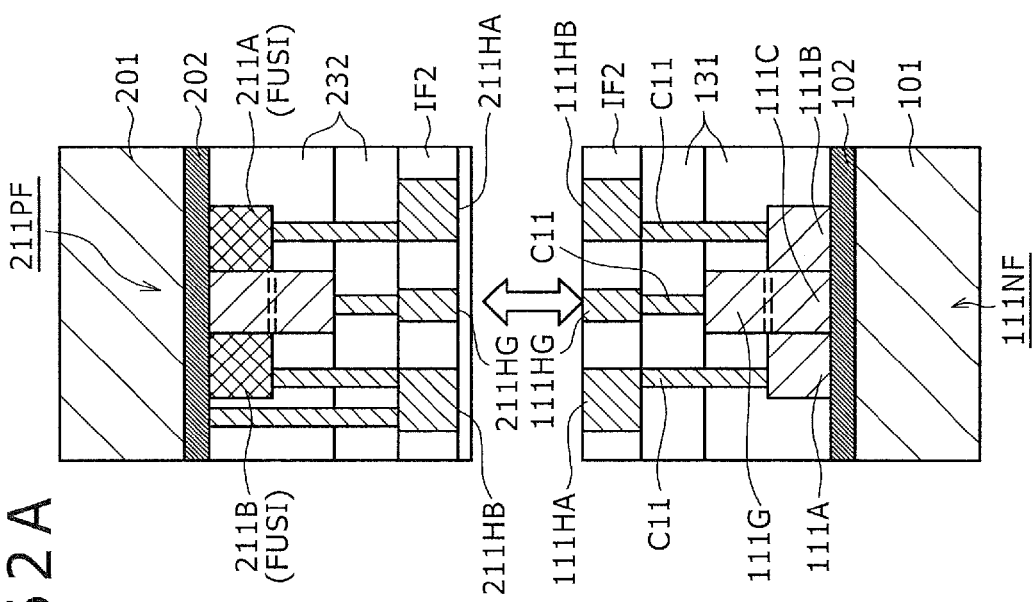

Then, the silicon substrate portion of the second substrate 201 is removed as seen in FIG. 62B.

Here, the portion of the silicon substrate portion from the rear face, that is, from the upper face, to the BOX layer, that is, to the insulating film 202, is polished to remove the silicon substrate portion. For example, the present step is carried out by a CMP process. Consequently, the rear face, that is, the upper face, of the BOX layer, that is, the insulating film 202, is placed into an exposed state.

Then, the BOX layer, that is, the insulating film 202, is removed as seen in FIG. 63A.

Here, the BOX layer is polished from the rear face or upper face side thereof to remove the BOX layer. For example, a CMP process is used to carry out the present step. Consequently, the rear face or upper face of the BOX layer or insulating film 202 is placed into an exposed state.

Then, an insulating layer 311 is formed as seen in FIG. 63B.

Here, the insulating layer 311 is formed on the rear face or upper face side of the p-type FET 211PF and contacts C31 are provided in the insulating layer 311. The contacts C31 can be provided immediately above the two source-drain regions 211A and 211B of the FUSI structure.

Thereafter, a wiring line layer 321H, a wiring line layer 322H and so forth to be connected are formed on the contacts C21, and necessary multilayer wiring is carried out further to complete the semiconductor device.

It is to be noted that, while FIGS. 60 to 63B illustrate formation of both of an n-type FinFET, that is, the n-type FET 111NF, and a p-type FinFET, that is, the p-type FET 211PF, on a SOI substrate, an insulating film 102 as a BOX layer may be formed at a deep portion of an ordinary substrate by SIMOX (separated by implanted oxygen) or the like.

Further, a non-SOI structure may be applied otherwise. In particular, since the BOX layer, that is, the insulating film 202, of the upper side FET, here, the p-type FET 211PF, is removed finally, it need not exist from the beginning. However, if the BOX layer is caused to serve as a stopper for polishing, preferably the BOX layer is formed in advance. On the other hand, the lower side FET, here, the n-type FET 111NF, may be formed as a bulk type FET which does not have the BOX layer.

<14. Embodiment 14>

A. Device Configuration

Although the semiconductor devices according to the embodiments 1 to 13 described above include two substrates placed one on the other, a further substrate or substrates may be placed to increase the layer number to three or more. Such increase is hereinafter referred to as multi-layering.

The present embodiment discloses the multi-layering according to the present disclosed technology with reference to the accompanying drawings taking, in regard to a device section, the embodiment 10 as an example. It is to be noted that the following description and the drawings do not restrict the application of the multi-layering to an application to the embodiment 10 but can be applied widely to the embodiments 11 to 13. Also the embodiments 1 to 9 can be multi-layered similarly as in the present embodiment. However, the multi-layering can be carried out readily for the embodiments 10 to 13 wherein reduction in area can be carried out and relay vias can be formed readily in advance upon substrate production.

Figure 64C:
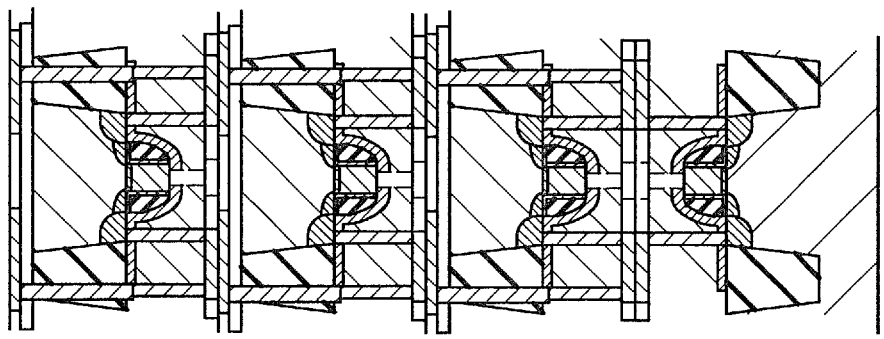
FIGS. 64A to 64C are schematic views illustrating an example of multi-layering of a semiconductor device and a fabrication method therefor according to an embodiment 13.
Figure 64B:
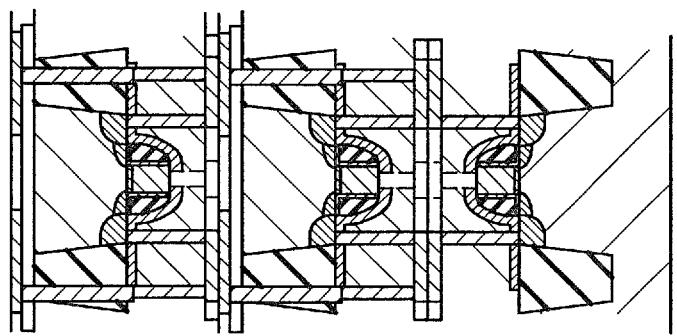
Figure 64A:
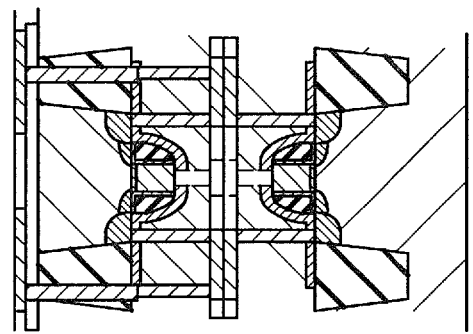

FIGS. 64A to 64C schematically show device sections in the case where multi-layering to three layers (FIG. 64B) and four or more layers (FIG. 64C) is carried out for the basic structure having two layers shown in FIG. 64A.

While the structure shown in FIG. 64A is described hereinabove in connection with the embodiment 10, it is described that the wiring line layer on the outer surface is a wiring line layer of the lowermost layer of a multilayer wiring line layer 310.

In the present embodiment, when multi-layering to three or more layers is to be carried out, the wiring line layer of the outer surface is a counterpart of joining to a transistor connection wiring line of a substrate to be placed and joined nest.

In this manner, multi-layering can be carried out only by successively placing and joining a substrate on which a transistor connection wiring line layer is formed in advance on the wiring line layer of the outer surface.

B. Variations of the Multi-Layering

It is to be noted that, in FIGS. 64A to 64C, second and succeeding substrates are shown with a similar configuration. However, wiring between transistors and other elements not shown can be carried out freely depending upon presence or absence of contacts, connection vias and relay vias for each layer and pattern shapes of wiring line layers.

Further, not only bulk transistors but also SOI type transistors or FIN type transistors may be used, or the type of transistors may be changed for each layer in multi-layering. Further, as a factor which allows arbitrary combination, a FUSI structure and a channel conduction type are available.

Particularly in a configure wherein wiring line layers are directly joined together, if the placement order and the contact structure designed in accordance with the order are determined in advance, then a large-scale highly-dense semiconductor device can be implemented only by placing substrates formed in advance one on another.

C. Application Example of the Multi-Layering

This multi-layering is suitable for layering of circuits of the same type.

In this regard, the multi-layering is applied suitably to a memory cell circuit and further to a multi-core CPU (central processing unit) or GPU (graphic processing unit).

As an example, multi-layering of four core circuits of a CPU is illustrated in FIGS. 65A to 65D.

Figure 65D:
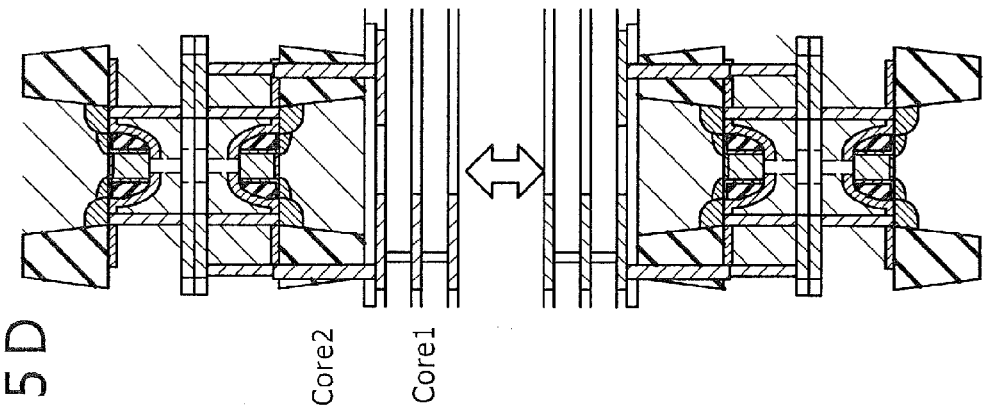
FIGS. 65A and 65B to 65D are a schematic perspective view and schematic sectional views, respectively, illustrating an example of multi-layering of a semiconductor device and a fabrication method therefor according to an embodiment 14.
Figure 65A:
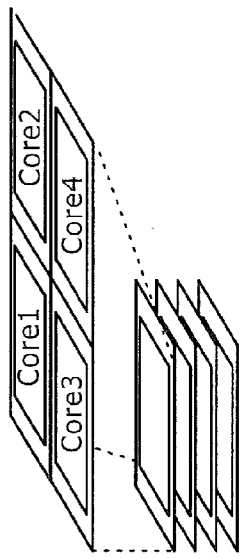

If the technology described above, particularly the technology of the embodiments 10 to 13, is used, then it is easy to form four core circuits, which are usually disposed two-dimensionally, into a multilayer block of four layers placed vertically one on another as seen in FIG. 65A.

Figure 65C:
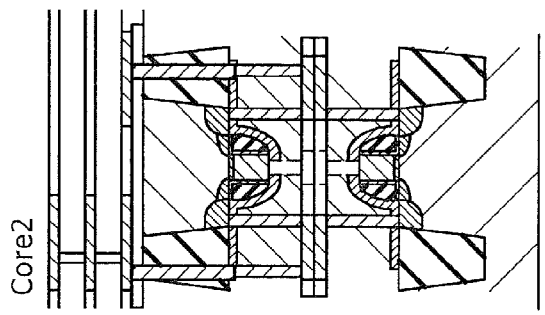
Figure 65B:
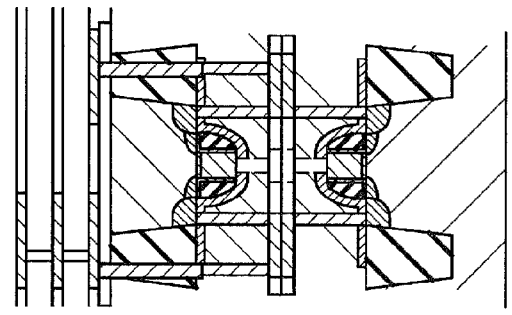

FIGS. 65B to 65D illustrate a method of placing a second layer core circuit (Core 3 and Core 4) on a first layer core circuit (Core 1 and Core 2) among the four core circuits.

In the case where the present disclosed technology is used to form a circuit block of a multilayer substrate and place another circuit block of a different multilayer substrate on the circuit block as in the present example, the portion described as the multilayer wiring line layer 310 in the embodiments is a "local wiring line layer." Further, a multilayer wiring line layer which implements a desired wiring line connection state by putting "local wiring line layers" in order is required, and this is a "global wiring line layer."

The global wiring line layer can be implemented as an IO section hereinafter described but is not shown in FIGS. 65A to 65D.

As seen in FIGS. 65B and 65C, various layer core circuits or circuit clocks are formed individually using the technology described hereinabove.

Then, the local wiring line layers of the layer core circuits are abutted with each other to carry out block joining as seen in FIG. 65D.

Thereafter, though not particularly shown, a core circuit is successively placed on the block, and finally, an IO section including bonding pads and so forth is formed, for example, on the uppermost layer to complete a semiconductor device.

It is to be noted that, if the IO section does not include an active circuit element such as an FET, a multilayer wiring line layer 310 serving as the IO section may be formed on the substrate surface of the uppermost layer shown in FIG. 65D to complete the semiconductor device. The multilayer wiring line layer 310 can be formed by a method similar to that used in the embodiment 1 and so forth.

Further, the layering method of the core circuits may be a method other than the method wherein two core circuits are layered to form a block and such blocks are joined together as seen in FIGS. 65A to 65D. For example, also it is possible to adopt a method wherein core circuits are successively placed one on another and joined together such that the direction of the substrate face on which transistors are formed is same among the layers beginning with the second layer.

By the application example of multi-layering, that is, by the layering of core circuits, the following advantages are achieved.

In particular, in the layering of core circuits, a plurality of core circuit substrates of the same type which have substantially same functions and can be designed similarly to each other or a plurality of core circuit substrates having different functions are formed individually on different wafers. Consequently, in the example described above, four substrates on which core circuits of the CPU 1 to CPU 4 are formed are formed. Then, a necessary number of predetermined core circuit boards are successively placed one on another and joined together in accordance with the number or the type of core circuits required for a final product, and a "global wiring line layer" is formed finally to complete a final product.

In such a product fabrication as described above, only it is necessary to place a necessary number of core circuit substrates of required types formed in advance in accordance with a design concept of an entire LSI or in accordance with a request from a client and join the core circuit substrates together and then form an IO section and so forth finally. Accordingly, the degree of freedom in design is high, and a general-purpose or custom LSI of high functions can be fabricated efficiently in short delivery time after the request for fabrication is accepted.

Thereupon, if rules for direct joining of wiring line layers are standardized in advance, then inter-circuit connection by direct joining of wiring line layers, which achieves the various advantages described hereinabove, can be carried out very readily and with high certainty.

Variation of the IO Section: part 1

Now, a variation of the IO section, that is, inputting-outputting section) is described.

For the IO section, a characteristic different from that of a logic circuit or a memory cell circuit is required such as the necessity for a high voltage withstanding property because the operating voltage is comparatively high or the necessity for the supply of high current. Therefore, it is desirable to form the IO section from transistors on the bulk substrate side, that is, on the first substrate 101 (the configuration is hereinafter referred to as "IO configuration 1").

However, because light is handled or from required specifications in regard to the strength, it is demanded that a substrate on which transistors are formed is layered not on a semiconductor substrate configured from silicon or the like but on a supporting substrate formed from a material different from a semiconductor material such as, for example, glass.

In this instance, the IO section cannot be formed from bulk type transistors formed on the semiconductor substrate of the lowermost layer as in the case of the "IO section configuration 1" described above, but the IO section is formed from transistors in the layered substrate layered on the supporting substrate (the configuration is hereinafter referred to as "IO configuration 2").

First, a formation method of the IO configuration 2 is described briefly.

For example, as seen in FIG. 46 showing the embodiment 10, the second substrate 201 is partly removed by grinding or polishing from the reverse face thereof so that it may make a thin film. Thereafter, the second substrate 201 is vertically reversed and then is bonded to the supporting substrate directly or in a state in which an insulating film or the like is interposed.

Thereafter, also the bulk portion of the first substrate 101 is removed by grinding or polishing from the reverse face of the first substrate 101 similarly to the second substrate 201.

Then, a multilayer wiring line layer is formed or substrate layering is carried out similarly as seen in FIG. 64 to complete the semiconductor device in which a supporting substrate other than the semiconductor substrate is used is completed.

If the supporting substrate formed from a material different from the semiconductor material need not necessarily be used, that is, if a semiconductor supporting substrate may be used, the IO configuration 1 in which an IO section is formed on the semiconductor supporting substrate, that is, the substrate of the lowermost layer, is used desirably rather than the IO configuration 2.

FIGS. 66A and 66B illustrate an advantage of a configuration in which the IO section is formed on the substrate of the lowermost layer from a point of view of reduction in size of a chip. Here, it is assumed that the IO section includes a transistor device for implementing a function for amplification or conversion of a signal or a voltage or the like.

In a configuration in which a plurality of substrates, here, two substrates, are placed one on another on the supporting substrate formed from a material other than a semiconductor material, part of the IO section, that is, a circuit portion including the transistor, is formed on at least one of the two substrates. Further, a wiring line portion including input/output terminals of the IO section is formed from the multilayer wiring line layer 310 on the substrate of the uppermost layer. At the wiring line portion of the IO section, generally the input/output terminals are positioned along a peripheral edge of the semiconductor chip. Therefore, from the reason that connection to the input/output terminals can be established readily, also the circuit portion of the IO section is formed in a region below the input/output terminals, that is, in a region of the layered substrate at the peripheral edge portion of the semiconductor chip. Accordingly, as seen on the left side in FIGS. 66A and 66B, in the semiconductor chip, the IO section is disposed in the form of a frame around a central region in which the circuit functional blocks are layered.

On the other hand, as in the IO configuration 1 described above, the IO section is formed on the semiconductor substrate of the lowermost layer, that is, for example, on the "first substrate" which is the semiconductor substrate according to the present disclosed technique. Meanwhile, the "second substrate" including the second field effect transistor electrically connected to the first field effect transistor of the "first substrate" by direct joining between the wiring line layers is bonded to the "first substrate." The circuit functional blocks are formed on the layered substrate after the "second substrate." The wiring line portion of the IO section is formed from the multilayer wiring line layer 310 on the substrate of the uppermost layer.

In such an IO configuration 1 as described above, the chip area can be reduced by the IO section as seen in FIG. 66A, and the cost of the chip can be decreased.

Variation of the IO Section: Part 2

In the case where a supporting substrate other than a semiconductor substrate is used, the IO section can be provided on the uppermost portion of the multilayer laminated substrate.

Further, even if the IO section is layered on the semiconductor substrate, from the requirement for reduction of the area, it is sometimes desirable to dispose the IO section at the uppermost portion.

A configuration wherein the circuit portion of the IO section is formed on a layered substrate of the uppermost layer irrespective of whether or not the supporting substrate of the lowermost layer is a semiconductor substrate is hereinafter referred to as "IO configuration 3."

Figure 67A:
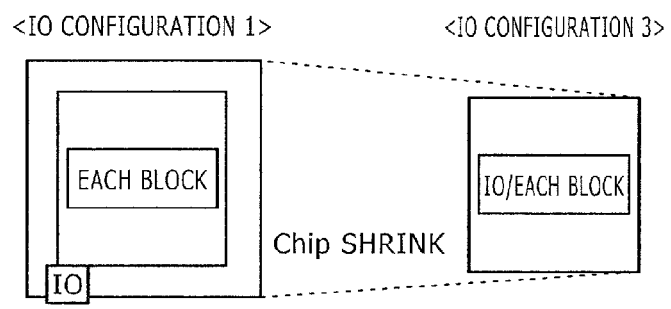
Figure 67B:
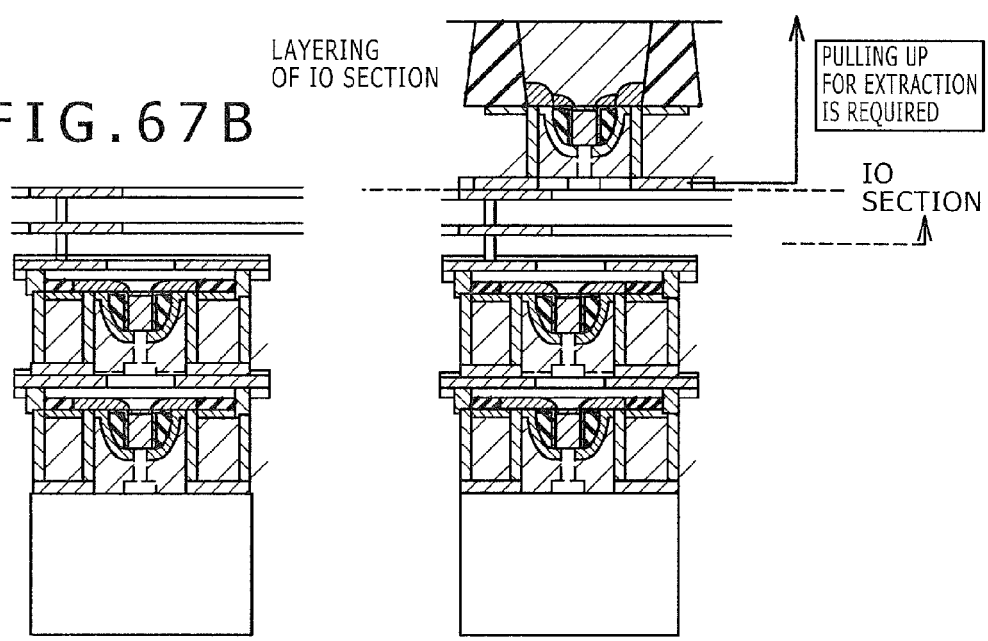

FIGS. 67A and 67B illustrate an advantage of the configuration wherein the IO section is formed on the substrate of the uppermost layer from a point of view of chip size reduction. Here, it is assumed that the IO section includes a transistor device for implementing a function such as amplification or conversion of a signal or a voltage or the like.

Since the configuration on the left side in FIGS. 67A and 67B, that is, the configuration wherein the IO section is disposed at a peripheral edge portion of a chip, is described hereinabove with reference to FIGS. 66A and 66B, description of the configuration is omitted to avoid redundancy.

In the IO configuration 3, as shown on the right side in FIG. 67B, at least a circuit portion of the IO section is formed on the substrate of the uppermost layer from among the layered substrates. Further, though not shown, a wiring line layer including the input/output terminals of the IO section is formed on the substrate of the uppermost layer.

It is to be noted that, in FIGS. 67A and 67B, the multilayer wiring line layer 310 is interposed between the layered substrate on the lower layer side which configures the circuit blocks and the substrate of the uppermost layer which forms the circuit portion of the IO section. This is a configuration provided taking it into consideration that the connection wiring between the circuit blocks and the circuit portion of the IO section need be implemented by the multilayer wiring line layer 310. If there is no such necessity as just described, then the intermediate multilayer wiring line layer 310 can be omitted.

Further, the intermediate multilayer wiring line layer 310, that is, the wiring line portion of the IO section, may be formed on the substrate of the uppermost layer, that is, of the circuit portion of the IO section.

With the IO configuration 3, the chip area can be reduced by the IO section as seen in FIG. 67A and the cost of the chip can be decreased.

Variation of the IO Section: Part 3

Further, a portion of the IO section for carrying out inputting and outputting of a signal, a voltage and power to and from the outside is sometimes implemented not by a normal connection pad or a terminal but by a configuration whose occupation area is comparatively great. For example, an apparatus is available which carries out inputting and outputting of a signal or receiving supply of power by electromagnetic induction coupling using a spiral coil as an antenna.

In such a case as just described, it is difficult to apply existing techniques to integrate a device, which requires a large area like such a spiral coil as described above or a single loop antenna.

Figure 68A:
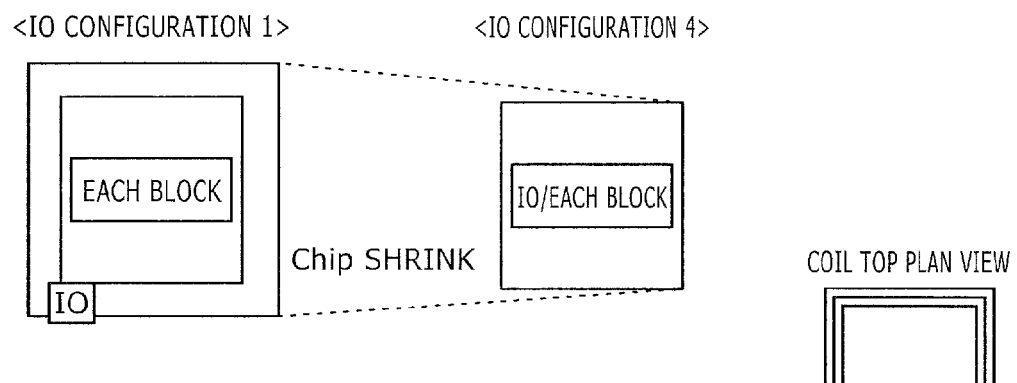
Figure 68B:
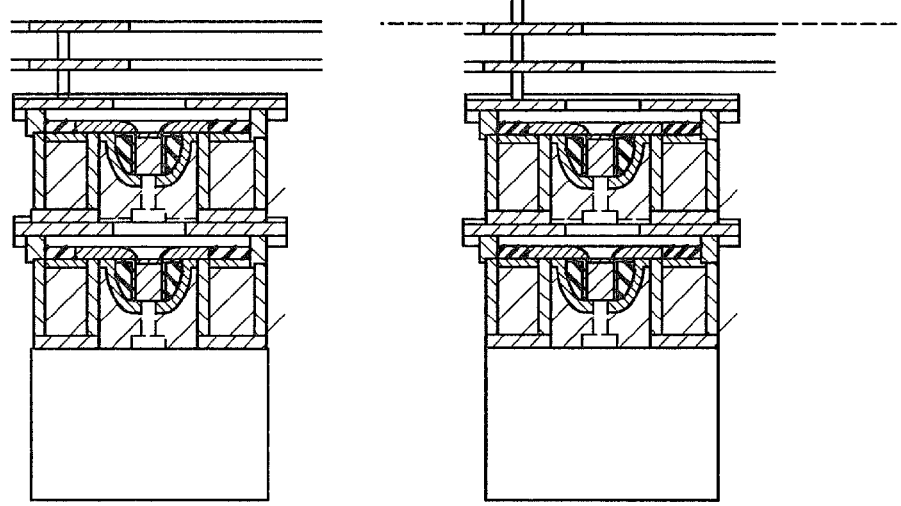

Therefore, in an IO configuration 4 shown in FIGS. 68A and 68B, an electromagnetic induction coil, that is, a spiral coil antenna or a loop antenna, or the like is formed from a wiring line layer of the uppermost layer of the multilayer wiring line layer 310 formed on the configuration in which the substrates are layered.

Consequently, the IO section including an antenna is positioned on the outermost surface of the multilayer laminated substrate on which electromagnetic induction coupling is likely to be established and connection to the semiconductor internal circuit is facilitated.

Further, in such an IO configuration 4 as described above, the chip area can be reduced by the IO section as seen in FIG. 68A and the cost of the chip can be decreased.

<15. Modifications>

As regard carrying out of the technology disclosed herein, not only the embodiments described above but also various modifications can be adopted.

15-1. Modification 1

While, in the foregoing, the case is described in which the n-type MOSFET and the p-type MOSFET are formed as Si transistors, the disclosed technology is not limited to this. The n-type MOSFET and the p-type MOSFET may be formed using some other semiconductors such as IV semiconductors other than Si and III-V compound semiconductors as channel materials.

In particular, if such a material as InGaAs or GaAs is used as a channel material for the channel region of the n-type MOSFET, then this is preferable because the electron mobility is high. On the other hand, if such a material as Ge is used as a channel material for the channel region of the p-type MOSFET, then this is preferable because the hole mobility is high.

For example, as indicated in the following table, the n-type MOSFET 111N is formed using a III-V compound semiconductor substrate such as an InGaAs substrate or a GaAs substrate as the first substrate 101. Further, the p-type MOSFET 211P is formed using a Ge substrate as the second substrate 201 (refer to FIG. 3 or the like).

TABLE 2

| ITEM | NMOSFET | PMOSFET |
| --- | --- | --- |
| Order | $1^{st}$_Wafer | $2^{nd}$_Wafer |
| Substrate 1 | III-V (GaAs-based) (InGaAs) | Ge |
| Substrate 2 | III-V (GaAs-based) | III-V (GaAs-based) |

Otherwise, the n-type MOSFET and the p-type MOSFET may be formed in various forms.

Figure 69:
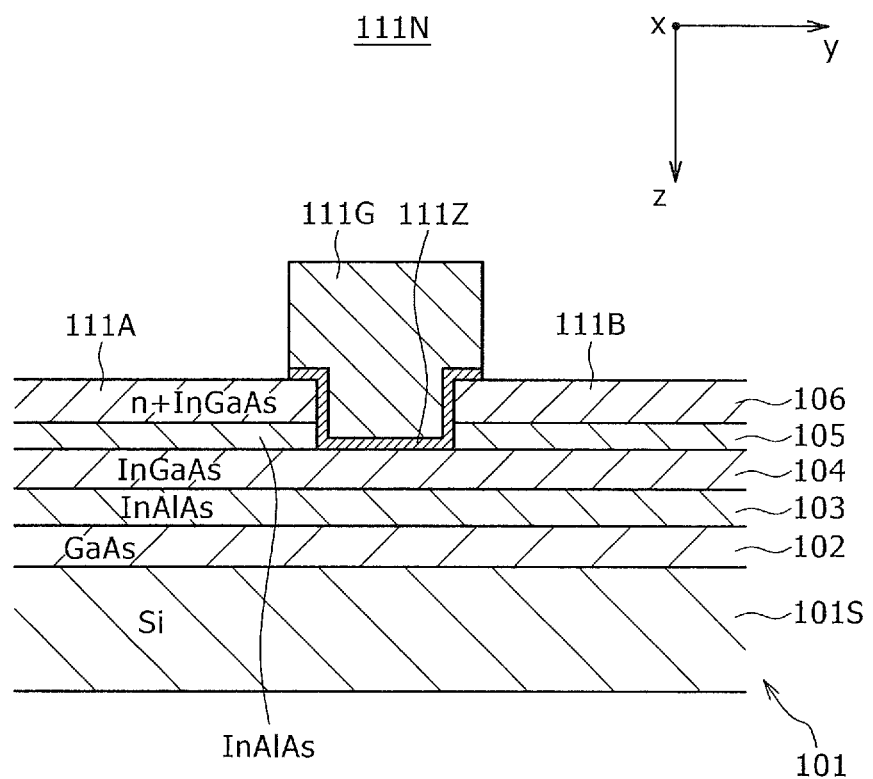
FIG. 69 is a schematic sectional view showing a semiconductor device according to a modification 1.
Figure 70:
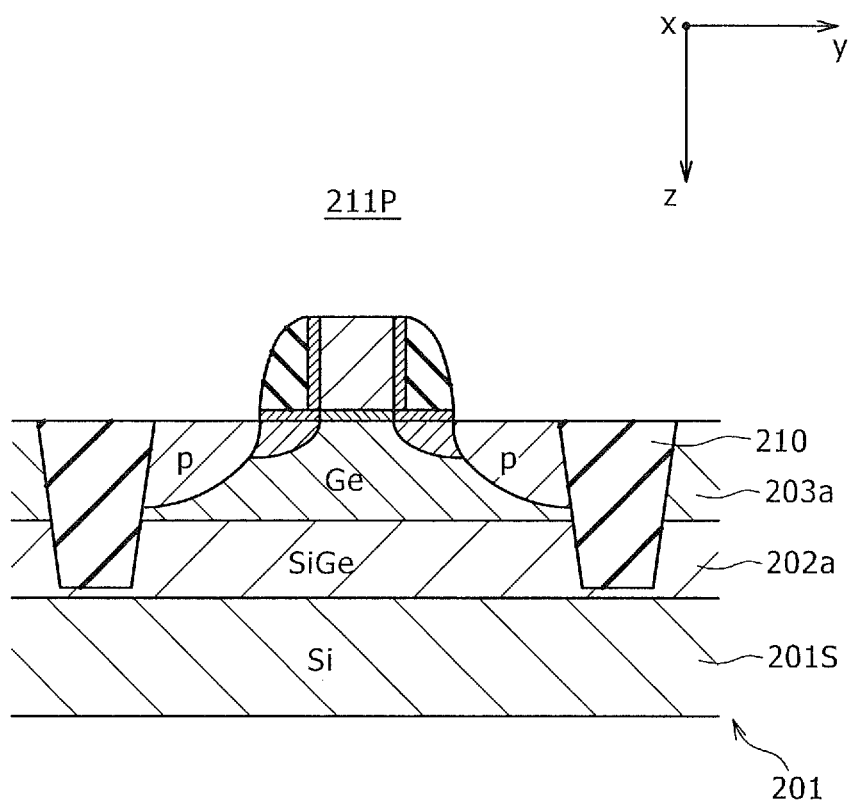
FIG. 70 is a schematic sectional view showing a different portion of the semiconductor device of FIG. 39.

FIGS. 69 and 70 show essential part of the modification 1. FIGS. 69 and 70 show cross sections.

As seen in FIG. 69, a substrate configured by providing compound semiconductor layers 102 to 106 on a face of a silicon substrate 101S may be used as the first substrate 101 on which the n-type MOSFET 111N is to be provided.

Here, a GaAs buffer layer is provided as the compound semiconductor layer 102 on the face of the silicon substrate 101S. Then, an InAlAs graded layer is provided as the compound semiconductor layer 103 on the upper face of the layer 102. Then, an InGaAs channel layer is provided as the compound semiconductor layer 104 on the upper face of the layer 103. Then, an InAlAs layer is provided as the compound semiconductor layer 105 on the upper face of the layer 104. Then, an n-type InGaAs layer is provided as the compound semiconductor layer 106 on the upper face of the layer 105. The compound semiconductor layers 102 to 106 are formed by an epitaxial growth method. Here, the composition ratio of the materials is suitably changed so that the grating constants thereof gradually match with each other to form the compound semiconductor layers.

Then, a trench is formed on the compound semiconductor layers 105 and 106 so that the upper face of the compound semiconductor layer 104 is exposed. Thereafter, the gate electrode 111G is formed so as to include a portion embedded in the trench with through the gate insulating film 111Z interposed therebetween. The gate insulating film 111Z is formed from a High-K material similarly as in the embodiments described above. Further, the gate electrode 111G is formed from a metal material as described above. In this instance, the compound semiconductor layer 106 functions as the paired source-drain regions 111A and 111B.

Further, as seen in FIG. 70, a substrate configured by providing compound semiconductor layers 202a and 203a on a face of a silicon substrate 201S may be used as the second substrate 201 on which the p-type MOSFET 211P is to be provided.

Here, for example, a SiGe graded layer is provided as the compound semiconductor layer 202a on the upper face of the silicon substrate 201S. Then, a Ge layer is provided as the compound semiconductor layer 203a on the upper face of the layer 202a.

Then, similarly as in the embodiments described above, the p-type MOSFET 211P is provided in a region partitioned by the device isolation layer 210.

Then, similarly as in the embodiments described above, after the various elements are formed, the first and second substrates 101 and 201 are bonded to each other. Then, the n-type MOSFET 111N and the p-type MOSFET 211P are electrically connected to each other.

It is to be noted that various configurations other than the configuration described in the description of the present modification can be also adopted.

For example, the channel of the n-type MOSFET 111N may be formed from Si which the channel of the p-type MOSFET 211P is formed from Ge.

Or, the channel of the n-type MOSFET 111N may be formed from a III-V-based semiconductor while the channel of the p-type MOSFET 211P is formed from Si.

15-2. Modification 2

While the case is described above in which a bulk single-crystal silicon semiconductor substrate is used for the first and second substrates 101 and 201, the disclosed technology is not limited to this.

A SOI (Silicon on Insulator) substrate may be used for the first and second substrates 101 and 201.

Figure 71:
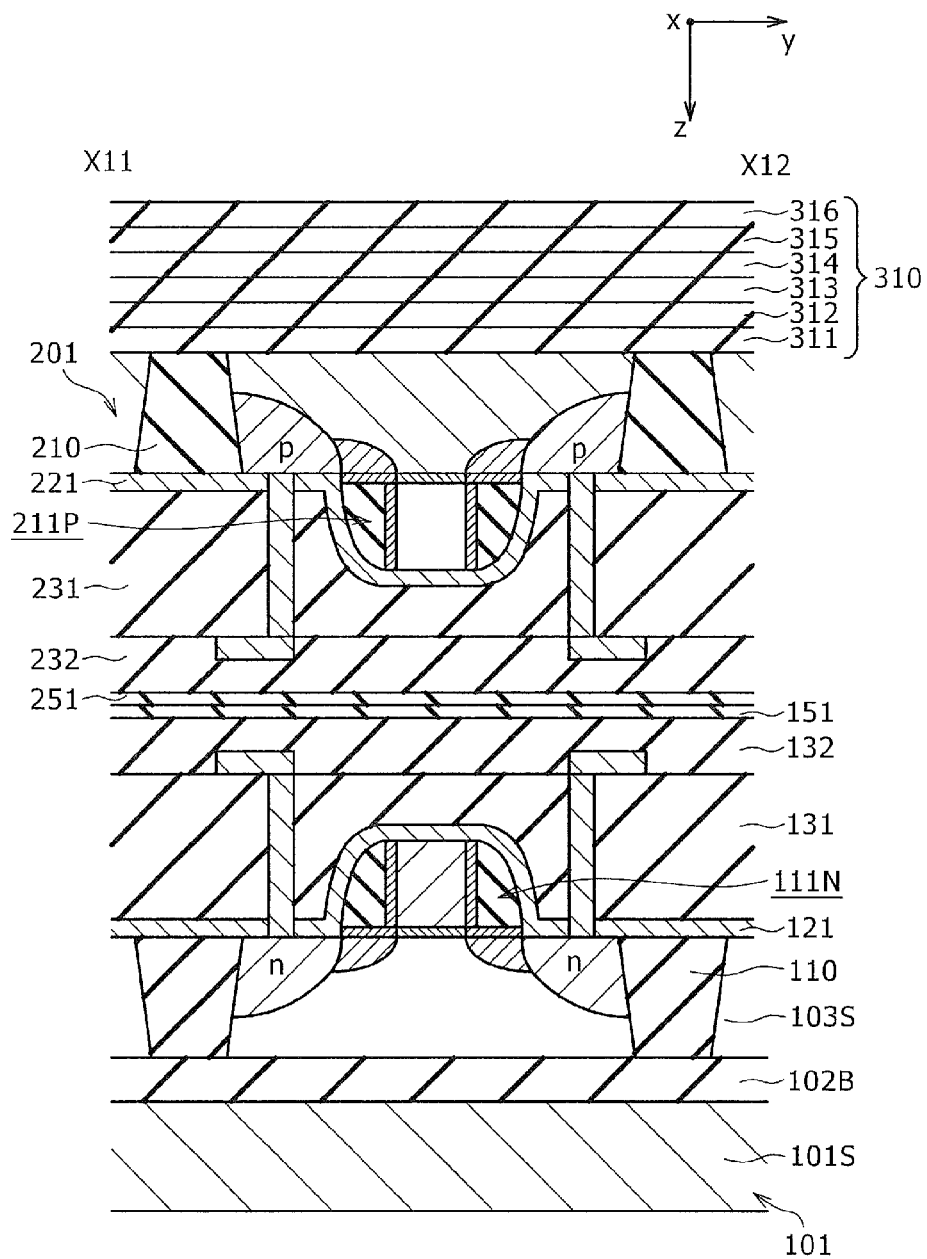
FIG. 71 is a schematic sectional view showing a semiconductor device according a modification 2.

FIG. 71 shows essential part of a modification 2.

FIG. 71 shows a cross section similar to FIG. 3.

As seen in FIG. 71, in the present modification, a SOI substrate is used as the first substrate 101. In particular, a substrate configured by laminating an embedded silicon oxide film 102B and a silicon layer 103S on the upper face of the silicon substrate 101S is used as the first substrate 101. Then, the n-type MOSFET 111N is formed in a region partitioned by the device isolation layer 110 on the silicon layer 103S of the first substrate 101. The device isolation layer 110 is formed such that the depth thereof is, for example, 5 to 10 nm. Further, the n-type MOSFET 111N is formed similarly as in the embodiment 1. Then, various elements such as the stress liner layer 121, flattening film 131, plural inter-layer insulating films 132 and 151 and so forth are formed as seen in FIG. 71 similarly as in the embodiment 1.

Further, a SOI substrate is used also for the second substrate 201. In particular, the p-type MOSFET 211P is formed on the silicon layer 103S provided through the embedded silicon oxide layer (not seen) on the face of the silicon substrate (not seen). The p-type MOSFET 211P is formed in a region partitioned by the device isolation layer 210 similarly as in the embodiment 1. Then, various elements such as the stress liner layer 221, flattening film 231, plural inter-layer insulating films 232 and 251 and so forth are formed similarly as in the embodiment 1.

Then, similarly as in the case of the embodiment 1, the first and second substrates 101 and 201 are bonded to each other, and then the second substrate 201 is thinned. Here, for example, the silicon substrate not shown and the embedded silicon oxide film not shown are removed from the second substrate 201 which is a SOI substrate to carry out thinning such that the silicon layer 103S may be left as seen in FIG. 68.

Then, the multi-layer wiring line layer 310 is formed as seen in FIG. 71 similarly as in the case of the embodiment 1 to electrically connect the n-type MOSFET 111N and the p-type MOSFET 211P to each other.

15-3. Others (Device Structure)

In the foregoing description of the embodiments, the case is described in which the substrates to be formed, channel directions, material of the source-drain regions and material of the stress liner layer are different between the n-type MOSFET and the p-type MOSFET so that the carrier mobility of the n-type MOSFET and the p-type MOSFET may be high. Further, the case is described in which the material of the gate electrode is different between the n-type MOSFET and the p-type MOSFET. However, the components described above may not be formed such that all of them are different between the n-type MOSFET and the p-type MOSFET.

Further, a raised source drain structure may be applied to the source-drain regions of the n-type MOSFET and the p-type MOSFET. Or, a raised source drain extension structure may be applied.

While, in the foregoing description of the embodiments, the case is described in which the semiconductor device includes a logic circuit device such as a CMOS inverter circuit or the like, the semiconductor device may be configured so as to further include a semiconductor device other than the logic circuit device. For example, the semiconductor device may be configured as a solid-state image pickup device in which a photoelectric conversion device such as a photodiode is provided for each of plural pixels.

While, in the foregoing description of the embodiments, the case is described in which the n-type MOSFET is provided on the lower layer side and the p-type MOSFET is provided on the upper layer side, the disclosed technology is not limited to this. The p-type MOSFET and the n-type MOSFET may otherwise be provided on the lower layer side and the upper layer side, respectively.

In this instance, it is preferable to use a (110) substrate formed from single-crystal silicon as the lower side first substrate and provide the p-type MOSFET on the (110) plane. Further, it is preferable to use a (100) substrate formed from single crystalline silicon as the upper side second substrate and provide the n-type MOSFET on the (100) plane.

Further, in this instance, the lower side stress liner layer 121 is formed so as to apply compressive stress. Meanwhile, the upper side stress liner layer 221 is formed so as to apply tensile stress.

Further, regarding the gate electrode, not only the configuration described above but also various different configurations may be adopted.

Figure 72:
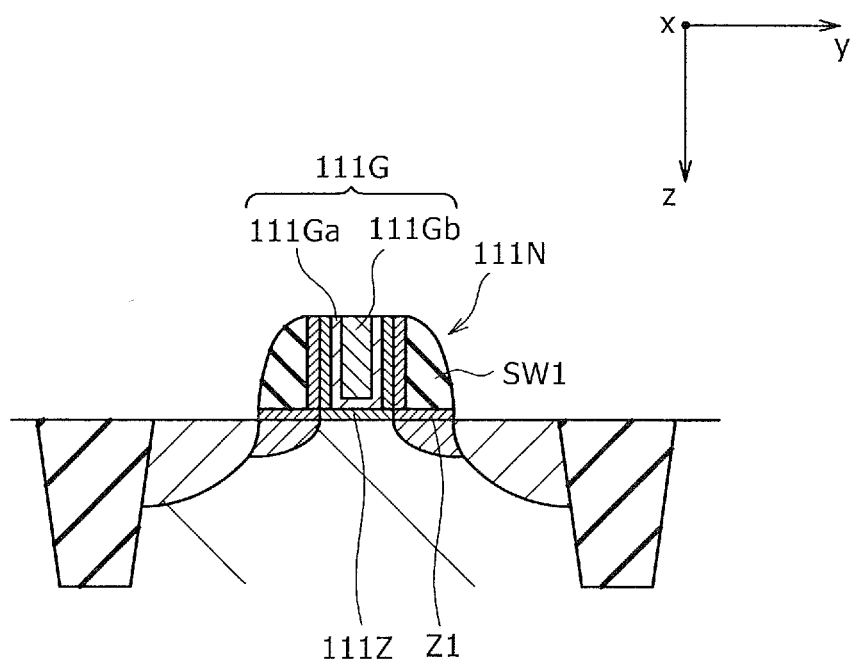
FIG. 72 is a schematic sectional view showing a gate electrode of an n-type MOSFET in a different modified semiconductor device.

FIG. 72 shows a cross section of a gate electrode of an n-type MOSFET as a modification.

A gate electrode 111G may be formed as seen in FIG. 72.

In particular, a gate insulating film 111Z is formed from a High-k material so as to cover the side faces and bottom face in the inside of the trench sandwiched by the paired side walls SW1.

Then, a first metal layer 111Ga is formed so as to cover the side faces and bottom face in the inside of the trench with the gate insulating film 111Z interposed therebetween. For example, a TiN film containing Al is provided as the first metal layer 111Ga.

Then, a second metal layer 111Gb is formed so as to fill up the inside of the trench through the gate insulating film 111Z and the first metal layer 111Ga. For example, the second metal layer 111Gb is formed from a metal material such as W, Al or the like.

While illustration of the gate electrode of a p-type MOSFET is omitted, the p-type MOSFET gate electrode may be configured similarly to the n-type MOSFET gate electrode. In the case of the p-type MOSFET, the first wiring line layer described above is formed, for example, from a TiN film which does not contain Al.

15-4. Others (Functions of the Device)

The embodiments 1 to 14 described above are directed to a case in which a logic circuit, principally an inverter circuit, is implemented principally using a CMOS transistor in which strain is applied to a channel region.

However, application of the present disclosed technology is not limited to devices of such a function as just described, but the present disclosed technology can be applied generally widely to devices wherein transistors are selectively formed on different substrates to achieve enhancement in performance. In this sense, the reason why transistors are selectively formed on the first substrate and the second substrate need not be that they have different channel conduction types.

For example, the present disclosed technology can be applied to a device wherein an array of light reception sections of a solid-state image pickup section are formed on the first substrate 101 such that light incoming from the rear face is photoelectrically converted to produce an image signal. Further, the present technology can be applied to a case in which a memory cell array is layered using a multilayer substrate.

Further, the embodiments described hereinabove may be selectively combined suitably. Or a suitable known technology may be combined suitably.

The disclosed technology can take also such configurations as described below.

(1)
A semiconductor device, including:
a first substrate on which a first field effect transistor is provided; and
a second substrate on which a second field effect transistor of a second conductive type is provided;
the first and second substrates being bonded to each other at the substrate faces thereof on which the first and second field transistors are provided, respectively;
the first field effect transistor and the second field effect transistor being electrically connected to each other.

(2)
The semiconductor device according to item (1), wherein the first field effect transistor of a first conductive type is provided on the face of the first substrate which is opposed to the second substrate;
the second field effect transistor of a second conductive type is provided on a face of the second substrate which is opposed to the first substrate; and
the first field effect transistor and the second field effect transistor are provided so as to oppose to each other.

(3)
The semiconductor device according to item (2), wherein the first substrate has a transistor connecting wiring line layer connecting to the first field effect transistor;
the second substrate has a transistor connecting wiring line layer connecting to the second field effect transistor; and
the two transistor connecting wiring line layers of the first and second substrates being directly joined together.

(4)
The semiconductor device according to item (2), wherein the second substrate includes a wiring line layer provided on the face on the opposite side to the face thereof opposed to the first substrate; and
the first field effect transistor and the second field effect transistor are electrically connected to each other through the wiring line layer.

(5)
The semiconductor device according to item (1) or (2), further including a connection via extending through the second substrate and electrically connected to the first field effect transistor; wherein
the first field effect transistor and the second field effect transistor are electrically connected to each other through the connection via.

It is to be noted that, in the embodiments described hereinabove, the n-type MOSFET 111N corresponds to the first field effect transistor in the present technology. In the embodiments described hereinabove, the p-type MOSFET 211P corresponds to the second field effect transistor in the present technology. In the embodiments described hereinabove, the stress liner layer 121 corresponds to the first stress liner layer in the present technology. In the embodiments described hereinabove, the stress liner layer 221 corresponds to the second stress liner layer in the present technology.

The present technology contains subject matter related to that disclosed in Japanese Priority Patent Application JP 2012-025310 filed in the Japan Patent Office on Feb. 8, 2012, the entire content of which is hereby incorporated by reference.

While preferred embodiments of the present technology has been described using specific terms, such description is for illustrative purposes only, and it is to be understood that changes and variations may be made without departing from the spirit or scope of the following claims.

What is claimed is:

1. A semiconductor device wherein in a plan view of a layout, the semiconductor device comprising:
a first gate electrode extending linearly in a first longitudinal direction, said first longitudinal direction in said plan view differing from a second longitudinal direction;
a second gate electrode extending linearly in said second longitudinal direction, said first gate electrode in said plan view crossing said second gate electrode,
wherein said first gate electrode crosses said second gate electrode in said plan view at an angle of 45 degrees, and a crossing portion of said first gate electrode overlaps said a crossing portion of second gate electrode in a vertical direction perpendicular to a plane defined by said first longitudinal direction and said second longitudinal direction.

2. A semiconductor device according to claim 1, wherein said first longitudinal direction in said plan view crosses said second longitudinal direction.

3. A semiconductor device according to claim 1, wherein said first longitudinal direction in said plan view is non-orthogonal to said second longitudinal direction.

4. A semiconductor device according to claim 1, wherein said second gate electrode contains titanium nitride.

5. A semiconductor device according to claim 1, wherein said first gate electrode contains titanium nitride.

6. A semiconductor device according to claim 5, wherein said first gate electrode contains aluminum.

7. A semiconductor device according to claim 1, wherein said first gate electrode is a metal material.

8. A semiconductor device according to claim 7, wherein said second gate electrode is said metal material.

9. A semiconductor device according to claim 1, further comprising:
a gate connection configured to electrically connect said first gate electrode to said second gate electrode.

10. A semiconductor device according to claim 9, wherein said gate connection directly electrically connects said first gate electrode to said second gate electrode.

11. A semiconductor device according to claim 1, wherein said first gate electrode in said plan view is between a source-drain region of a first conductivity-type and a different source-drain region of the first conductivity-type.

12. A semiconductor device according to claim 11, further comprising:
a reference voltage terminal electrically connected to said different source-drain region of the first conductivity-type.

13. A semiconductor device according to claim 11, wherein said second gate electrode in said plan view is between a source-drain region of a second conductivity-type and a different source-drain region of the second conductivity-type.

14. A semiconductor device according to claim 13, wherein said first conductivity-type is opposite to said second conductivity-type.

15. A semiconductor device according to claim 13, wherein said source-drain region of the first conductivity-type in said plan view overlaps said source-drain region of the second conductivity-type.

16. A semiconductor device according to claim 13, wherein said first conductivity-type differs from said second conductivity-type.

17. A semiconductor device according to claim 13, further comprising:
   a supply voltage terminal electrically connected to said different source-drain region of the second conductivity-type.

18. A semiconductor device according to claim 13, further comprising:
   a connection configured to electrically connect said source-drain region of the first conductivity-type to said source-drain region of the second conductivity-type.

19. A semiconductor device according to claim 13, wherein said source-drain region of the first conductivity-type is in a first semiconductor substrate, said source-drain region of the second conductivity-type being in a second semiconductor substrate.

20. A semiconductor device according to claim 19, wherein said first gate electrode is on said first semiconductor substrate, said second gate electrode being on said second semiconductor substrate.

21. A semiconductor device according to claim 13, further comprising:
   a channel region of the first conductivity-type between said source-drain region of the second conductivity-type and said different source-drain region of the second conductivity-type.

22. A semiconductor device according to claim 21, wherein said channel region in said plan view extends linearly in said second longitudinal direction.

23. A semiconductor device according to claim 21, wherein said channel region crosses said first gate electrode.

24. A semiconductor device according to claim 21, wherein said channel region in said plan view is in parallel with said second gate electrode.

25. A semiconductor device according to claim 21, wherein said channel region touches said source-drain region of the second conductivity-type and said different source-drain region of the second conductivity-type.

26. A semiconductor device according to claim 21, wherein said first gate electrode is between said channel region and said second gate electrode.

* * * * *